(12) United States Patent
Ochiai et al.

(10) Patent No.: US 9,726,974 B2
(45) Date of Patent: Aug. 8, 2017

(54) RESIN, PHOTORESIST COMPOSITION, AND METHOD FOR PRODUCING PHOTORESIST PATTERN

(71) Applicant: SUMITOMO CHEMICAL COMPANY, LIMITED, Tokyo (JP)

(72) Inventors: Mitsuyoshi Ochiai, Osaka (JP); Koji Ichikawa, Osaka (JP); Masafumi Yoshida, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/549,995

(22) Filed: Nov. 21, 2014

(65) Prior Publication Data

US 2015/0153644 A1 Jun. 4, 2015

(30) Foreign Application Priority Data

Nov. 26, 2013 (JP) ................................ 2013-243592

(51) Int. Cl.
| | | |
|---|---|---|
| G03F 7/004 | (2006.01) | |
| C08F 220/36 | (2006.01) | |
| G03F 7/039 | (2006.01) | |
| G03F 7/38 | (2006.01) | |

(52) U.S. Cl.
CPC .......... G03F 7/0045 (2013.01); C08F 220/36 (2013.01); G03F 7/0046 (2013.01); G03F 7/0397 (2013.01); G03F 7/38 (2013.01)

(58) Field of Classification Search
None
See application file for complete search history.

(56) References Cited

U.S. PATENT DOCUMENTS

| | | | |
|---|---|---|---|
| 6,103,449 A | 8/2000 | Sato | |
| 6,291,130 B1 * | 9/2001 | Kodama et al. | ........... 430/270.1 |
| 2005/0287473 A1 | 12/2005 | Kodama | |

(Continued)

FOREIGN PATENT DOCUMENTS

| | | | |
|---|---|---|---|
| JP | 64-54459 A | | 3/1989 |
| JP | 2002-174891 | * | 6/2002 |

(Continued)

OTHER PUBLICATIONS

Machine translation of JP 2009-086358(Apr. 2009).*
The Non-Final Office Action for related U.S. Appl. No. 14/550,048, dated Jun. 12, 2015.

*Primary Examiner* — Martin Angebranndt
(74) *Attorney, Agent, or Firm* — Birch, Stewart, Kolasch & Birch, LLP

(57) ABSTRACT

A resin comprising:
a structural unit represented by formula (I), and
a structural unit having an acid-labile group.

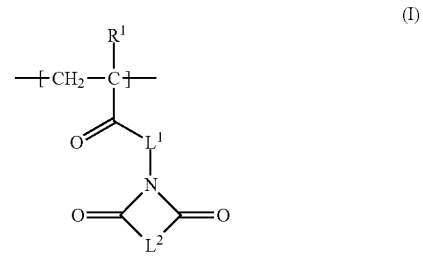

7 Claims, 1 Drawing Sheet

(56) References Cited

U.S. PATENT DOCUMENTS

| | | | |
|---|---|---|---|
| 2006/0199100 A1* | 9/2006 | Kanda | 430/270.1 |
| 2006/0210922 A1* | 9/2006 | Nishiyama | G03F 7/0045 |
| | | | 430/270.1 |
| 2008/0057436 A1* | 3/2008 | Kim et al. | 430/270.1 |
| 2008/0187860 A1* | 8/2008 | Tsubaki | G03F 7/2024 |
| | | | 430/270.1 |
| 2010/0323294 A1 | 12/2010 | Li et al. | |
| 2011/0065041 A1 | 3/2011 | Ichikawa et al. | |
| 2012/0009529 A1 | 1/2012 | Hatakeyama | |
| 2013/0029269 A1 | 1/2013 | Hatakeyama et al. | |
| 2014/0038102 A1* | 2/2014 | Park et al. | 430/270.1 |
| 2014/0350169 A1* | 11/2014 | Kaneshima et al. | 524/547 |
| 2015/0147695 A1* | 5/2015 | Ochiai et al. | 430/283.1 |

FOREIGN PATENT DOCUMENTS

| | | | |
|---|---|---|---|
| JP | 2002-363158 A | | 12/2002 |
| JP | 2008-105414 | * | 5/2008 |
| JP | 2009-086358 | * | 4/2009 |
| JP | 2010-106048 | * | 5/2010 |
| JP | 2010-266857 A | | 11/2010 |
| JP | 2011-186441 A | | 9/2011 |
| JP | 2011-215414 A | | 10/2011 |
| JP | 2013-29564 A | | 2/2013 |
| JP | 2013-064971 | * | 4/2013 |
| KR | 10-2012-0070322 A | | 6/2012 |
| WO | 2011/034176 | * | 3/2011 |
| WO | 2014/017144 | * | 1/2014 |

* cited by examiner (a)

(b)

(c)

RESIN, PHOTORESIST COMPOSITION, AND METHOD FOR PRODUCING PHOTORESIST PATTERN

This nonprovisional application claims priority under 35 U.S.C. §119(a) on Patent Application No. 2013-243592 filed in JAPAN on Nov. 26, 2013, the entire contents of which are hereby incorporated by reference.

FIELD OF THE INVENTION

The present invention relates to resin, a photoresist composition and a method for producing a photoresist pattern.

BACKGROUND OF THE INVENTION

JP2002-363158A1 mentions a methacryl compound having the following structure.

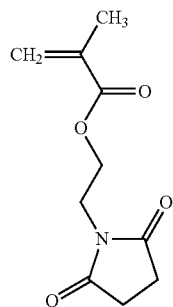

US2006/199100A1 mentions a photoresist composition comprising:
resin which consists of the following structural units;

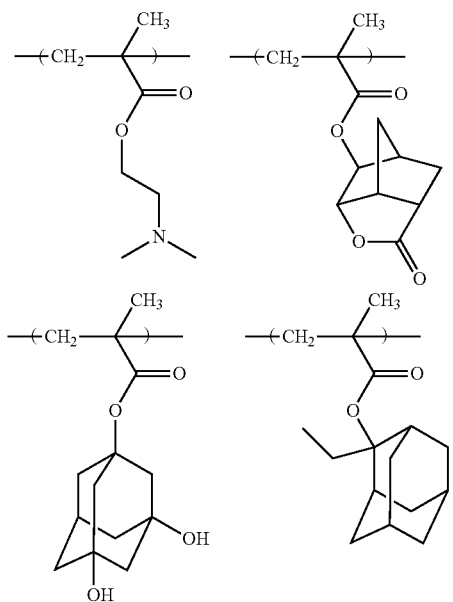

and triphenylsulfonium nonaflate as an acid generator.

SUMMARY OF THE INVENTION

The present invention relates to the followings:
<1> A resin comprising:
a structural unit represented by formula (I), and
a structural unit having an acid-labile group:

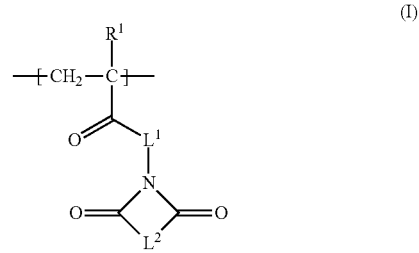

in which $R^1$ represents a hydrogen atom, a halogen atom, or a C1-C6 alkyl group which may have a halogen atom;
$L^1$ represents a single bond or a C1-C18 divalent saturated hydrocarbon group where a methylene group can be replaced by an oxygen atom or a carbonyl group; and
$L^2$ represents a C1-C18 divalent hydrocarbon group which can have a substituent.
<2> The resin according to <1>
in which $L^1$ is a group represented by *—O—$(CH_2)_n$— where n is an integer of 1 to 6 and * represents a binding position to a carbonyl group.
<3> The resin according to <1> or <2>,
in which $L^2$ is a C2-C4 alkanediyl group.
<4> A photoresist composition, which comprises the resin according to any one of <1> to <3> and an acid generator.
<5> The photoresist composition according to <4>, in which the acid generator is represented by formula (B1):

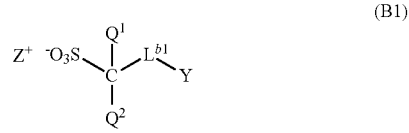

where $Q^1$ and $Q^2$ respectively represent a fluorine atom or a C1-C6 perfluoroalkyl group;
$L^{b1}$ represents a C1-C24 saturated hydrocarbon group in which a methylene group may be replaced by —O— or —CO— and in which a hydrogen atom may be replaced by a hydroxyl group or a fluorine atom;
Y represents a methyl group where a hydrogen atom may be replaced by a substituent, or a C3-C18 alicyclic hydrocarbon group where a hydrogen atom may be replaced by a substituent and where a methylene group may be replaced by —O—, —$SO_2$— or —CO—; and
$Z^+$ represents an organic cation.
<6> The photoresist composition according to <4> or <5>, further comprising an salt which comprises an acid lower in acidity than an acid generated from the acid generator.
<7> A process for producing a photoresist pattern comprising the following steps (1) to (5):
  (1) a step of applying the photoresist composition according to any one of <4> to <6> on a substrate,
  (2) a step of forming a composition film by conducting drying,
  (3) a step of exposing the composition film to radiation,
  (4) a step of baking the exposed composition film, and
  (5) a step of developing the baked composition film thereby to form a photoresist pattern.

BRIEF EXPLANATION OF DRAWING

FIGS. 1(a), 1(b) and 1(c) show schematics views of profiles of line patterns.

FIG. 1 (b) shows a schematics view of a line pattern which has a round shape at its top edge.

FIG. 1 (c) shows a schematics view of a line pattern which has skirt trailing shape.

DESCRIPTION OF PREFERRED EMBODIMENTS

Figure 1:
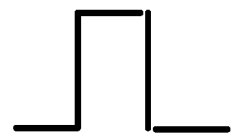
FIG. 1 (a) shows a schematics view of a line pattern with an excellent profile which has nearly rectangle shape at its top edge.
Figure 1:
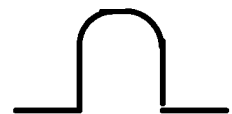
Figure 1:
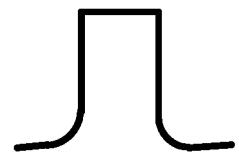

The present invention will be described in detail.

Herein, the term "(meth)acryl" means the structure which has $CH_2=CH-CO-$, i.e. an acryl moiety, or $CH_2=C(CH_3)-CO-$, i.e., a methacryl one.

<Resin>

The resin according to the present invention, which is sometimes referred to as "Resin (A)", comprises
a structural unit represented by formula (I), described in detail below, and
a structural unit having an acid-labile group.

The structural unit represented by formula (I) is sometimes referred to as "Structural unit (I)".

(Structural Unit (I))

Structural unit (I) is represented by formula (I):

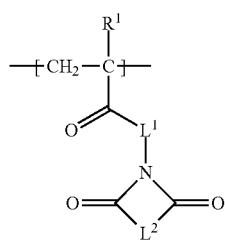

(I)

in which $R^1$ represents a hydrogen atom, a halogen atom, or a C1-C6 alkyl group which may have a halogen atom;
$L^1$ represents a single bond or a C1-C18 divalent saturated hydrocarbon group where a methylene group can be replaced by an oxygen atom or a carbonyl group; and
$L^2$ represents a C1-C18 divalent hydrocarbon group which can have a substituent.

Examples of a halogen atom represented by $R^1$ include a fluorine atom, a chlorine atom, a bromine atom and an iodine atom.

Examples of an alkyl group represented by $R^1$ include a methyl group, an ethyl group, a propyl group, a butyl group, a pentyl group, and a hexyl group, preferably a C1-C4 alkyl group, and more preferably a methyl group and an ethyl group. Herein, a butyl group includes n-butyl group, iso-butyl group and tert-butyl group.

As to $R^1$, examples of an alkyl group which has an halogen atom include a trifluoromethyl group, a pentafluoroethyl group, a perfluoropropyl group, a perfluoroisopropyl group, a perfluorobutyl group, a perfluoro-sec-butyl group, a perfluoro-tert-butyl group, a perfluoropentyl group, a perfluorohexyl group, a trichloromethyl group, a tribromomethyl group, and a triiodomethyl group.

$R^1$ is preferably a hydrogen atom or a C1-C4 alkyl group, more preferably a hydrogen atom, a methyl group or an ethyl group, and still more preferably a hydrogen atom or a methyl group.

Examples of the divalent saturated hydrocarbon group represented by $L^1$ include alkanediyl groups which may be a linear or branched one, divalent alicyclic hydrocarbon groups, and combination of them.

Specific examples of the divalent saturated hydrocarbon groups include
linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group; branched chain groups such as an ethane-1,1-diyl group, a propane-1,1-diyl group, propane-1,2-diyl group, propane-2,2-diyl group, a pentane-2,4-diyl group, a 1-methylpropane-1,3-diyl group, a 2-methylpropane-1,2-diyl group, a pentane-1,4-diyl group, and a 2-methylbutane-1,4-diyl group;
divalent alicyclic hydrocarbon groups including a cyclobutane-1,3-diyl group, a cyclopentane-1,3-diyl group, a cyclohexane-1,4-diyl group and a cyclooctane-1,5-diyl group; and a polycyclic divalent alicyclic hydrocarbon groups such as a nobornane-1,4-diyl group, a nobornane-1,5-diyl group, an amadantane-1,5-diyl group, or an amadantane-2,6-diyl group.

Examples of the divalent hydrocarbon group where a methylene group has been replaced by an oxygen atom or carbonyl group include those represented by formulae (L1-1) to (L1-4).

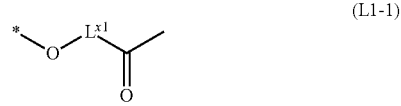

(L1-1)

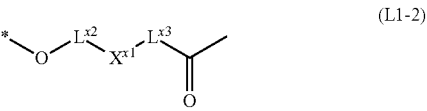

(L1-2)

(L1-3)

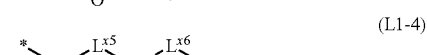

(L1-4)

In these formulae, * represents a binding position to a carbonyl group.

In formula (L1-1), $L^{x1}$ is a C1-C16 divalent saturated hydrocarbon group.

In formula (L1-2), $X^{x1}$ is a carbonyloxy group or an oxycarbonyl group; and $L^{x2}$ and $L^{x3}$ is a C1-C13 divalent aliphatic saturated hydrocarbon group, provided that the total number of the carbon atoms in $L^{x2}$ and $L^{x3}$ is 14 or less.

In formula (L1-3), $L^{x4}$ is a C1-C17 divalent saturated hydrocarbon group.

In formula (L1-4), $X^{x2}$ is a carbonyloxy group or an oxycarbonyl group; and $L^{x5}$ and $L^{x6}$ is a C1-C14 divalent aliphatic saturated hydrocarbon group, provided that the total number of the carbon atoms in $L^{x5}$ and $L^{x6}$ is 15 or less.

Examples of the group represented by formula (L1-1) include the following ones.

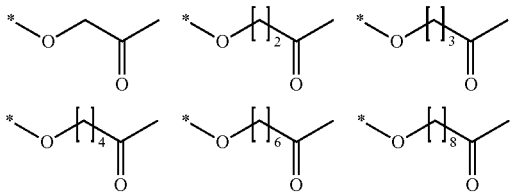

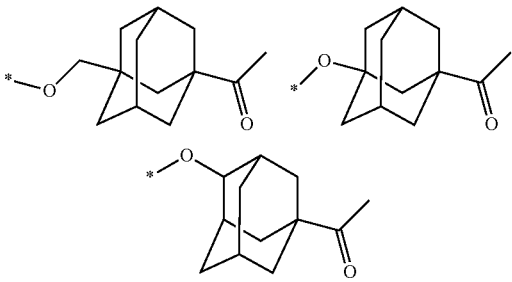

In these formulae, * represents a binding position to a carbonyl group.

Examples of the group represented by formula (L1-2) include the following ones.

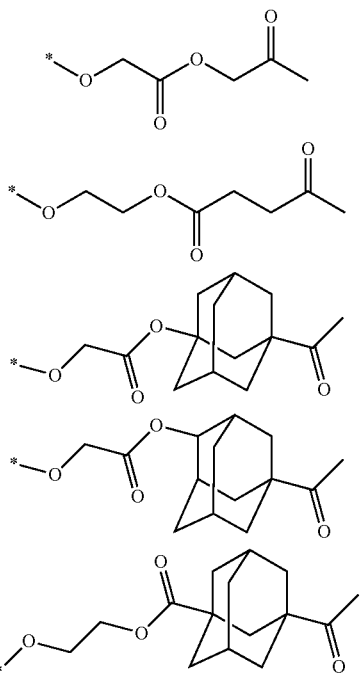

In these formulae, * represents a binding position to a carbonyl group.

Examples of the group represented by formula (L1-3) include the following ones.

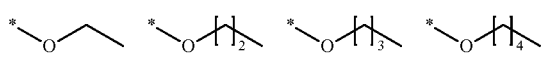

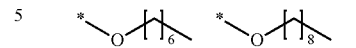
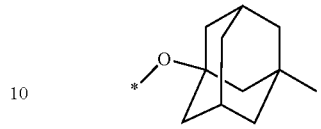
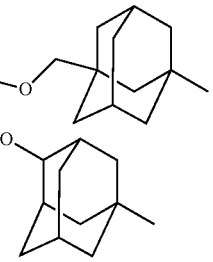

In these formulae, * represents a binding position to a carbonyl group.

Examples of the group represented by formula (L1-4) include the following ones.

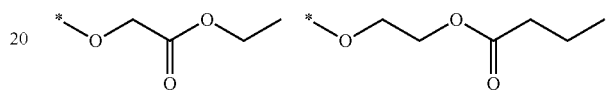

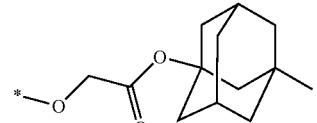

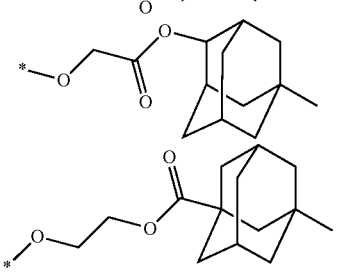

In these formulae, * represents a binding position to a carbonyl group.

$L^1$ is preferably a single bond or the group represented by formula (L1-1) or (L1-4), more preferably a single bond or the group represented by formula (L1-3), and still more preferably *—O—$(CH_2)_n$— where n represents an integer of 1 to 6 and * represents a binding position to a carbonyl group.

Examples of the divalent saturated hydrocarbon group represented by $L^2$ include alkanediyl groups which may be a linear or branched one, divalent alicyclic hydrocarbon groups, alkenediyl groups which may be a linear or branched one, divalent cyclic unsaturated hydrocarbon groups, divalent aromatic hydrocarbon groups and combination of them.

Specific examples of the divalent hydrocarbon groups include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group; branched chain groups such as an ethane-1,1-diyl group, a propane-1,1-diyl group, propane-1,2-diyl group, propane-2,2-diyl group, a pentane-2,4-diyl group, a 1-methylpropane-1,3-diyl group, a 2-methylpropane-1,2-diyl group, a pentane-1,4-diyl group, and a 2-methylbutane-1,4-diyl group;

divalent alicyclic hydrocarbon groups including a cyclobutane-1,3-diyl group, a cyclopentane-1,3-diyl group, a cyclohexane-1,4-diyl group and a cyclooctane-1,5-diyl group; and a polycyclic divalent alicyclic hydrocarbon groups such as a nobornane-1,4-diyl group, a nobornane-1,5-diyl group, an amadantane-1,5-diyl group, or an amadantane-2,6-diyl group; alkenediyl groups such as a propene-1,3-diyl group, a butene-1,4-diyl group, a pentene-1,5-diyl group, and a hexene-1,6-diyl group divalent cyclic unsaturated hydrocarbon groups such as cyclobutene-1,3-diyl group, a cyclopentene-1,3-diyl group, a cyclohexene-1,4-diyl group and a cyclooctene-1,5-diyl group; and divalent aromatic hydrocarbon groups, which may be a monocyclic or polycyclic group, including a phenylene group or a naphtylene group.

As to the divalent hydrocarbon group represented by $L^2$, examples of the substitutents include a hydroxy group, a halogen atom, a C1-C12 alkoxy group, a C1-C12 acyl group and a C2-C12 alkylcarbonyloxy group.

Examples of halogen atoms include a fluorine atom, a chlorine atom, a bromine atom and an iodine atom, preferably a fluorine atom and a chlorine atom, and more preferably a chlorine atom.

Examples of the C1-C12 alkoxy groups include a methoxy group, an ethoxy group, a propoxy group, a butoxy group, a pentyloxy group, a hexyloxy group, a heptyloxy group, an octyloxy group, a decyloxy group and a dodecyloxy group, preferably a C1-C6 alkoxy group, and more preferably a methoxy group.

Examples of the C1-C12 acyl groups include a formyl group, an acetyl group, a propionyl group, butyryl group, a pentanoyl group, a hexanoyl group, an octanoyl group, preferably C2-C4 acyl groups, and more preferably an acetyl group.

Examples of the C1-C12 alkylcarbonyloxy group include a methylcarbonyloxy group, an ethylcarbonyloxy group, a propylcarbonyloxy group, a butylcarbonyloxy group, a pentylcarbonyloxy group, a hexylcarbonyloxy group, an octylcarbonyloxy group, a 2-ethylhexylcarbonyloxy group, preferably C2-C6 alkylcarbonyloxy groups, and more preferably a methylcarbonyloxy group.

As the substituent for the hydrocarbon group represented by $L^2$, preferred are C1-C12 alkoxy groups, a hydroxy group and halogen atoms, more preferred are a hydroxy group and halogen atoms.

$L^2$ is preferably a C1-C4 alkylene group which may have a substituent and a C6-C10 cycloalkylene group which may have a substituent, and more preferably a C1-C4 alkylene group which may have a C1-C4 alkoxy group, a hydroxy group, or a halogen atom.

The nitrogen-containing ring in formula (I) may be a monocyclic group or a polycyclic group having a ring-fused structure.

Examples of the nitrogen-containing ring include preferably the following ones. Among these rings, the saturated ones are preferred, the saturated five- or six-membered rings and the fused ring having five- or six-membered ring structure are more preferred.

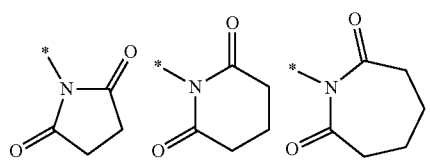

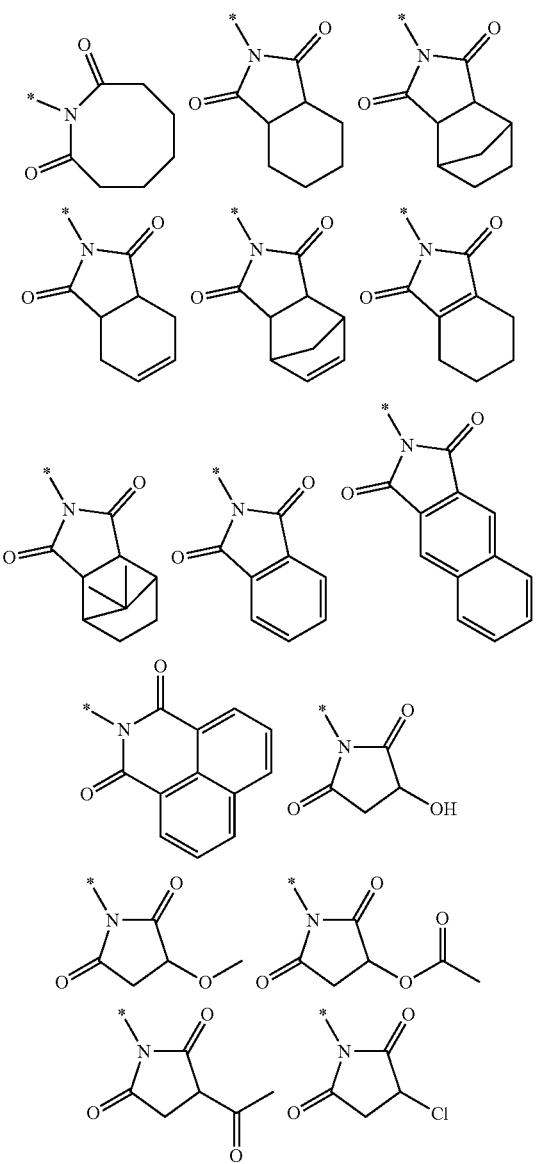

Specific examples of Structural unit (I) include the following ones.

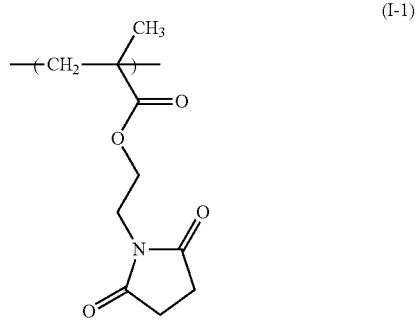

(I-1)

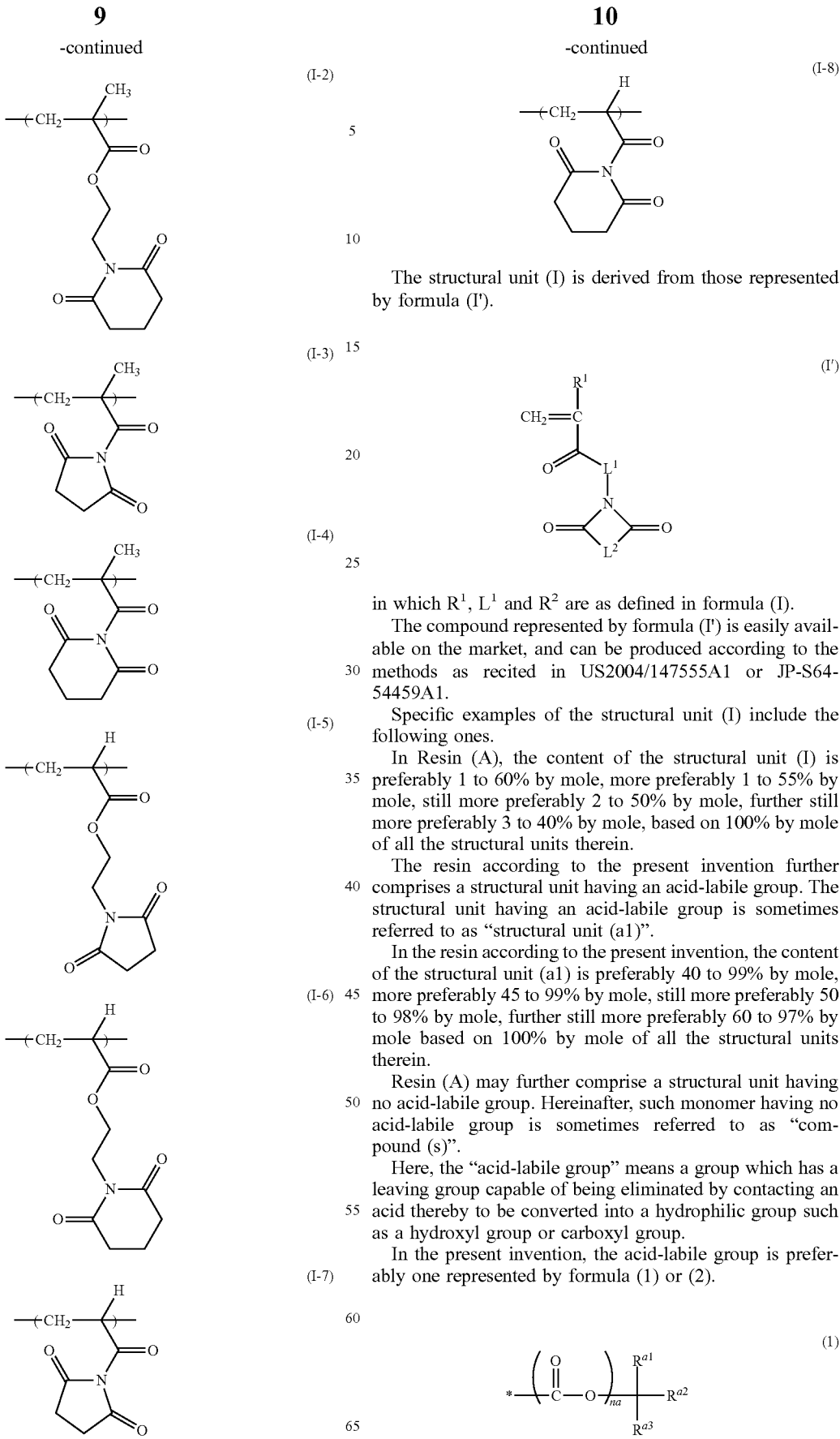

The structural unit (I) is derived from those represented by formula (I').

in which $R^1$, $L^1$ and $R^2$ are as defined in formula (I).

The compound represented by formula (I') is easily available on the market, and can be produced according to the methods as recited in US2004/147555A1 or JP-S64-54459A1.

Specific examples of the structural unit (I) include the following ones.

In Resin (A), the content of the structural unit (I) is preferably 1 to 60% by mole, more preferably 1 to 55% by mole, still more preferably 2 to 50% by mole, further still more preferably 3 to 40% by mole, based on 100% by mole of all the structural units therein.

The resin according to the present invention further comprises a structural unit having an acid-labile group. The structural unit having an acid-labile group is sometimes referred to as "structural unit (a1)".

In the resin according to the present invention, the content of the structural unit (a1) is preferably 40 to 99% by mole, more preferably 45 to 99% by mole, still more preferably 50 to 98% by mole, further still more preferably 60 to 97% by mole based on 100% by mole of all the structural units therein.

Resin (A) may further comprise a structural unit having no acid-labile group. Hereinafter, such monomer having no acid-labile group is sometimes referred to as "compound (s)".

Here, the "acid-labile group" means a group which has a leaving group capable of being eliminated by contacting an acid thereby to be converted into a hydrophilic group such as a hydroxyl group or carboxyl group.

In the present invention, the acid-labile group is preferably one represented by formula (1) or (2).

in which $R^{a1}$, $R^{a2}$ and $R^{a3}$ independently each represent a C1-C8 alkyl group, a C3-C20 monovalent alicyclic hydrocarbon group, or a group formed by combining the alkyl group with the alicyclic hydrocarbon group, and $R^{a1}$ and $R^{a2}$ may be bonded each other to jointly represent a C2-C20 divalent hydrocarbon group, and * represents a binding position, and
na represents 0 or 1.

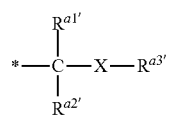
(2)

in which $R^{a1'}$ and $R^{a2'}$ independently each represent a hydrogen atom or a C1-C12 hydrocarbon group, and $R^{a3'}$ represents a C1-C20 hydrocarbon group, or $R^{a1'}$ and $R^{a2'}$ are bonded to each other to jointly represent a C2-C20 divalent hydrocarbon group where a methylene group may be replaced by —O— or —S—,
X represents —O— or —S— and * represents a binding position.

Examples of the alkyl group represented by $R^{a1}$, $R^{a2}$ and $R^{a3}$ include a methyl group, an ethyl group, a propyl group, an isopropyl group, a butyl group, a pentyl group, a hexyl group, a heptyl group and an octyl group.

The alicyclic hydrocarbon group represented by $R^{a1}$, $R^{a2}$ and $R^{a3}$ may be a monocyclic or polycyclic one. Examples of the alicyclic hydrocarbon group include a monocyclic hydrocarbon group such as a C3-C20 cycloalkyl group (e.g. a cyclopentyl group, a cyclohexyl group, a cycloheptyl group and a cyclooctyl group) and a polycyclic alicyclic hydrocarbon group such as a decahydronaphthyl group, an adamantyl group, a norbornyl group and the followings.

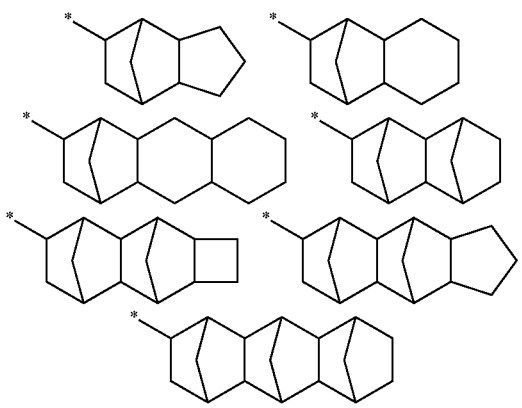

In each group, * represents a binding position.
The alicyclic hydrocarbon group preferably has 3 to 12 carbon atoms. Examples of the group formed by combining the alkyl group with the alicyclic hydrocarbon group include methylcyclohexyl group, dimethylcyclohexyl group, and a methylnorbornyl group.

The "na" preferably represents 0.
When $R^{a1}$ and $R^{a2}$ of formula (1) are bonded each other to jointly represent a C2-C20 divalent hydrocarbon group, examples of the group represented by formula (1) include the following groups and the ring preferably has 3 to 12 carbon atoms:

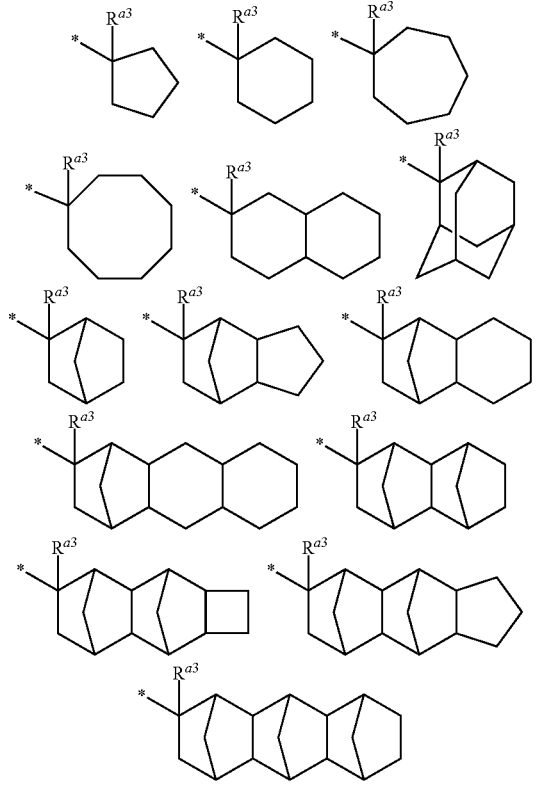

in each formula, $R^{a3}$ is the same as defined above and * represents a binding position to —O— of formula (1).

Examples of formula (1) include
1,1-dialkylalkoxycarbonyl group, i.e. the group of formula (1) where $R^{a1}$, $R^{a2}$ and $R^{a3}$ are alkyl groups, preferably tert-butoxycarbonyl group;
2-alkyladamantane-2-yloxycarbonyl group, i.e. the group of formula (1) where $R^{a1}$, $R^{a2}$ and the carbon group attached thereto jointly form an adamantyl group and where $R^{a3}$ is an alkyl group; and a 1-(adamantane-1-yl)alkane-1-ylalkylalkoxycarbonyl group, i.e. the group of formula (1) where $R^{a1}$ and $R^{a2}$ are alkyl groups and where $R^{a3}$ is an adamantyl group.

As to formula (2), examples of the monovalent hydrocarbon group represented by $R^{a1'}$, $R^{a2'}$ and $R^{a3'}$ include an alkyl group, an alicyclic hydrocarbon group, an aromatic hydrocarbon group, and a group formed by combining two or more of them.

Examples of the alkyl group and the alicyclic hydrocarbon group include the same as described above. Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group.

Divalent hydrocarbon group represented by $R^{a2'}$ and $R^{a3'}$ include groups which correspond to those as referred to by the monovalent hydrocarbon group represented by $R^{a1}$, $R^{a2}$ and $R^{a3}$.

It is preferred that at least one of $R^{a1'}$ and $R^{a2'}$ is a hydrogen atom.

Examples of the group represented by formula (2) include the following.

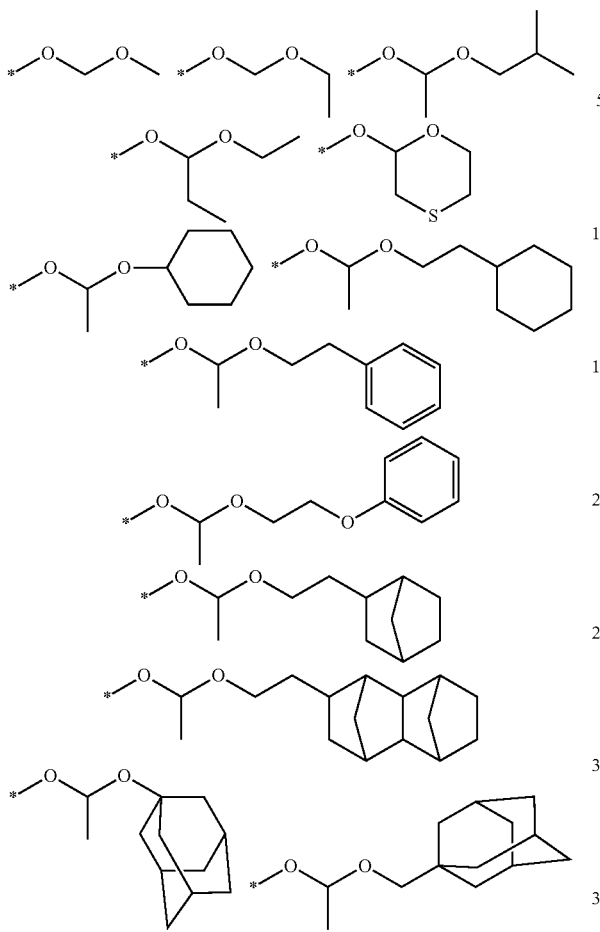

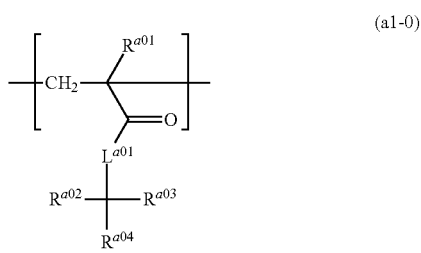

where $L^{a01}$ represents —O— or *—O—$(CH_2)_{k01}$—CO—O— in which k01 represents an integer of 1 to 7 and * represents a binding site to —CO—, $R^{a01}$ represents a hydrogen atom or a methyl group, $R^{a02}$, $R^{a03}$ and $R^{a04}$ each independently represent a C1-C8 alkyl group, C3-C18 monovalent alicyclic hydrocarbon group, or a group formed by combining them provided that the alkyl group is not attached to the alicyclic hydrocarbon group at its binding position.

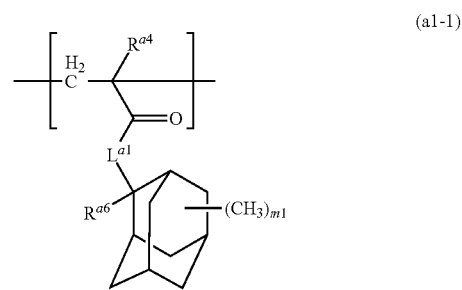

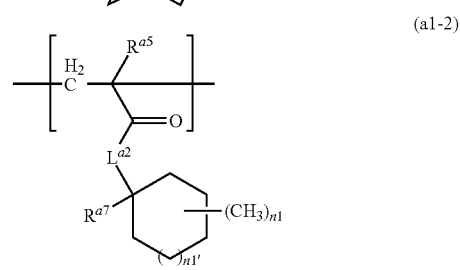

The structural unit (a1) is derived from a monomer having an acid-labile group. Such monomer is sometimes referred to "monomer (a1)".

The monomer (a1) is preferably a monomer which comprises an acid-labile group and an ethylenically unsaturated bond, more preferably a (meth)acryl monomer having an acid-labile group.

Examples of such (meth)acrylic compound include (meth)acrylic compounds having a C5-C20 alicyclic hydrocarbon group. The resin obtained from monomer (a1) which has a bulky structure such as the above-mentioned alicyclic hydrocarbon group can provide a photoresist pattern with improved resolution.

The monomer (a1) has preferably one or both of the groups represented by formulae (1) and (2).

Examples of a structural unit derived from the (meth)acrylic compounds having the group of formula (1) include preferably a structural unit represented by formula (a1-0), a structural unit represented by formula (a1-1) and a structural unit represented by formula (a1-2). Hereinafter, the structural unit represented by formula (a1-0), the structural unit represented by formula (a1-1) and the structural unit represented by formula (a1-2) are respectively referred to as "structural unit (a1-0)", "structural unit (a1-1)" and "structural unit (a1-2)". The monomers from which the structural units (a1-0), (a1-1) and (a1-2) are derived are respectively referred to as "monomer (a1-0)", "monomer (a1-1)" and "monomer (a1-2)".

where $L^{a1}$ and $L^{a2}$ each independently represent —O— or *—O—$(CH_2)_{k1}$—CO—O— in which k1 represents an integer of 1 to 7 and * represents a binding site to —CO—, $R^{a4}$ and $R^{a5}$ each independently represent a hydrogen atom or a methyl group, $R^{a6}$ and $R^{a7}$ each independently represent a C1-C8 alkyl group, C3-C20 monovalent alicyclic hydrocarbon group, or a group formed by combining them, m1 represents an integer of 0 to 14, n1 represents an integer of 0 to 10, and n1' represents an integer of 0 to 3.

In formula (a1-0), $L^{a01}$ represents preferably —O— or *—O—$(CH_2)_{k01}$—CO—O— in which k01 represents an integer of 1 to 4 and * represents a binding site to —CO—, and $L^{a01}$ represents more preferably —O—.

The alkyl groups represented by $R^{a02}$, $R^{a03}$ and $R^{a04}$ include a methyl group, an ethyl group, a propyl group, a butyl group, a pentyl group, a hexyl group, a heptyl group and an octyl group, and preferably C1-C6 alkyl group.

The alicyclic hydrocarbon group represented by $R^{a02}$, $R^{a03}$ and $R^{a04}$ may be a monocyclic or polycyclic one, examples of which include a cycloalkyl group such as a cyclopentyl group, a cyclohexyl group, a cycloheptyl group, or a cyclooctyl group; and a polycyclic saturated hydrogen-carbon group such as a decahydronaphthyl group, an adamantyl group, a norbornyl group, and the followings.

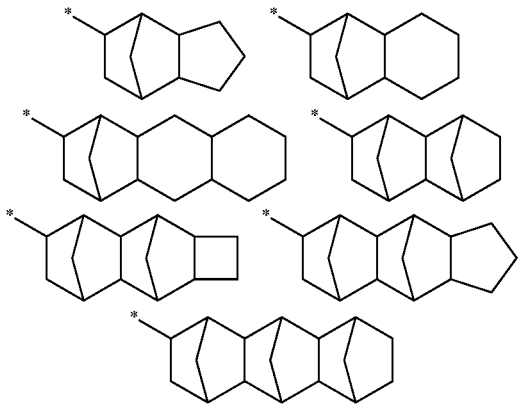

The alicyclic hydrocarbon group has preferably 3 to 18 carbon atoms, more preferably 3 to 6 carbon atoms.

In formula (a1-0), the group formed by combining the alkyl group with the alicyclic hydrocarbon group has preferably 18 or less carbon atoms in total, examples of which include methylcyclohexyl group, dimethylcyclohexyl group, and a methylnorbornyl group.

Preferably, $R^{a02}$, $R^{a03}$ and $R^{a04}$ each independently represent a C1-C6 alkyl group, or two of $R^{a02}$, $R^{a03}$ and $R^{a04}$ each independently represent a C1-C6 alkyl group while the other represent a C5-C12 alicyclic hydrocarbon group.

More preferably, $R^{a02}$, $R^{a03}$ and $R^{a04}$ each independently represent a methyl group, an ethyl group or a propyl group, or two of $R^{a02}$, $R^{a03}$ and $R^{a04}$ each independently represent a methyl group, an ethyl group or a propyl group while the other represent a cyclohexyl group or an adamantyl group.

In formulae (a1-1) and (a1-2), each of $L^{a1}$ and $L^{a2}$ is preferably —O— or *—O—$(CH_2)_{k1}$—CO—O— in which * and k1 are as defined above, and more preferably —O—.

The symbol k1 is preferably 1 to 4, more preferably 1.

$R^{a4}$ and $R^{a5}$ each preferably represent a methyl group.

Examples of the alkyl groups represented by $L^{a6}$ and $L^{a7}$ include the same as referred to for $R^{a02}$, $R^{a03}$ and $R^{a04}$, and preferably C1-C6 alkyl group.

The alicyclic hydrocarbon group represented by $R^{a6}$ and $R^{a7}$ may be a monocyclic or polycyclic one, examples of which include the same as referred to for $R^{a02}$, $R^{a03}$ and $R^{a04}$. The alicyclic hydrocarbon group represented by $R^{a6}$ and $R^{a7}$ has preferably 3 to 8 carbon atoms, more preferably 3 to 6 carbon atoms.

For formulae (a1-1) and (a1-2), examples of the group formed by combining the alkyl group with the alicyclic hydrocarbon group include methylcyclohexyl group, dimethylcyclohexyl group, and a methylnorbornyl group.

In the formula (a1-1), m1 is preferably an integer of 0 to 3, and is more preferably 0 or 1. In the formula (a1-2), n1 is preferably an integer of 0 to 3, more preferably 0 or 1, and n1' is preferably an integer of 0 or 1.

Specific examples of Monomer (a1-0) include those represented by formulae (a1-0-1) to (a1-0-12) and what are represented by the formulae where a methacroyl group has been replaced by an acroyl group in each of formulae (a1-0-1) to (a1-0-12).

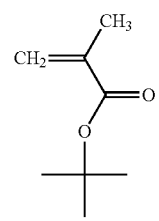
(a1-0-1)

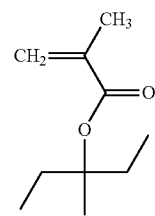
(a1-0-2)

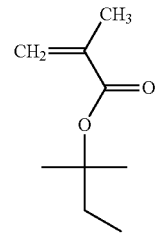
(a1-0-3)

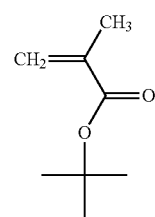
(a1-0-4)

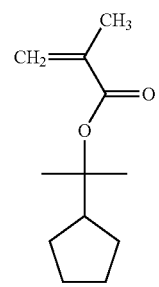
(a1-0-5)

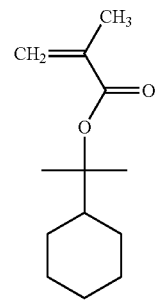
(a1-0-6)

(a1-0-7) 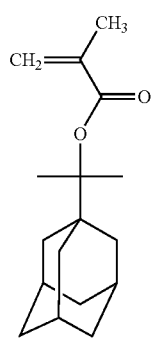
(a1-0-8) 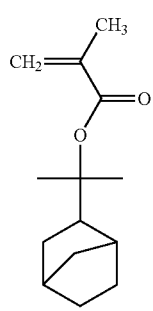
(a1-0-9) 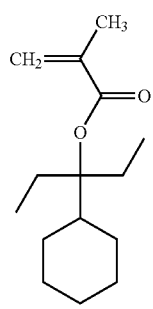
(a1-0-10) 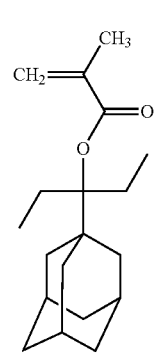
(a1-0-11) 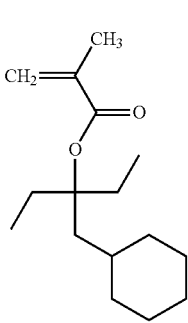
(a1-0-12) 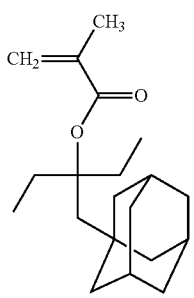
Among them, monomers represented by formulae (a1-0-1) to (a1-0-10) are preferred.
Examples of the monomer represented by the formula (a1-1) include the compounds mentioned in JP2010-204646A1. As the monomer represented by the formula (a1-1), preferred are monomers represented by formulae (a1-1-1), (a1-1-2), (a1-1-3), (a1-1-4), (a1-1-5), (a1-1-6), (a1-1-7) and (a1-1-8), and more preferred are monomers represented by formulae (a1-1-1), (a1-1-2), (a1-1-3) and (a1-1-4).
(a1-1-1) 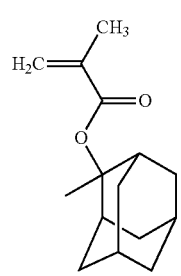
(a1-1-2) 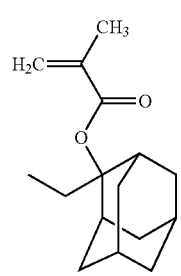
(a1-1-3) 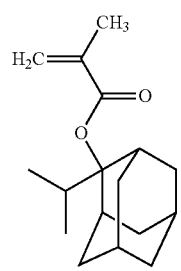

-continued

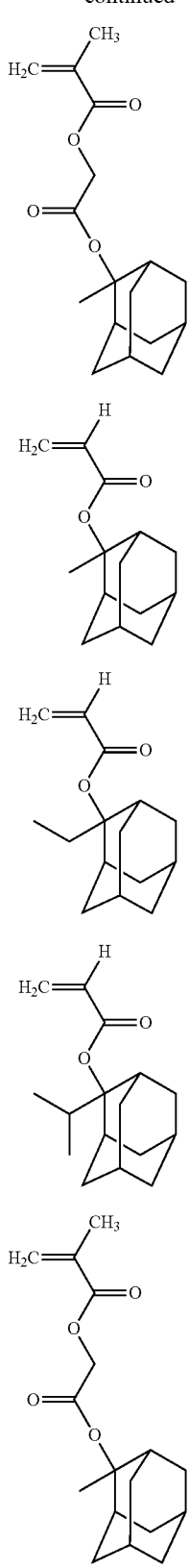

(a1-1-4)

(a1-1-5)

(a1-1-6)

(a1-1-7)

(a1-1-8)

Examples of monomers (a1-2) include compounds such as 1-methylcyclopentane-1-yl (meth)acrylate, 1-ethylcyclopentane-1-yl (meth)acrylate, 1-methylcyclohexan-1-yl (meth)acrylate, 1-ethylcyclohexan-1-yl (meth)acrylate, 1-ethylcycloheptan-1-yl (meth)acrylate, 1-ethylcyclooctan-1-yl (meth)acrylate, 1-isopropylcyclopentane-1-yl (meth)acrylate and 1-isopropylcyclohexan-1-yl (meth)acrylate.

As the monomer (a1-2), preferred are those represented by formulae (a1-2-1), (a1-2-2), (a1-2-3), (a1-2-4), (a1-2-5), (a1-2-6), (a1-2-7), (a1-2-8), (a1-2-9), (a1-2-10), (a1-2-11) and (a1-2-12), more preferred are those represented by formulae (a1-2-3), (a1-2-4), (a1-2-9) and (a1-2-10), more preferred are those represented by formulae (a1-2-3) and (a1-2-9).

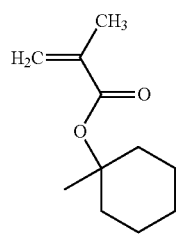
(a1-2-1)

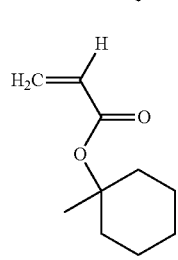
(a1-2-2)

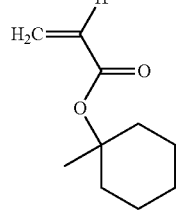
(a1-2-3)

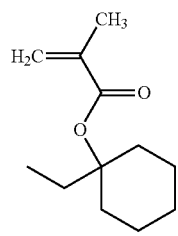
(a1-2-4)

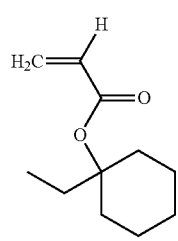
(a1-2-4)

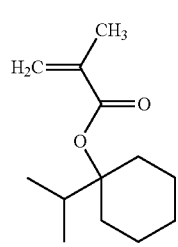
(a1-2-5)

-continued

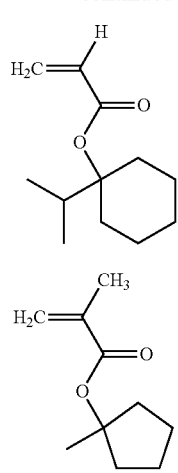

(a1-2-6)

(a1-2-7)

(a1-2-8)

(a1-2-9)

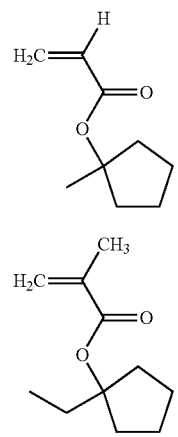

(a1-2-10)

(a1-2-11)

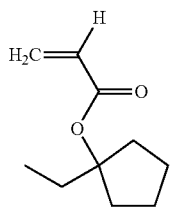

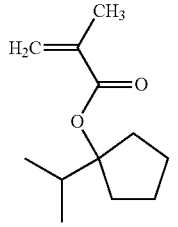

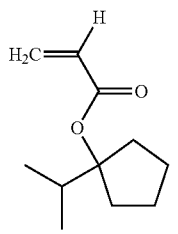

(a1-2-12)

When the resin according to the present invention comprises a structural unit (a1-0), a structural unit (a1-1) and/or (a1-2), the total content the structural units is usually 10 to 95% by mole, preferably 15 to 90% by mole, more preferably 20 to 85% by mole, based on 100% by mole of all the structural units of the resin.

Another example of the structural unit (a1) includes that represented by the formula (a-3):

$$\text{(a1-3)}$$

in which $R^{a9}$ represents a carboxy group, a cyano group, a hydrogen atom, —COOR$^{a13}$, or a C1-C13 monovalent aliphatic hydrocarbon group which may have a hydroxy group, $R^{a13}$ represents a C1-C8 monovalent aliphatic hydrocarbon group where a hydrogen atom can be replaced by a hydroxyl group and where a methylene group can be replaced by an oxygen atom or a carbonyl group, a C3-C20 monovalent alicyclic hydrocarbon group where a hydrogen atom can be replaced by a hydroxyl group and where a methylene group can be replaced by an oxygen atom or a carbonyl group, or a group formed by combining them, $R^{a10}$, $R^{a11}$ and $R^{a12}$ each independently represent a C1-C8 alkyl group, a C3-C20 monovalent alicyclic hydrocarbon group, a group formed by combining them, or two of $R^{a10}$, $R^{a11}$ and $R^{a12}$ are bonded to each other to jointly represent a C2-C20 divalent hydrocarbon group. Hereinafter, the structural unit represented by formula (a1-3) is referred to as "structural unit (a1-3)", and the monomer derived from the structural unit (a1-3) is referred to as "monomer (a1-3)". Examples of —COOR$^{a13}$ include those where an alkoxy group such as a methoxycarbonyl group or an ethoxycarbonyl group is bonded to a carbonyl group.

Examples of the monovalent aliphatic hydrocarbon group which may have a hydroxyl group for $R^{a9}$ include a methyl group, an ethyl group, a propyl group, a hydroxymethyl group and a 2-hydroxyethyl group.

Examples of the monovalent aliphatic hydrocarbon group for $R^{a13}$ include a methyl group, ethyl group and propyl group. Examples of the monovalent alicyclic hydrocarbon group for $R^{a13}$ include a cyclopentyl group, a cyclopropyl group, and an adamantyl group.

Examples of the group formed by combining them include an adamantylmethyl group, a 1-adamantyl-1-methylethyl group, 2-oxo-oxolan-3-yl group and 2-oxo-oxolan-4-yl group.

Examples of the groups represented by $R^{a10}$, $R^{a11}$ and $R^{a12}$ include those as referred to by the alkyl group, the alicyclic hydrocarbon group and the group formed by combining them each represented by $R^{a1}$, $R^{a2}$ and $R^{a3}$.

When $R^{a10}$ and $R^{a11}$ jointly represent a divalent hydrocarbon group, examples of the groups represented by —C($R^{a10}$)($R^{a11}$)($R^{a12}$) include preferably the following ones.

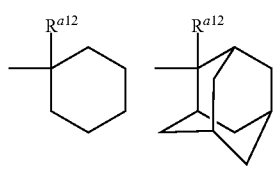

where $R^{a12}$ is as defined above.

Examples of the monomer (a1-3) include tert-butyl 5-norbornene-2-carboxylate, 1-cyclohexyl-1-methylethyl 5-norbornene-2-carboxylate, 1-methylcyclohexyl 5-norbornene-2-carboxylate, 1-methyl-2-adamantyl 5-norbornene-2-carboxylate, 2-ethyl-2-adamantyl 5-norbornene-2-carboxylate, (4-methylcyclohexyl)-1-methylethyl 5-norbornene-2-carboxylate, (4-hydroxycyclohexyl)-1-methylethyl 5-norbornene-2-carboxylate, 1-methyl-1-(4-oxocyclohexyl)ethyl 5-norbornene-2-carboxylate and (1-adamantyl)-1-methylethyl 5-norbornene-2-carboxylate.

The resin which comprises a structural unit (a1-3) has a bulky structure, so that the resin can provide a photoresist pattern with improved resolution. Such resin has a rigid norbornane ring at its main chain, so that a composition which comprises the resin can provide a film with an excellent resistance to dry etching.

When the resin according to the present invention comprises a structural unit (a1-3), its content is usually 10 to 95% by mole, preferably 15 to 90% by mole and more preferably 20 to 85% by mole based on 100% by mole of all the structural units of the resin.

Another example of the structural unit (a1) includes that represented by the formula (a1-4):

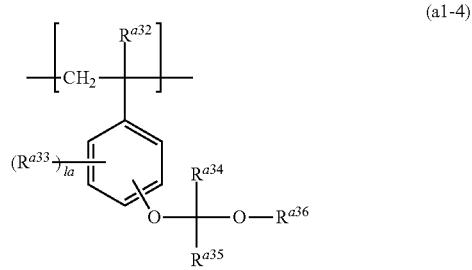

wherein $R^{a32}$ represents a hydrogen atom, a halogen atom, a C1-C6 alkyl group or a C1-C6 halogenated alkyl group, $R^{a33}$ is independently in each occurrence a halogen atom, a hydroxy group, a C1-C6 alkyl group, a C1-C6 alkoxy group, a C2-C4 acyl group, a C2-C4 acyloxy group, an acryloyl group or a methacryloyl group, la represents an integer of 0 to 4,
$R^{a34}$ and $R^{a35}$ each independently represent a hydrogen atom or a C1-C12 hydrocarbon group, $R^{a36}$ represents a C1-C20 aliphatic hydrocarbon group in which a methylene group can be replaced by —O— or —S—, and $R^{a35}$ and $R^{a36}$ are bonded to each other to jointly represent a C2-C20 divalent hydrocarbon group in which a methylene group can be replaced by —O— or —S—.

Hereinafter, the structural unit represented by formula (a1-4) is referred to as "structural unit (a1-4)".

Examples of the alkyl group represented by $R^{a32}$ and $R^{a33}$ include a methyl group, an ethyl group, a propyl group, a butyl group, a pentyl group, and a hexyl group, preferably a C1-C4 alkyl group, more preferably a methyl group and an ethyl group, and still more preferably a methyl group.

Examples of the alkoxy group represented by $R^{a33}$ include a methoxy group, an ethoxy group, a propoxy group, an isopropoxy group, a butoxy group, an isobutoxy group, a sec-butoxy group, a tert-butoxy group, a pentyloxy group and a hexyloxy group. Examples of the acyl group represented by $R^{a33}$ include an acetyl group, a propyonyl group and a butyryl group, and examples of the acyloxy group represented by $R^{a33}$ include an acetyloxy group, a propyonyloxy group and a butyryloxy group.

Examples of halogen atom represented by $R^{a32}$ and $R^{a33}$ include a fluorine atom, a chlorine atom, and a bromine atom.

Examples of the groups represented by $R^{a34}$ and $R^{a35}$ include those as referred to for $R^{a1'}$ and $R^{a2'}$.

Examples of the groups represented by $R^{a36}$ include those as referred to for $R^{a3'}$.

$R^{a32}$ preferably represents a hydrogen atom.

$R^{a33}$ is preferably a C1-C4 alkoxy group, more preferably a methoxy group and an ethoxy group, and still more preferably a methoxy group.

The "la" preferably represents 0 or 1, more preferably 1.

$R^{a34}$ preferably represents a hydrogen atom.

$R^{a36}$ is preferably a C1-C12 monovalent hydrocarbon group, more preferably a methyl group and an ethyl group.

The hydrocarbon group represented by $R^{a36}$ includes a C1-C18 alkyl group, a C3-C18 monovalent alicyclic hydrocarbon group, a C6-C18 monovalent aromatic hydrocarbon group, and any combination of them, and preferably a C1-C18 alkyl group, a C3-C18 monovalent alicyclic hydrocarbon group and a C7-C18 aralkyl group. These groups may be unsubstituted or substituted. The alkyl group and the monovalent alicyclic hydrocarbon group are preferably unsubstituted. As the substituent for the monovalent aromatic hydrocarbon group, a C6-C10 aryloxy group is preferred.

Examples of the monomer from which the structural unit (a1-4) is derived include monomers recited in JP2010-204646A1. Among them, the monomers represented by formulae (a1-4-1), (a1-4-2), (a1-4-3), (a1-4-4), (a1-4-5), (a1-4-6) and (a1-4-7) are preferred, and the monomers represented by formulae (a1-4-1), (a1-4-2), (a1-4-3), (a1-4-4) and (a1-4-5) are more preferred.

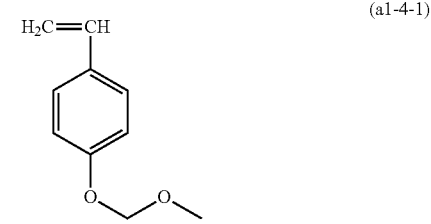

(a1-4-1)

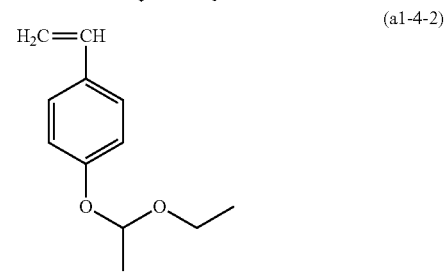

(a1-4-2)

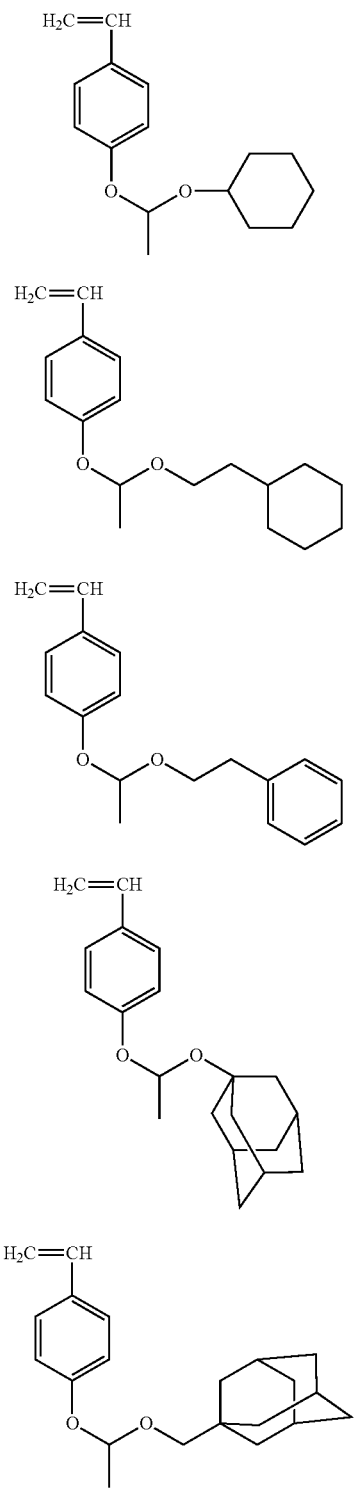

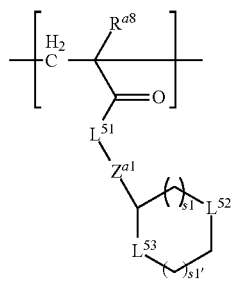

Hereinafter, the structural unit represented by formula (a1-5) is referred to as "structural unit (a1-5)".

In formula (1-5), $R^{a8}$ represents a hydrogen atom, a halogen atom, or a C1-C6 alkyl group which may have a halogen atom, $Z^{a1}$ represents a single bond or *—$(CH_2)_{h3}$—CO-$L^{54}$- in which h3 represents an integer of 1 to 4 and * represents a binding site to $L^{51}$, $L^{51}$, $L^{52}$, $L^{53}$ and $L^{54}$ each independently represent an oxygen atom or a sulfur atom, s1 represents an integer of 1 to 3, and s1' represents an integer of 0 to 3.

In the formula (a-5), examples of halogen atom include a fluorine atom or a chlorine atom, preferably a fluorine atom.

Examples of alkyl group having a halogen atom include alkyl groups such as a methyl group, an ethyl group, a propyl group, a butyl group, a pentyl group, a hexyl group, and fluoroalkyl groups such as a fluoromethyl group and a trifluoromethyl group.

$R^{a8}$ preferably represents a hydrogen atom, a methyl group, or a trifluoromethyl group.

$L^{51}$ preferably represents an oxygen atom.

It is preferred that one of $L^{52}$ and $L^{53}$ represents an oxygen atom, while the other represents a sulfur atom.

s1 preferably represents 1. s1' represents an integer of 0 to 2.

$Z^1$ preferably represents a single bond or *—$CH_2$—CO—O— wherein * represents a binding site to $L^{51}$.

Examples of the monomer from which the structural unit (a-5) is derived include the following ones:

When the resin according to the present invention comprises a structural unit (a1-4), its content is usually 10 to 95% by mole, preferably 15 to 90% by mole and more preferably 20 to 85% by mole based on 100% by mole of all the structural units of the resin.

Another example of the structural unit (a1) includes that represented by the formula (a-5).

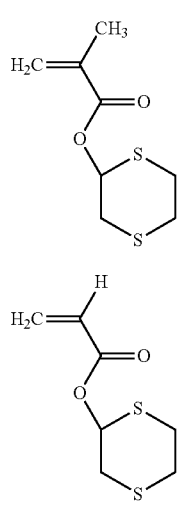

(a1-5-3)

(a1-5-4)

When the resin according to the present invention comprises a structural unit (a1-5), its content is usually 1 to 50% by mole, preferably 3 to 45% by mole and more preferably 5 to 40% by mole based on 100% by mole of all the structural units of the resin.

The structural unit (a1) is preferably one selected from the group consisting of structural units (a1-0), (a1-1), (a1-2) and (a1-5), more preferably two or more ones selected from the group consisting of these structural units, and still more preferably the structural unit (a1-1).

Resin (A) comprises preferably the structural units (a1-1) and (a1-2), the structural units (a1-1) and (a1-5), the structural units (a1-1) and (a1-0), the structural units (a1-2) and (a1-0), the structural units (a1-5) and (a1-0), the structural units (a1-0), (a1-1) and (a1-2), or the structural units (a1-0), (a1-1) and (a1-5), more preferably the structural units (a1-1) and (a1-2), or the structural units (a1-1) and (a1-5).

<Structural Unit Having No Acid-Labile Group>

The structural unit (s), that is one having no acid-labile group, is derived from a monomer having no acid-labile group. Monomers which have been known to in the art can be used as such monomer and they are not limited to any specific one, provided that it has no acid-labile group.

The structural unit (s) preferably has a hydroxyl group or a lactone ring. When the resin comprises a structural unit (s) having a hydroxyl group or a lactone ring, a photoresist composition capable of providing a photoresist film with good resolution and adhesiveness of photoresist to a substrate can be obtained.

Hereinafter, the structural unit (s) having a hydroxy group is referred to as "structural unit (a2)", and the structural unit (s) having a lactone ring is referred to as "structural unit (a3)".

The hydroxy group which the structural unit (a2) has may be an alcoholic hydroxy group or a phenolic hydroxy group.

When KrF excimer laser (wavelength: 248 nm) lithography system, or a high energy laser such as electron beam and extreme ultraviolet is used as an exposure system, the resin which comprises the structural unit (a2) having a phenolic hydroxy group is preferred. When ArF excimer laser (wavelength: 193 nm) is used as an exposure system, the resin which comprises the structural unit (a2) having an alcoholic hydroxy group is preferred and the resin which comprises the structural unit (a2-1) described later is more preferred.

Resin (A) may comprise one or more of the structural units (a2).

Examples of the structural unit (a2) having a phenolic hydroxy group include one represented by the formula (a2-0):

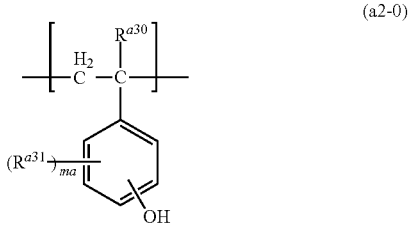

(a2-0)

In formula (a2-0), $R^{a30}$ represents a hydrogen atom, a halogen atom, a C1-C6 alkyl group or a C1-C6 halogenated alkyl group, $R^{a31}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, ma represents an integer of 0 to 4, In the formula (a2-0), examples of the halogen atom include a fluorine atom, a chlorine atom, a bromine atom or iodine atom, examples of the C1-C6 alkyl group include a methyl group, an ethyl group, a propyl group, an isopropyl group, a n-butyl group, an isobutyl group, a sec-butyl group, a tert-butyl group, a pentyl group and a hexyl group, and a C1-C4 alkyl group is preferred and a C1-C2 alkyl group is more preferred and a methyl group is especially preferred. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferred and a C1-C2 alkoxy group is more preferred and a methoxy group is especially preferred. Examples of the C2-C4 acyl group include an acetyl group, a propyonyl group and a butyryl group, and examples of the C2-C4 acyloxy group include an acetyloxy group, a propyonyloxy group and a butyryloxy group.

In the formula (a2-0), ma is preferably 0, 1 or 2, and is more preferably 0 or 1, and especially preferably 0.

Examples of the monomer from which the structural unit (a2-0) is derived include compounds mentioned in JP2010-204634A1. Among them, the structural units represented by formulae (a2-0-1), (a2-0-2), (a2-0-3) and (a2-0-4) are preferred as the structural unit (a2-0), and those represented by formulae (a2-0-1) and (a2-0-2) are more preferred.

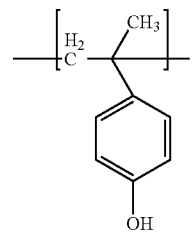

(a2-0-1)

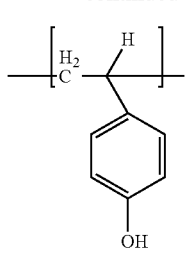
(a2-0-2)

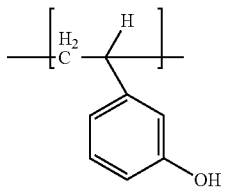
(a2-0-3)

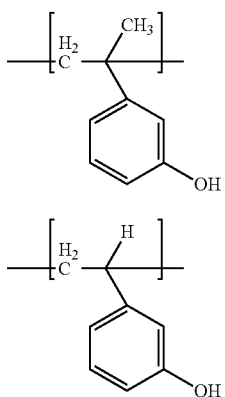
(a2-0-4)

The resin which comprises a structural units represented by formula (a2-0) can be produced, for example, by polymerizing a monomer where its phenolic hydroxyl group has been protected with a suitable protecting group, followed by deprotection. Examples of the protecting group for a phenolic hydroxyl group include an acetyl group.

When the resin according to the present invention comprises the structural unit (a2-0), its content is usually 5 to 95% by mole and preferably 10 to 85% by mole and more preferably 15 to 80% by mole based on all the structural units of the resin.

Examples of the structural unit (a2) having an alcoholic hydroxy group include one represented by the formula (a2-1):

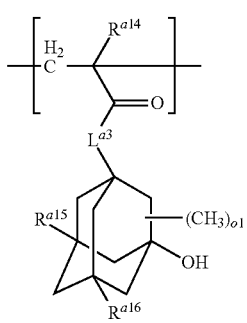
(a2-1)

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *—O— or *—O—$(CH_2)_{k2}$—CO—O— in which * represents a binding position to —CO—, and k2 represents an integer of 1 to 7, and o1 represents an integer of 0 to 10. Hereinafter, the structural unit represented by formula (a2-1) is referred to as "structural unit (a2-1)".

In the formula (a2-1), $R^{a14}$ is preferably a methyl group. $R^{a15}$ is preferably a hydrogen atom. $R^{a16}$ is preferably a hydrogen atom or a hydroxyl group. $L^{a3}$ is preferably *—O— or *—O—$(CH_2)_{f2}$—CO—O— in which * represents a binding position to —CO—, and f2 represents an integer of 1 to 4, is more preferably *—O— and *—O—$CH_2$—CO—O—, and is still more preferably *—O—, and o1 is preferably 0, 1, 2 or 3 and is more preferably 0 or 1.

Examples of monomers from which the structural unit (a2-1) is derived include compounds mentioned in JP2010-204646A.

Preferred examples of the monomer include those represented by formulae (a2-1-1) to (a2-1-6).

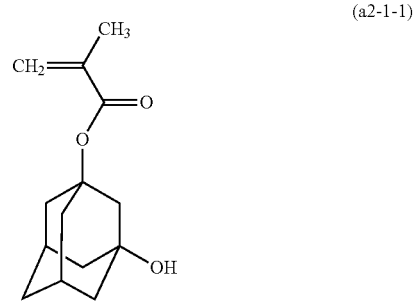
(a2-1-1)

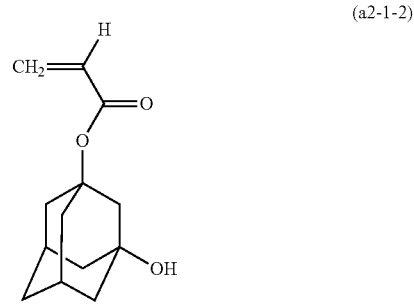
(a2-1-2)

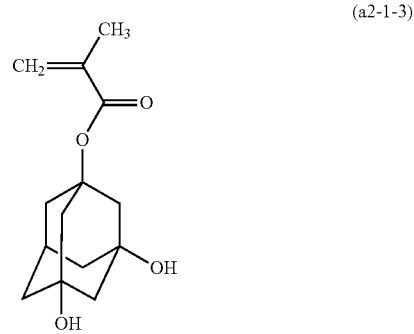
(a2-1-3)

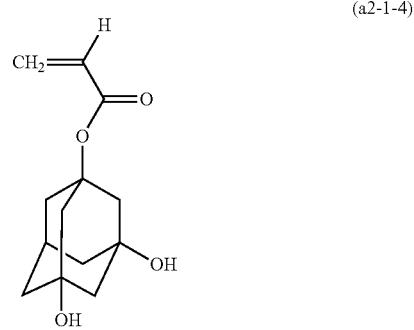
(a2-1-4)

-continued (a2-1-5)

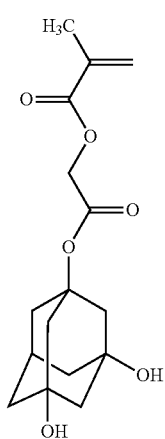

(a2-1-6)

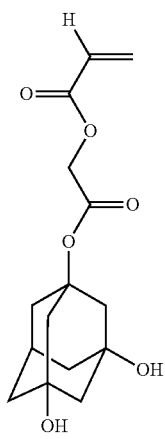

Among them, more preferred are the monomers represented by formulae (a2-1-1), (a2-1-2), (a2-1-3) and (a2-1-4), still more preferred are monomers represented by formulae (a2-1-1) and (a2-1-3).

When the resin according to the present invention comprises the structural unit (a2-1), its content is usually 1 to 45% by mole, preferably 1 to 40% by mole, and more preferably 1 to 35% by mole, and especially preferably 2 to 20% by mole, based on all the structural units of the resin.

Examples of the lactone ring which the structural unit (a3) has include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferred examples of structural unit (a3) include those represented by the formulae (a3-1), (a3-2), (a3-3) and (a3-4):

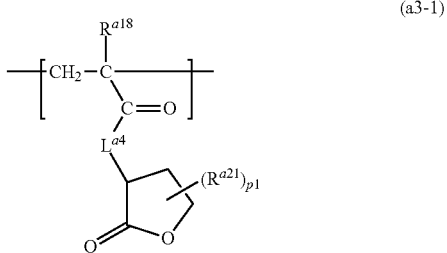

(a3-2)

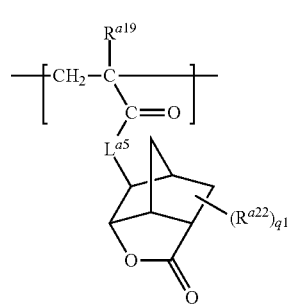

(a3-3)

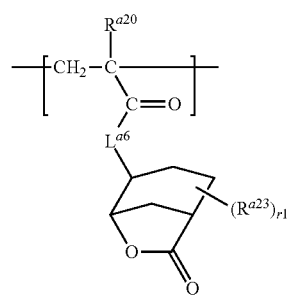

(a3-4)

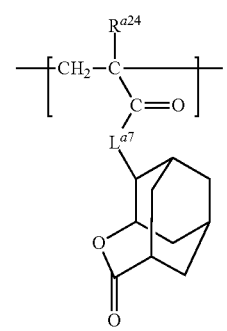

In formulae, $L^{a4}$, $L^{a5}$ and $L^{a6}$ each independently represent *—O— or *—O—$(CH_2)_{k3}$—CO—O— in which * represents a binding position to —CO— and k3 represents an integer of 1 to 7, $R^{a18}$, $R^{a19}$ and $R^{a20}$ each independently represent a hydrogen atom or a methyl group, $R^{a21}$ represents a C1-C4 monovalent aliphatic hydrocarbon group, $R^{a22}$ and $R^{a23}$ are independently in each occurrence a carboxyl group, a cyano group or a C1-C4 monovalent aliphatic hydrocarbon group, $R^{a24}$ each independently represent a hydrogen atom, a halogen atom, or a C1-C6 alkyl group which may have a halogen atom, $L^{a7}$ represents a single bond, $*^1$-$L^{a8}$-O—, $*^1$-$L^{a8}$-CO—O—, $*^1$-$L^{a8}$-CO—O-$L^{a9}$-CO—O— or $*^1$-$L^{a8}$-CO—O-$L^{a9}$-O— in which $L^{a8}$ and $L^{a9}$ each independently represent C1-C6 divalent alkanediyl group, $*^1$ represents a binding position to —O—, and p1 represents an integer of 0 to 5, q1 and r1 independently each represent an integer of 0 to 3.

Examples of halogen atom represented by $R^{a24}$ include a fluorine atom, a chlorine atom, a bromine atom and an iodine atom.

Examples of the alkyl group represented by $R^{a24}$ include a methyl group, an ethyl group, a propyl group, a butyl group, a pentyl group, and a hexyl group, preferably a C1-C4 alkyl group, and more preferably a methyl group and an ethyl group.

As to $R^{a24}$, examples of the alkyl group which has an halogen atom include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group, a perfluorohexyl group, a trichloromethyl group, a tribromomethyl group, and a triiodomethyl group.

As to $L^{a8}$ and $L^{a9}$, examples of the alkanediyl group include a methylene group, an ethylene group, a propane-1,3-diyl group, a butane-1,4-diyl group, a pentane-1,5-diyl group and a hexane-1,6-diyl group, a butane-1,3-diyl group, 2-methylpropane-1,3-diyl group, a 2-methylpropane-1,2-diyl group, a pentane-1,4-diyl group and a 2-methylbutane-1,4-diyl group.

It is preferred that $L^{a4}$, $L^{a5}$ and $L^{a6}$ each independently represent *—O— or *—O—$(CH_2)_{d1}$—CO—O— in which * represents a binding position to —CO— and d1 represents an integer of 1 to 4, and it is more preferred that $L^{a4}$, $L^{a5}$ and $L^{a6}$ are *—O— and *—O—$CH_2$—CO—O—, and it is still more preferred that $L^{a4}$, $L^{a5}$ and $L^{a6}$ are *—O—.

$R^{a18}$, $R^{a19}$, $R^{a20}$ and $R^{a21}$ are preferably methyl groups.

It is preferred that $R^{a22}$ and $R^{a23}$ are independently in each occurrence a carboxyl group, a cyano group or a methyl group.

It is preferred that p1, q1 and r1 each independently represent an integer of 0 to 2, and it is more preferred that p1, q1 and r1 each independently represent 0 or 1.

$R^{a24}$ is preferably a hydrogen atom or a C1-C4 alkyl group, more preferably a hydrogen atom, a methyl group or an ethyl group, and still more preferably a hydrogen atom or a methyl group.

$L^{a7}$ represents preferably a single bond or $*^1$-$L^{a8}$-CO—O—, more preferably a single bond, $*^1$—$CH_2$—CO—O— or $*^1$—$C_2H_4$—CO—O—.

Examples of the monomer from which the structural unit (a3) is derived include those mentioned in JP2010-204646A, JP2000-122294A and JP2012-41274A. As the structural unit (a3), preferred are those represented by the formulae (a3-1-1) to (a3-1-4), the formulae (a3-2-1) to (a3-2-4), the formulae (a3-3-1) to (a3-3-4) and the formulae (a3-4-1) to (a3-4-6), more preferred are those represented by the formulae (a3-1-1), (a3-1-2), (a3-2-3) and (a3-2-4), and still more preferred are those represented by the formulae (a3-1-1) and (a3-2-3).

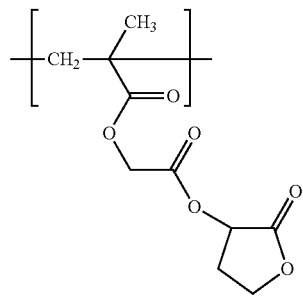

(a3-1-1)

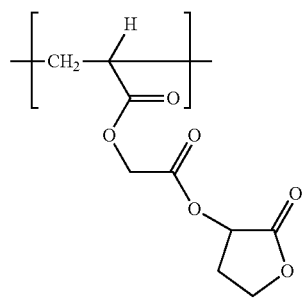

(a3-1-2)

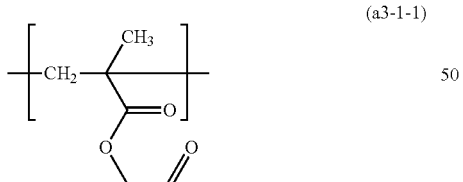

(a3-1-3)

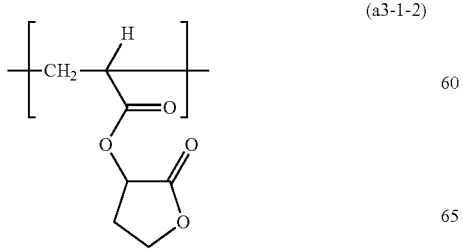

(a3-1-4)

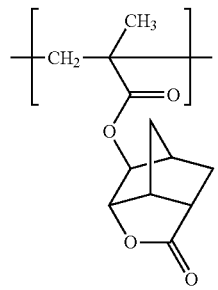

(a3-2-1)

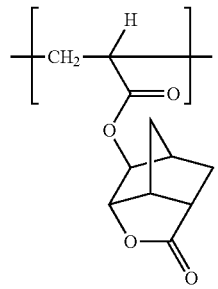

(a3-2-2)

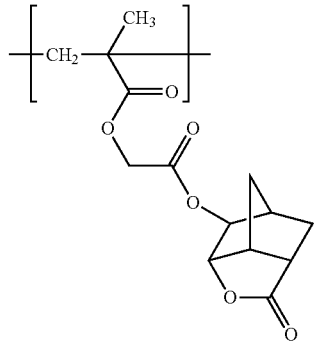

(a3-2-3)

(a3-2-4)
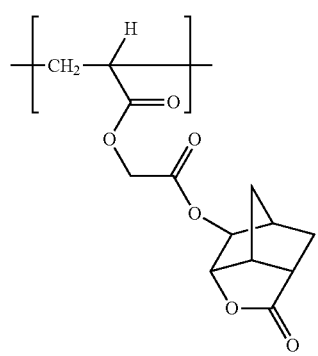
(a3-3-1)
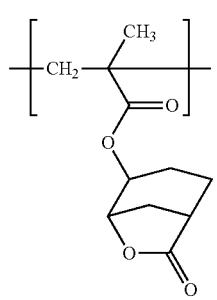
(a3-3-2)
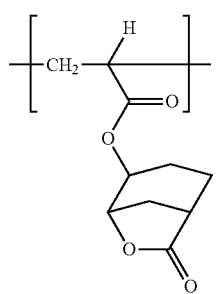
(a3-3-3)
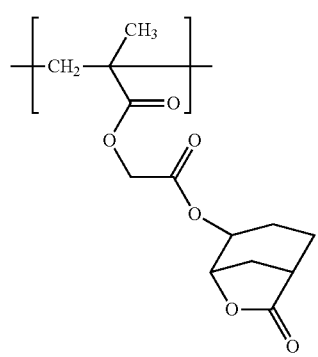
(a3-3-4)
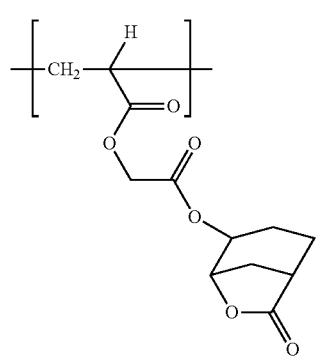
(a3-4-1)
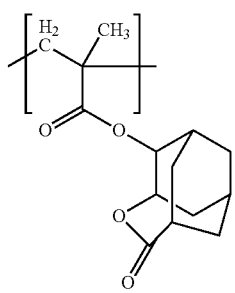
(a3-4-2)
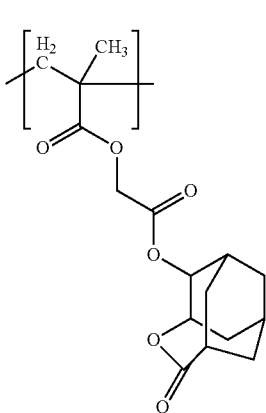
(a3-4-3)
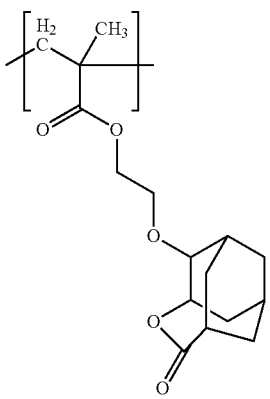
(a3-4-4)
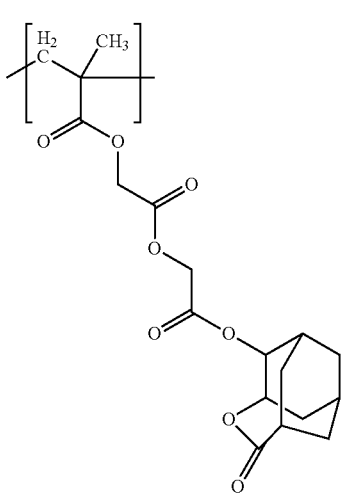

(a3-4-5)

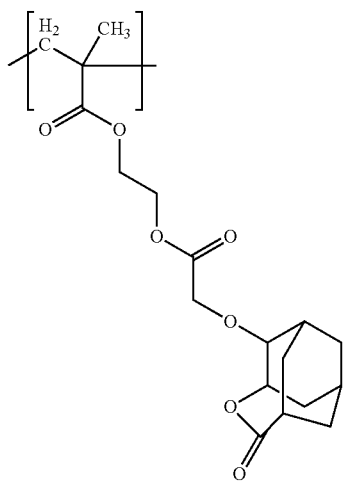

(a3-4-6)

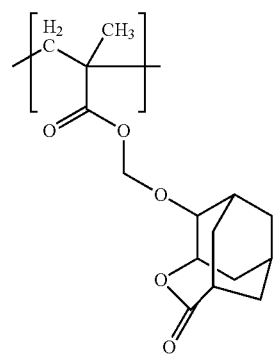

Specific examples of the structural unit (a3) include those where methyl groups of formulae (a3-4-1) to (a3-4-6) are replaced by hydrogen atoms.

When the resin according to the present invention comprises the structural unit (a3), its content thereof is preferably 5 to 70% by mole, and more preferably 10 to 65% by mole and more preferably 10 to 60% by mole, based on all the structural units of the resin.

When the resin according to the present invention comprises the structural unit (a3-1), the structural unit (a3-2) or the structural unit (a3-3), each content is preferably 5 to 60% by mole, and more preferably 5 to 50% by mole and more preferably 10 to 50% by mole, based on all the structural units of the resin.

Examples of the structural unit having no acid-labile group include a structural unit having no acid-labile group but having a halogen atom. Hereinafter, the structural unit having no acid-labile group but having a halogen atom is referred to as "structural unit (a4)". Halogen atoms for the structural unit (a4) may be a fluorine atom, a chlorine atom, a bromine atom, or an iodine atom. The structural unit (a4) has preferably a fluorine atom.

Examples of the structural unit (a4) include a compound represented by formula (a4):

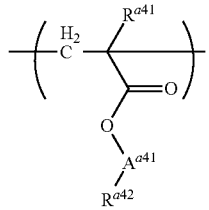

(a4)

In formula (a4), $R^{a41}$ represents a hydrogen atom or a methyl group; $A^{a41}$ represents a single bond or a C1-C6 divalent alkanediyl group where a methylene group can be replaced by a carbonyl group or an oxygen atom; and $A^{a42}$ represents a C1-C20 fluorine-containing saturated hydrocarbon group, preferably a C1-C10 saturated perfluorohydrocarbon group, more preferably C1-C6 perfluoroalkyl group.

Examples of $A^{a41}$ include a single bond, —$CH_2$—, —$CH_2$—$CH_2$—, —$CH_2$—$CH_2$—$CH_2$—, —$CH_2$—O—CO— and —$CH_2$—$CH_2$—O—CO—. Examples of $A^{a42}$ include a C1-C20 fluoroalkyl group such as a fluoromethyl group, a fluoroethyl group, a fluoropropyl group, a fluorobutyl group, a fluoropentyl group, a fluorohexyl group, a perfluoroheptyl group, and a perfluorooctyl group; a C3-C20 fluorocycloalkyl group such as fluorocyclohexyl group; and a C5-C20 fluoropolycyclic hydrocarbon group such as fluoroadamantyl group.

Examples of the structural unit (a4) include the following ones and those which a methyl group has been replaced by a hydrogen atom in each of the following formulae.

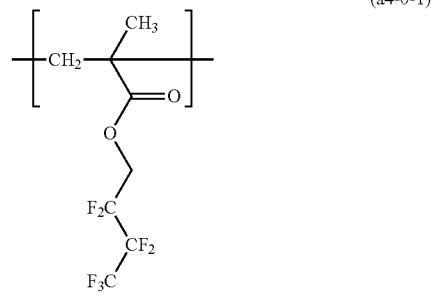

(a4-0-1)

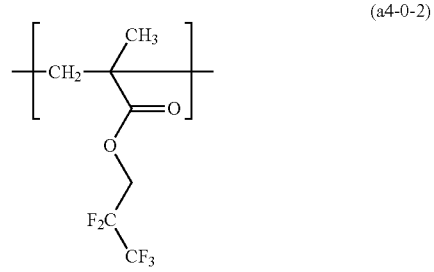

(a4-0-2)

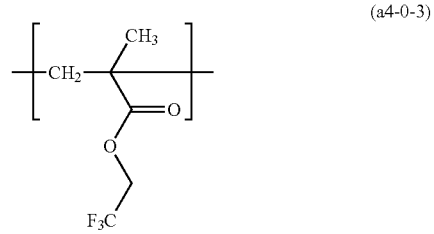

(a4-0-3)

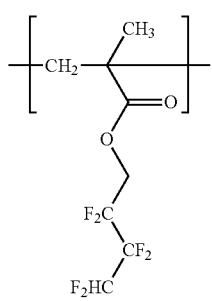
(a4-0-4)
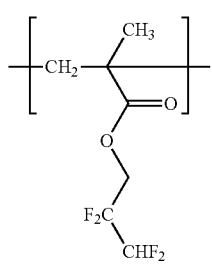
(a4-0-5)
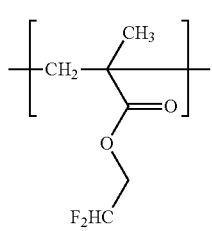
(a4-0-6)
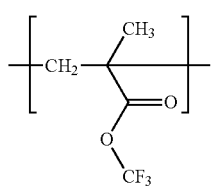
(a4-0-7)
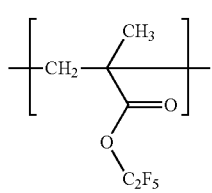
(a4-0-8)
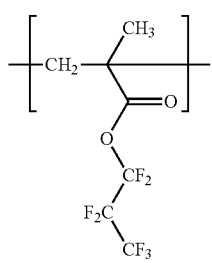
(a4-0-9)
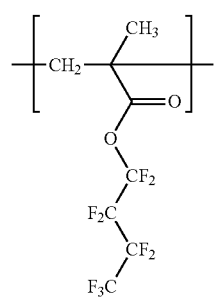
(a4-0-10)
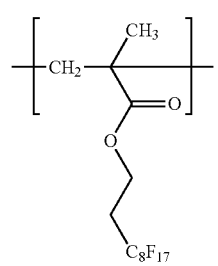
(a4-0-11)
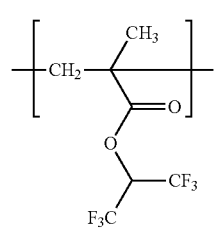
(a4-0-12)
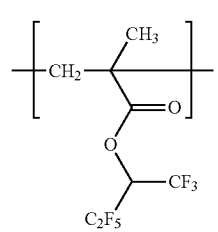
(a4-0-13)
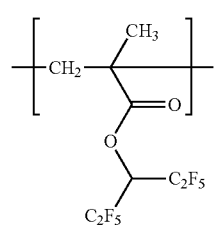
(a4-0-14)
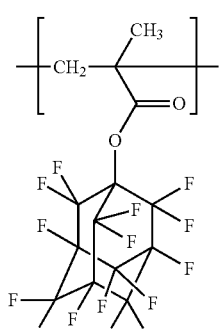
(a4-0-15)

-continued
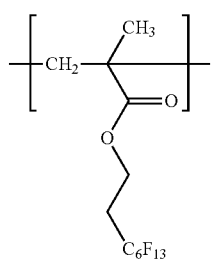 (a4-0-16)
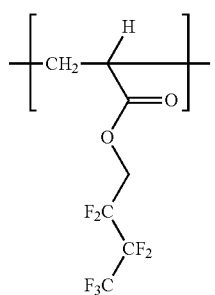 (a4-0-17)
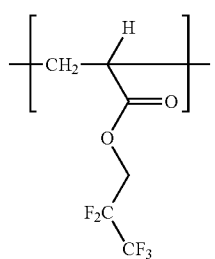 (a4-0-18)
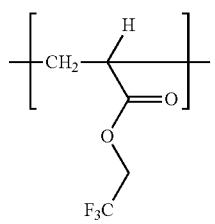 (a4-0-19)
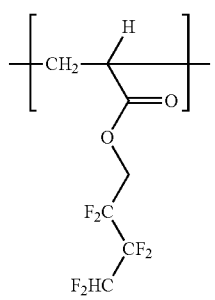 (a4-0-20)
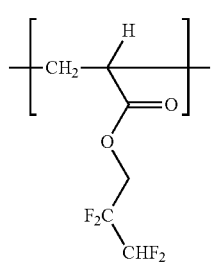 (a4-0-21)
-continued
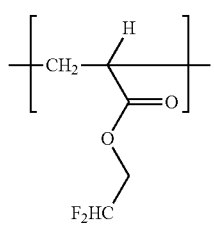 (a4-0-22)
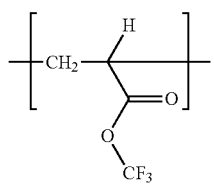 (a4-0-23)
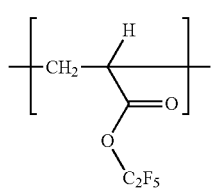 (a4-0-24)
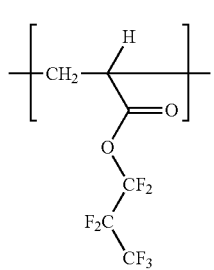 (a4-0-25)
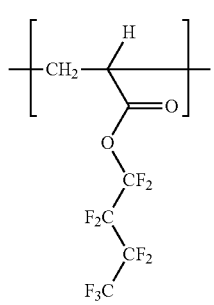 (a4-0-26)
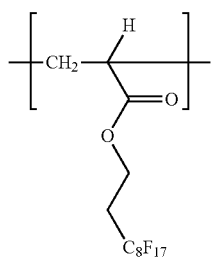 (a4-0-27)

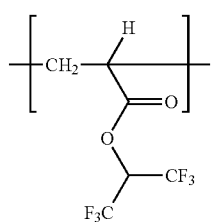 (a4-0-28)
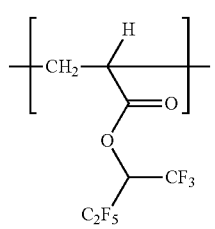 (a4-0-29)
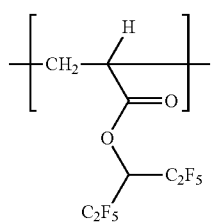 (a4-0-30)
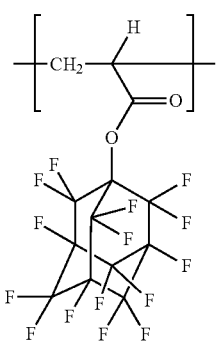 (a4-0-31)
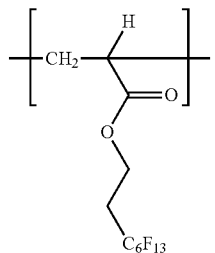 (a4-0-32)
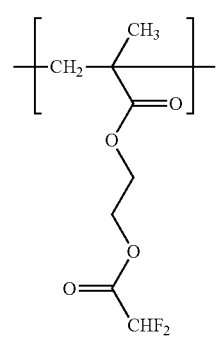 (a4-1-1)
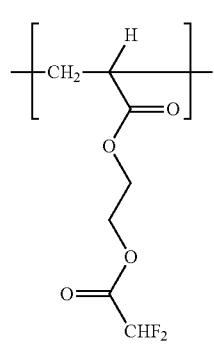 (a4-1-2)
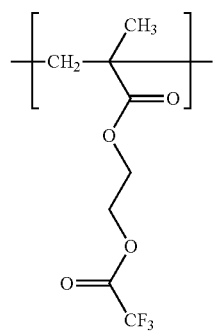 (a4-1-3)
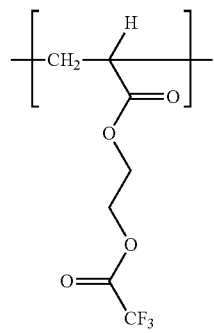 (a4-1-4)
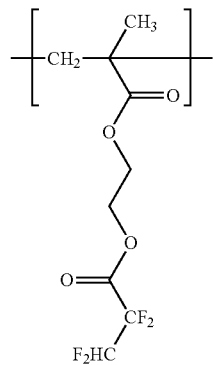 (a4-1-5)

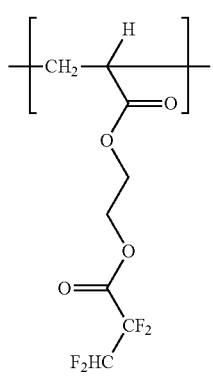 (a4-1-6)
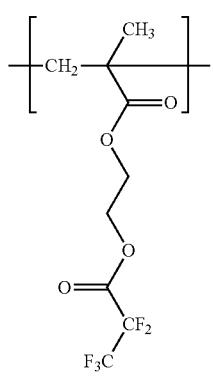 (a4-1-7)
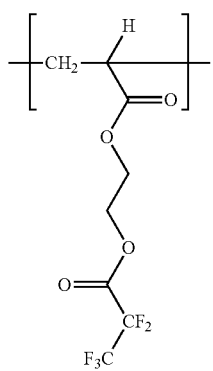 (a4-1-8)
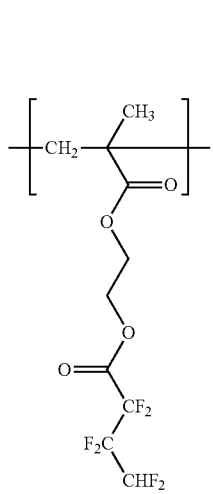 (a4-1-9)
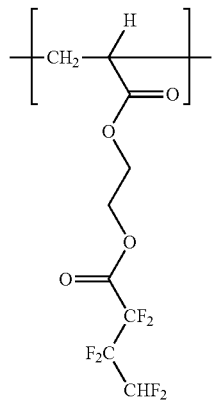 (a4-1-10)
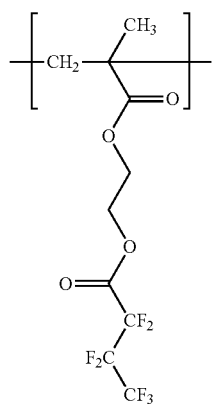 (a4-1-11)
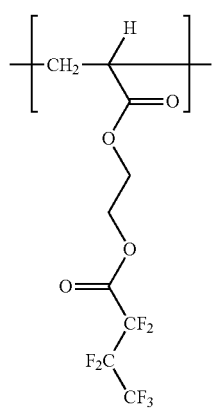 (a4-1-12)
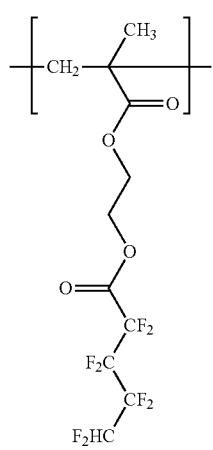 (a4-1-13)

(a4-1-14)
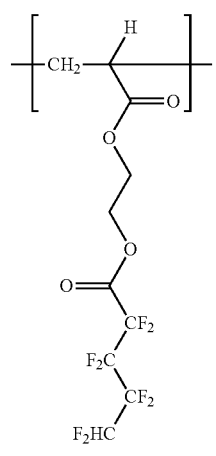
(a4-1-15)
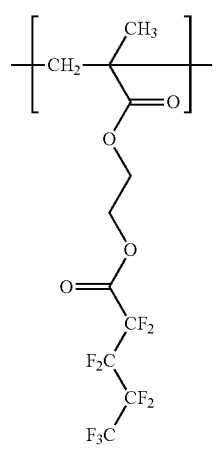
(a4-1-16)
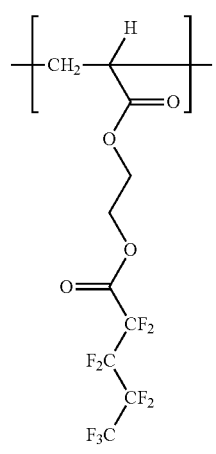
(a4-1-17)
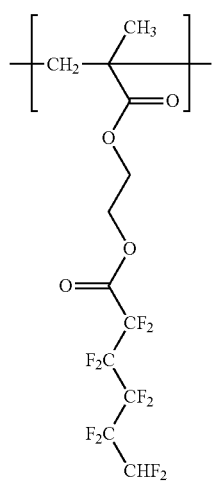
(a4-1-18)
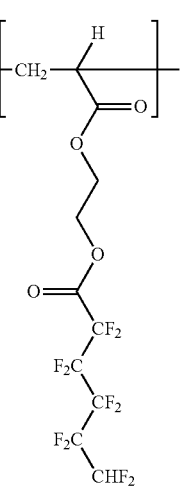
(a4-1-19)
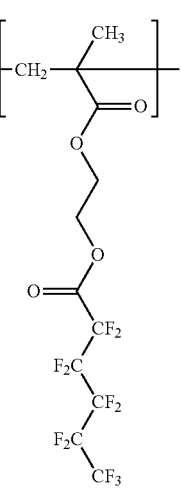

(a4-1-20)
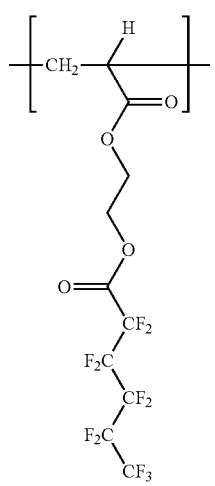
(a4-1-21)
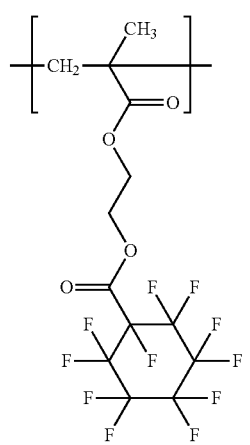
(a4-1-22)
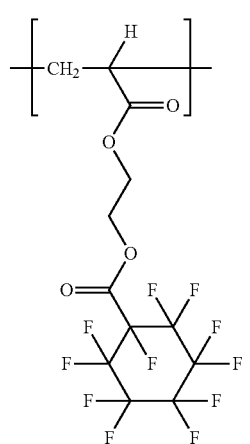
(a4-1'-1)
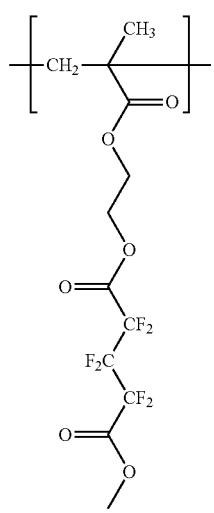
(a4-1'-2)
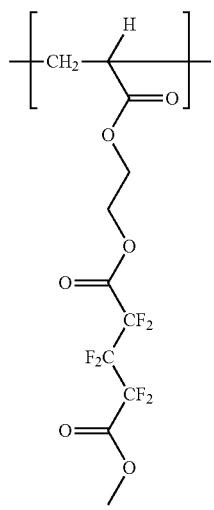
(a4-1'-3)

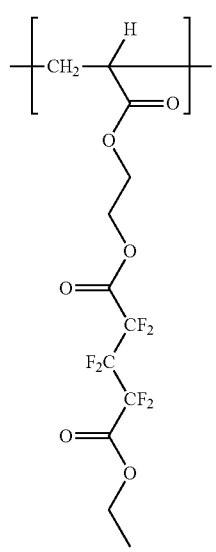
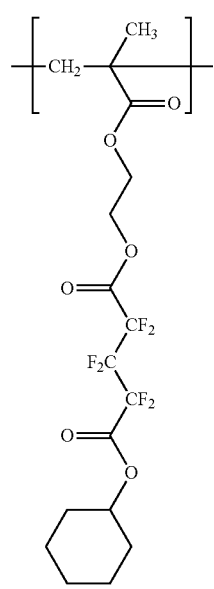

(a4-1'-9)
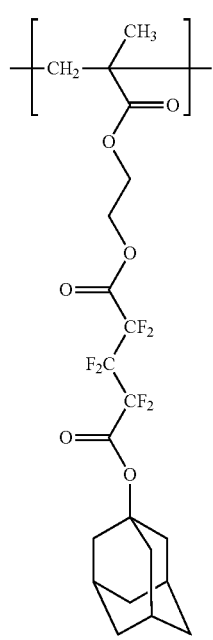
(a4-1'-10)
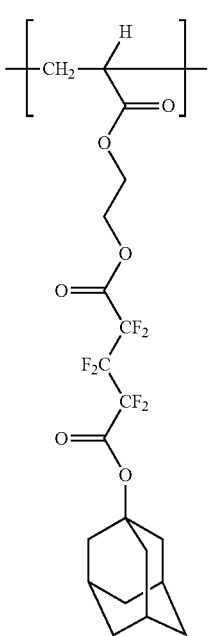
(a4-1'-11)
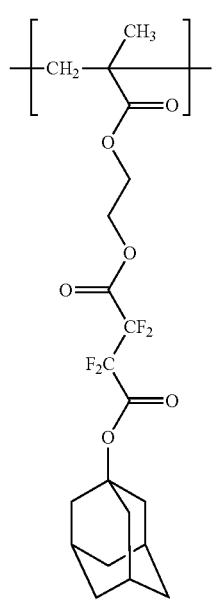
(a4-1'-12)
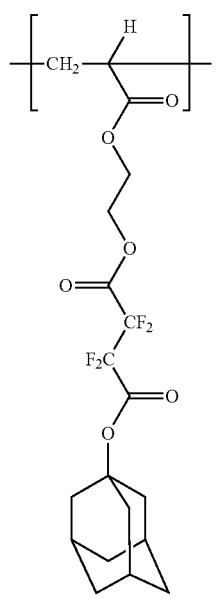

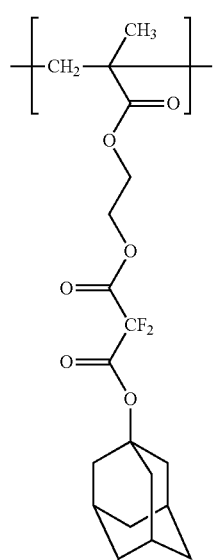 (a4-1'-13)
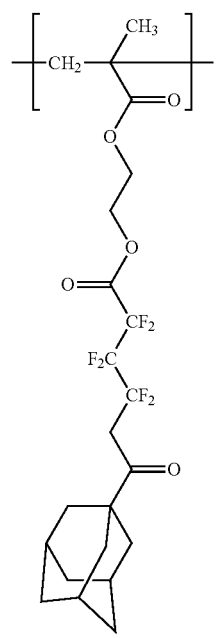 (a4-1'-15)
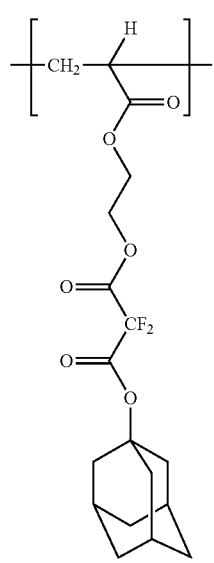 (a4-1'-14)
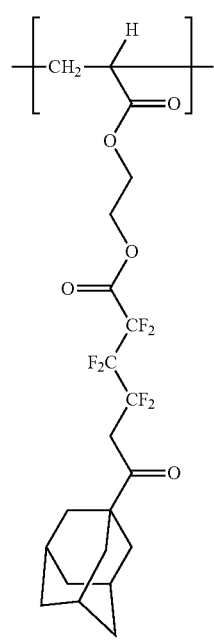 (a4-1'-16)

(a4-1'-17)
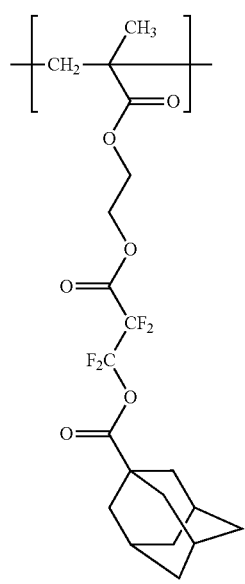
(a4-1'-18)
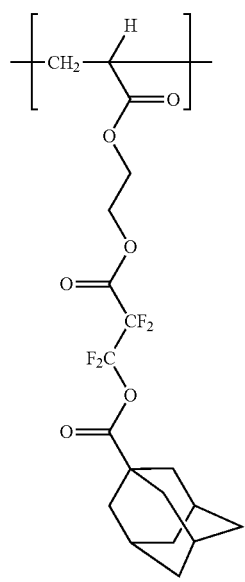
(a4-1'-19)
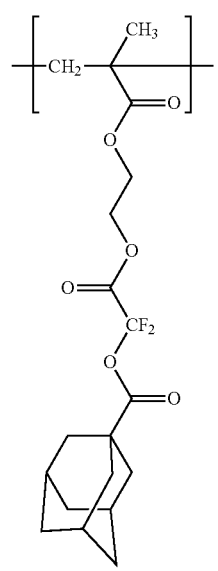
(a4-1'-20)
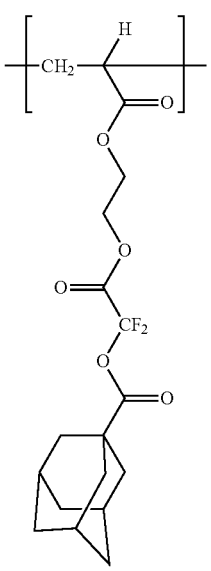
(a4-1'-21)
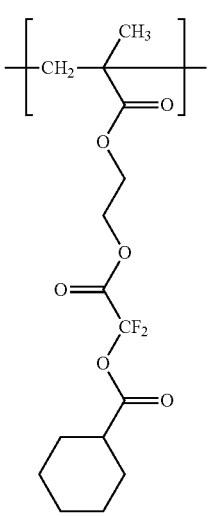

(a4-1'-22)
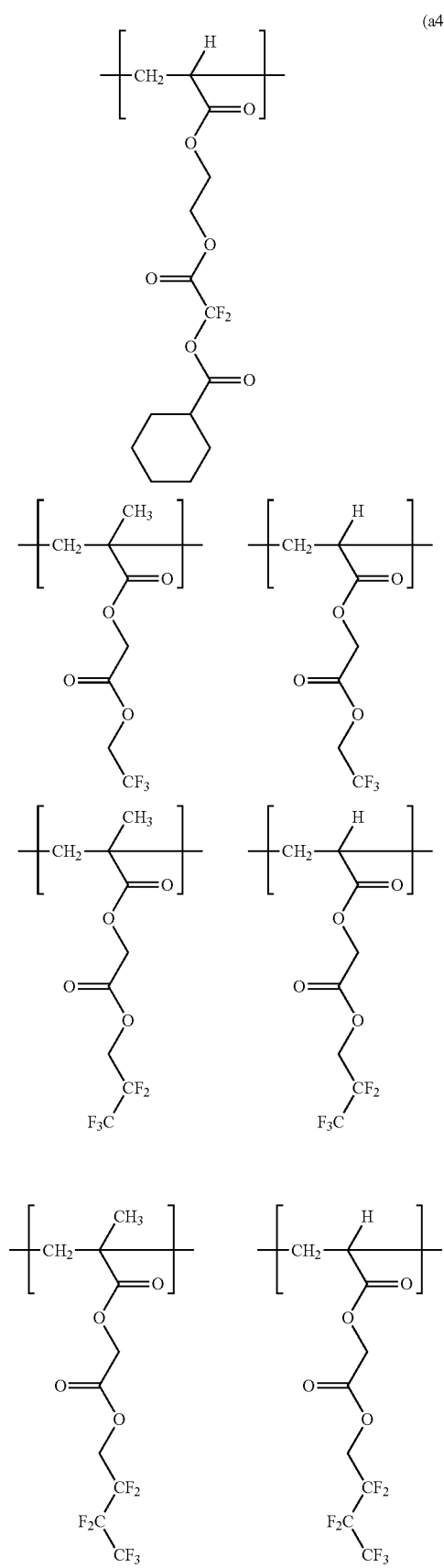
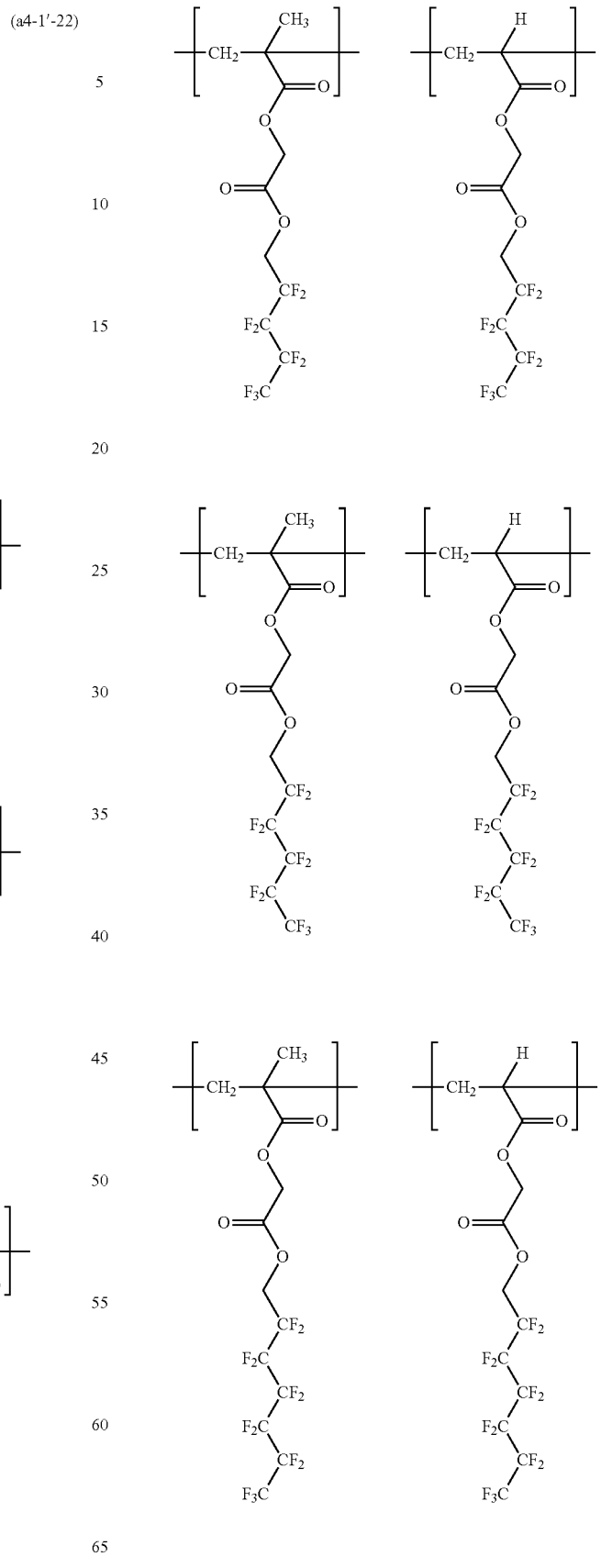

-continued

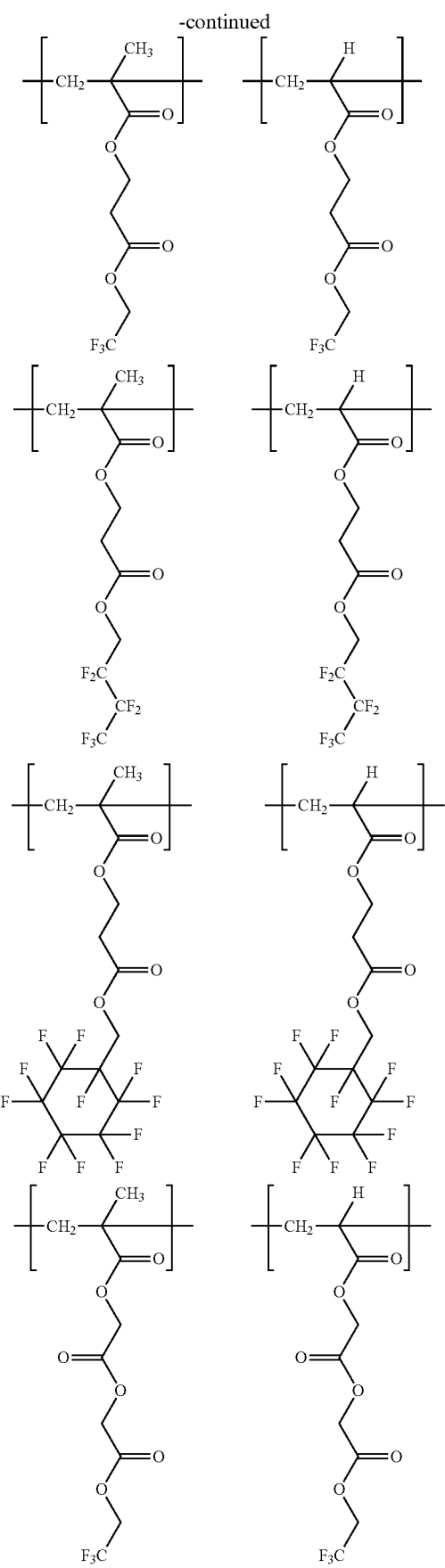
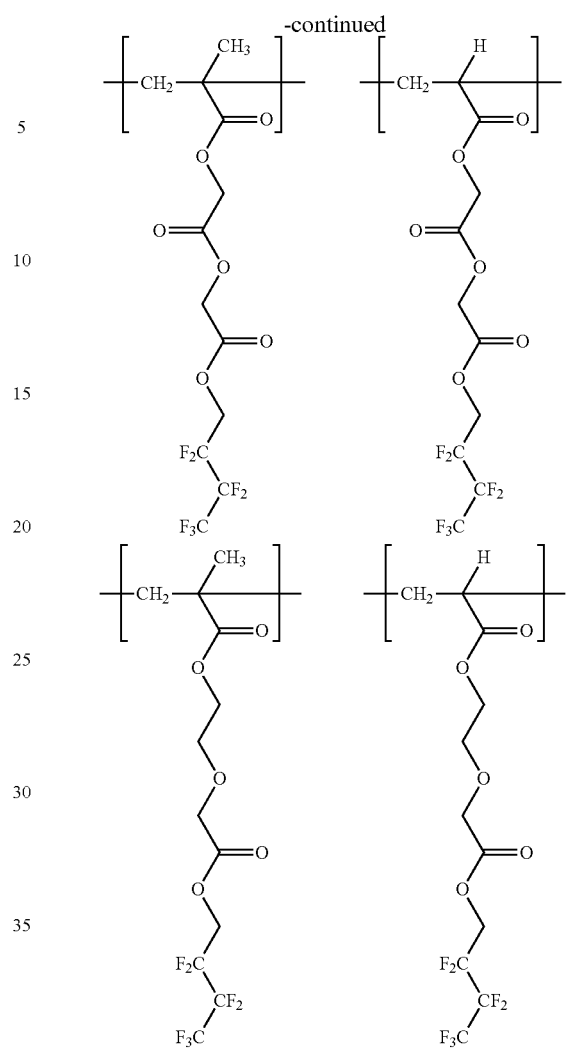

When the resin according to the present invention comprises the structural unit (a4), its content is preferably 1 to 20% by mole, more preferably 2 to 15% by mole and still more preferably 3 to 10% by mole based on 100% by mole of all the structural units of the resin.

The resin according to the present invention may comprise another structural unit than those as specifically mentioned above. Examples of such another structural unit include those as known in the art.

Other examples of the structural unit having no acid-labile group include one having an acid-stable hydrocarbon group.

Herein, the term "acid-stable hydrocarbon group" means such a hydrocarbon group that is not removed from the structural unit having the group by action of an acid generated from an acid generator as described later.

The acid-stable hydrocarbon group may be a linear, branched or cyclic hydrocarbon group.

The structural unit having an acid-stable hydrocarbon group preferably has an alicyclic hydrocarbon group.

Examples of the structural unit having an acid-stable hydrocarbon group include one represented by formula (a5).

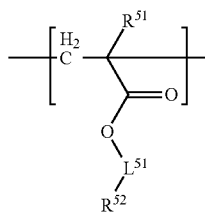

(a5)

where $R^{51}$ represents a hydrogen atom or a methyl group; $R^{52}$ represents a C3-C18 monovalent alicyclic hydrocarbon group which may have a C1-C8 monovalent aliphatic hydrocarbon group as a substituent, provided that the alicyclic hydrocarbon group has no substituent on the carbon atom bonded to $L^{51}$; and $L^{51}$ represents a single bond or a C1-018 divalent saturated hydrocarbon group where a methylene group can be replaced by an oxygen atom or carbonyl group.

The alicyclic hydrocarbon group represented by $R^2$ may be monocyclic or polycyclic one. Examples of the alicyclic hydrocarbon group include a monocyclic hydrocarbon group such as a C3-C18 cycloalkyl group (e.g. a cyclopropyl group, a cyclobutyl group, a cyclopentyl group, a cyclohexyl group) and a polycyclic alicyclic hydrocarbon group such as an adamantyl group, or a norbornyl group.

Examples of the aliphatic hydrocarbon group include an alkyl groups such as a methyl group, an ethyl group, n-propyl group, isopropyl group, n-butyl group, sec-butyl group, tert-butyl group, a pentyl group, a hexyl group, an octyl group and 2-ethylhexyl group.

Examples of the alicyclic hydrocarbon group having a substituent include a 3-hydroxyadamantyl group, and a 3-methyladamantyl group. $R^{52}$ is preferably a C3-C18 unsubstituted alicyclic hydrocarbon group, more preferably an adamantyl group, a norbornyl group or a cyclohexyl group.

Examples of the divalent saturated hydrocarbon group represented by $L^{51}$ include divalent aliphatic hydrocarbon groups and divalent alicyclic hydrocarbon groups, preferably divalent aliphatic hydrocarbon groups.

Examples of divalent aliphatic hydrocarbon groups include alkanediyl groups such as a methylene group, an ethylene group, a propanediyl group, a butanediyl group and a pentanediyl group.

The divalent alicyclic hydrocarbon groups may be monocyclic or polycyclic one.

Examples of divalent monocyclic hydrocarbon groups include cycloalkanediyl groups such as a cyclopentanediyl group and a cyclohexanediyl group. Examples of divalent polycyclic alicyclic hydrocarbon groups include an adamantanediyl group and a norbornanediyl group.

Examples of the divalent hydrocarbon group where a methylene group has been replaced by an oxygen atom or carbonyl group include those represented by formulae (L5-1) to (L5-4).

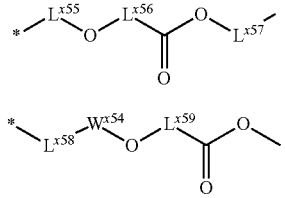

(L5-1)

(L5-2)

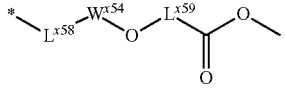

(L5-3)

(L5-4)

In these formulae, * represents a binding position to an oxygen atom.

$X^{x51}$ is a carbonyloxy group or an oxycarbonyl group; and $L^{x51}$ is a C1-C16 divalent saturated hydrocarbon group, and $L^{x52}$ is a single bond or a C1-C15 divalent aliphatic saturated hydrocarbon group, provided that the total number of the carbon atoms in $L^{x51}$ and $L^{x52}$ is 16 or less.

$L^{x53}$ is a C1-C17 divalent saturated hydrocarbon group, and $L^{x54}$ is a single bond or a C1-C16 divalent aliphatic saturated hydrocarbon group, provided that the total number of the carbon atoms in $L^{x53}$ and $L^{x54}$ is 17 or less.

$L^{x55}$ is a C1-C15 divalent saturated hydrocarbon group, and $L^{x56}$ and $L^{x57}$ is a single bond or a C1-C14 divalent aliphatic saturated hydrocarbon group, provided that the total number of the carbon atoms in $L^{x55}$, $L^{x56}$ and $L^{x57}$ is 15 or less.

$L^{x58}$ and $L^{x59}$ are each independently a single bond or a C1-C12 divalent aliphatic saturated hydrocarbon group, and $W^{x51}$ is a C3-C15 divalent cyclic saturated hydrocarbon group, provided that the total number of the carbon atoms in $L^{x58}$, $L^{x59}$ and $W^{x51}$ is 15 or less.

$L^{x51}$ is preferably a C1-C8 divalent saturated hydrocarbon group, more preferably a methylene group or an ethylene group.

$L^{x52}$ is preferably a single bond, or a C1-C8 divalent saturated hydrocarbon group, more preferably a single bond.

$L^{x53}$ is preferably a C1-C8 divalent saturated hydrocarbon group, more preferably a methylene group or an ethylene group.

$L^{x54}$ is preferably a single bond or a C1-C8 divalent saturated hydrocarbon group, more preferably a single bond, a methylene group or an ethylene group.

$L^{x55}$ is preferably a C1-C8 divalent saturated hydrocarbon group, more preferably a methylene group or an ethylene group.

$L^{x56}$ is preferably a single bond or a C1-C8 divalent saturated hydrocarbon group, more preferably a methylene group or an ethylene group.

$L^{x57}$ is preferably a single bond or a C1-C8 divalent saturated hydrocarbon group, more preferably a methylene group or an ethylene group.

$L^{x58}$ is preferably a single bond or a C1-C8 divalent saturated hydrocarbon group, more preferably a single bond or a methylene group.

$L^{x59}$ is preferably a single bond or a C1-C8 divalent saturated hydrocarbon group, more preferably a single bond or a methylene group.

$W^{x51}$ is a preferably C3-C10 divalent cyclic saturated hydrocarbon group, more preferably a cyclohexanediyl group or an adamantanediyl group.

Examples of the divalent hydrocarbon group represented by formula (L5-1) include the following ones.

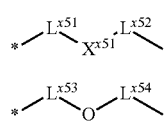

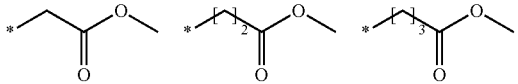

-continued

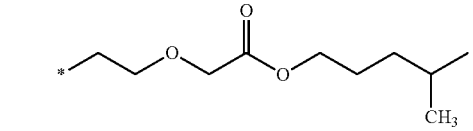

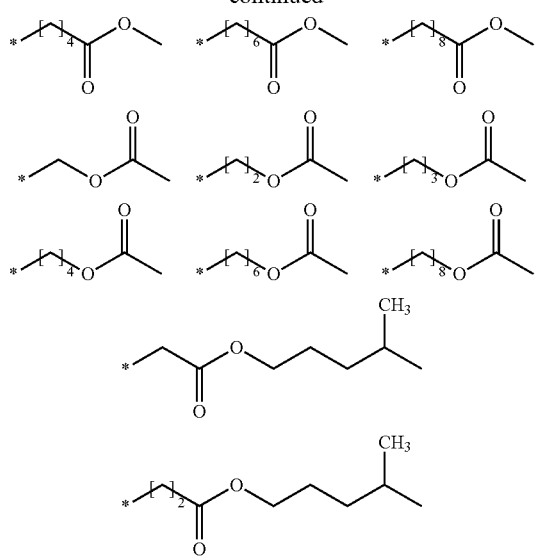

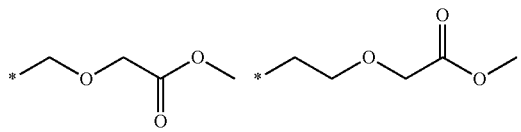

In these formulae, * represents a binding position to an oxygen atom.

Examples of the divalent hydrocarbon group represented by formula (L5-4) include the following ones.

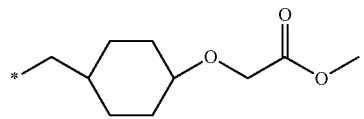

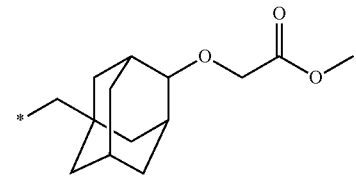

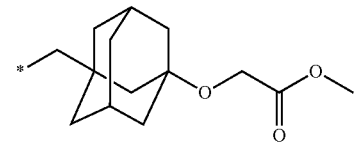

In these formulae, * represents a binding position to an oxygen atom.

Examples of the divalent hydrocarbon group represented by formula (L5-2) include the following ones.

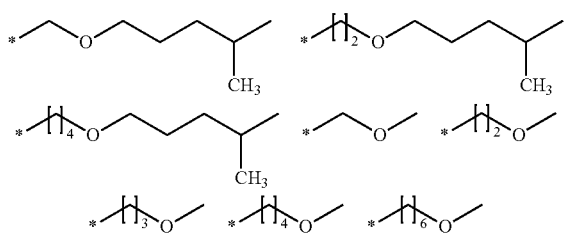

In these formulae, * represents a binding position to an oxygen atom.

Examples of the divalent hydrocarbon group represented by formula (L5-3) include the following ones.

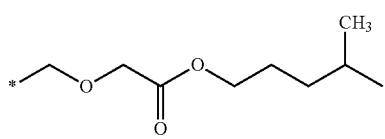

In these formulae, * represents a binding position to an oxygen atom.

$L^{51}$ is preferably a single bond, a methylene group, an ethylene group or a group represented by formula (L5-1).

Examples of the structural unit represented by formula (a5) include the following ones and those where a methyl group has been replaced by a hydrogen atom in each formula.

(a5-1-1) 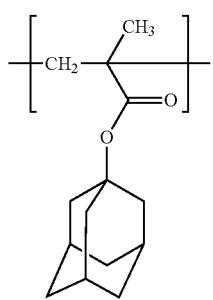
(a5-1-2) 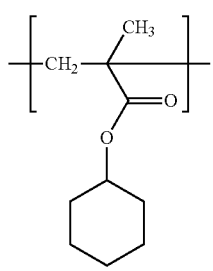
(a5-1-3) 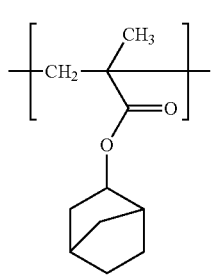
(a5-1-4) 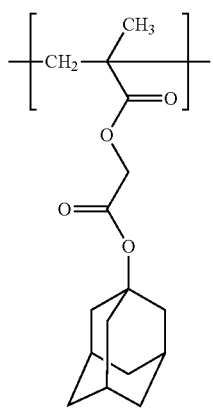
(a5-1-5) 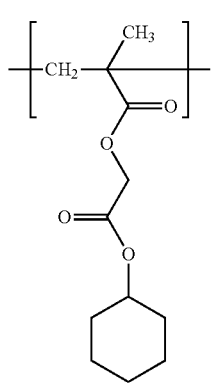
-continued
(a5-1-6) 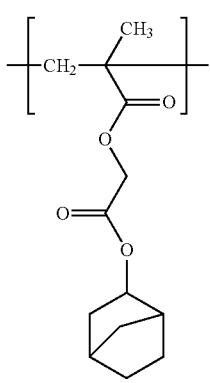
(a5-1-7) 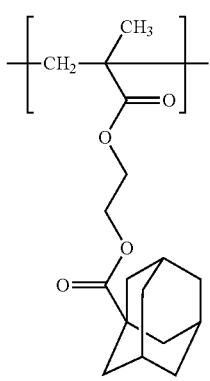
(a5-1-8) 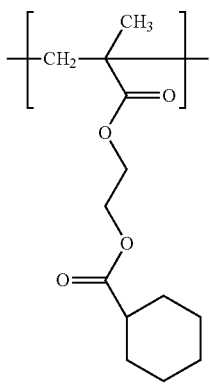
(a5-1-9) 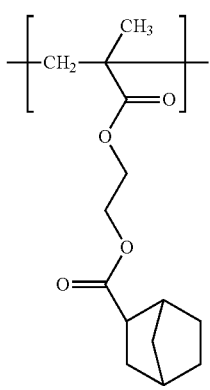

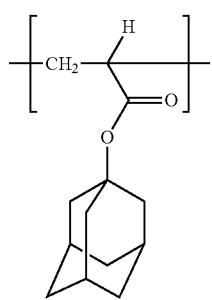 (a5-1-10)
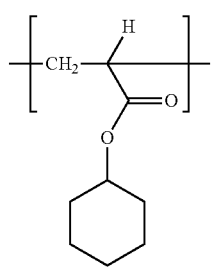 (a5-1-11)
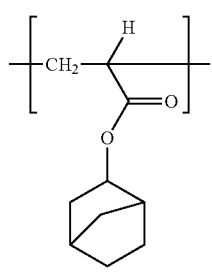 (a5-1-12)
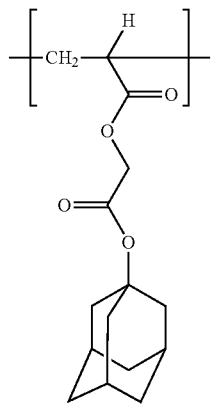 (a5-1-13)
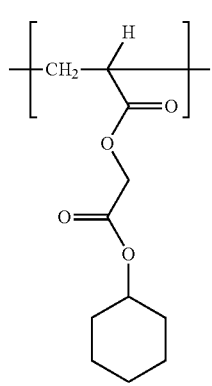 (a5-1-14)
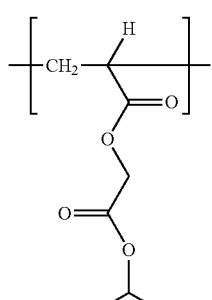 (a5-1-15)
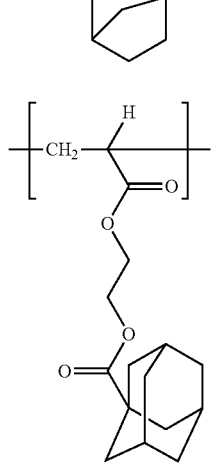 (a5-1-16)
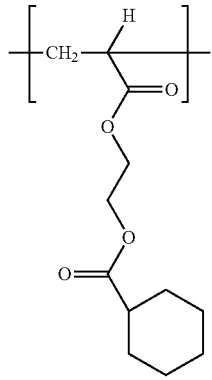 (a5-1-17)
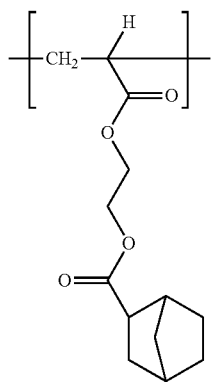 (a5-1-18)

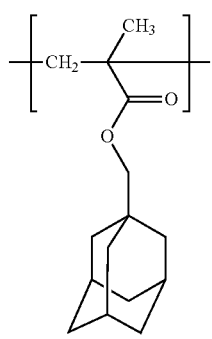 (a5-1-19)
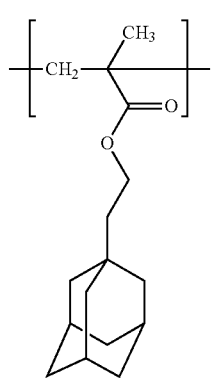 (a5-1-20)
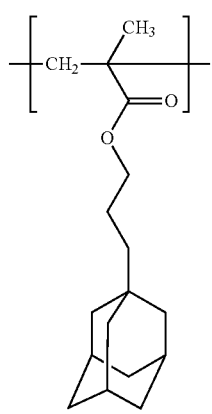 (a5-1-21)
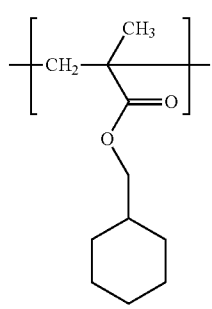 (a5-1-22)
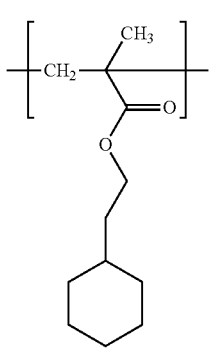 (a5-1-23)
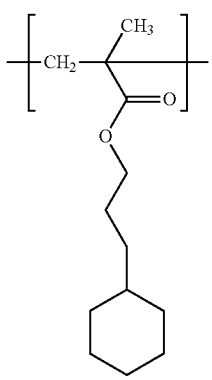 (a5-1-24)
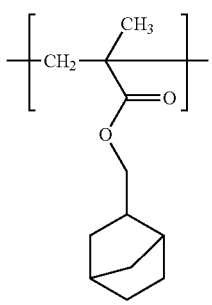 (a5-1-25)
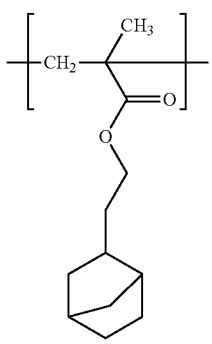 (a5-1-26)

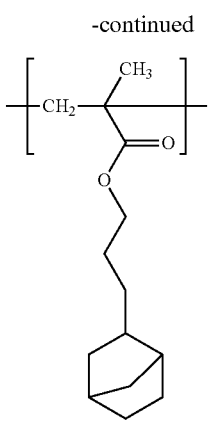

(a5-1-27)

The resin according to the present invention preferably comprises the structural unit (I), the structural unit (a1), and the structural unit (s).

In the resin, preferably the structural unit (a1) is one of the structural unit (a1-1) and the structural unit (a1-2). More preferably, the resin comprises the structural unit (a1-1) and the structural unit (a1-2). The structural unit (a1-2) is preferably one which having a cyclohexyl group or a cyclopentyl group.

The structural unit having no acid-labile group is preferably structural unit (a2) and a structural unit (a3). The structural unit (a2) is preferably a structural unit (a2-1). The structural unit (a3) is one of a structural unit (a3-1), a structural unit (a3-2) and a structural unit (a3-4).

The resin according to the present invention can be produced by polymerizing the compound of formula (I'), the monomer (a1) and another monomer according to known polymerization methods such as radical polymerization. The content of each structural unit can be controlled by adjusting the amount of the monomers to be used.

The resin of the present invention has usually 2,000 or more of the weight-average molecular weight, preferably 2,500 or more of the weight-average molecular weight, more preferably 3,000 or more of the weight-average molecular weight. The resin has usually 50,000 or less of the weight-average molecular weight, preferably has 30,000 or less of the weight-average molecular weight, more preferably has 15,000 or less of the weight-average molecular weight.

The weight-average molecular weight can be measured with known methods such as liquid chromatography, gas chromatography or gel permeation chromatography.

<Photoresist Composition>

The photoresist composition of the present invention comprises the resin according to the present invention and an acid generator. The photoresist composition of the present invention may further comprise another resin than the resin, a quencher, or a solvent.

Examples of another resin than the resin include what consist of the structural unit (s) and what comprises a structural unit (a4), not a structural unit (I). The resin which comprises a structural unit (a4) is sometimes referred to as "resin (X)". In the resin (X), the content of the structural unit (a4) is preferably 40% by mole, more preferably 45% by mole, still more preferably 50% by mole, and further still more preferably 80% by mole, based on 100% by mole of all the structural units of the resin.

The resin (X) may further comprise the structural unit (a2) and the structural unit (a3), and other known structural units except for the structural units (a1) and (I).

The resin (X) usually has 8000 or more of the weight-average molecular weight, preferably 10000 or more of the weight-average molecular weight. The resin usually has 80,000 or less of the weight-average molecular weight, preferably has 60,000 or less of the weight-average molecular weight. The weight-average molecular weight can be measured with known methods such as liquid chromatography or gas chromatography.

When the photoresist composition comprises the resin (X), the content of the resin is preferably 1 to 60 weight parts, more preferably 3 to 50 weight parts, and still more preferably 5 to 40 weight parts, and further more preferably 7 to 30 weight parts, relative to 100 weight parts of Resin (A).

The photoresist composition of the present invention usually comprises 80% by weight or more of the resin according to the present invention based on sum of solid components. The photoresist composition of the present invention usually comprises 99% by weight or less of the resin, based on sum of solid component.

In this specification, "solid components" mean components other than solvent in the photoresist composition. The content of solid components and the content of Resin (A) can be measured with known methods such as liquid chromatography, or gas chromatography.

The photoresist composition of the present invention usually comprises 80% by weight or more of the resins in total based on sum of solid components. The photoresist composition of the present invention usually includes 99% by weight or less of the resins in total based on sum of solid component.

The acid generator may be ionic compounds or nonionic compounds.

The nonionic compounds for the acid generator include organic halogenated compounds; sulfonate esters, e.g. 2-nitrobenzylester, aromatic sulfonates, oximesulfonate, N-sulfonyloxyimide, sulfonyloxyketone, and diazonaphtoquione 4-sulfonate; sulfones, e.g., disulfone, ketosulfone, and sulfonium diazomethane. The ionic compounds for the acid generator include onium salts having an onium cation, e.g., diazonium salts, phosphonium salts, sulfonium salts and iodonium salts. Anions of onium salt include a sulfonic acid anion, a sulfonylimide anion, sulfonylmethide anion.

Examples of the sulfonylimide anion include the following ones.

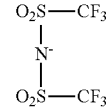

(I-b-1)

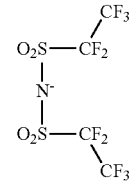

(I-b-2)

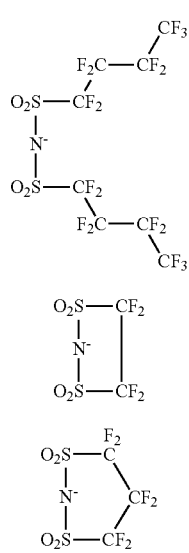

(I-b-3)

(I-b-4)

(I-b-5)

The photoresist composition may have one or more acid generators.

As the acid generator, the compounds giving an acid by radiation can be used, which are mentioned in JP63-26653A1, JP55-164824A1, JP62-69263A1, JP63-146038A1, JP63-163452A1, JP62-153853A1, JP63-146029A1, U.S. Pat. No. 3,779,778B1, U.S. Pat. No. 3,849,137B1, DE3914407 and EP126,712A1. The acid generator for the photoresist composition can be produced by the method described in the above-mentioned documents.

The acid generator is preferably a fluorine-containing compound, more preferably salt represented by formula (B1)

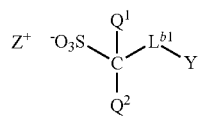

(B1)

wherein $Q^1$ and $Q^2$ respectively represent a fluorine atom or a C1-C6 perfluoroalkyl group, $L^{b1}$ represents a single bond or a C1-C24 saturated hydrocarbon group in which a methylene group may be replaced by —O— or —CO— and in which a hydrogen atom may be replaced by a hydroxyl group or a fluorine atom, Y represents a methyl group or a C3-C18 alicyclic hydrocarbon group where a hydrogen atom can be replaced by a substituent and where a methylene may be replaced by —O—, —SO$_2$— or —CO—, and $Z^+$ represents an organic cation.

Examples of the C1-C6 perfluoroalkyl group represented by $Q^1$ and $Q^2$ include a trifluoromethyl group, a pentafluoroethyl group, a heptafluoropropyl group, a nonafluorobutyl group, an undecafluoropentyl group and a tridecafluorohexyl group. It is preferred that $Q^1$ and $Q^2$ independently each represent a fluorine atom or a trifluoromethyl group, and it is more preferred that $Q^1$ and $Q^2$ are fluorine atoms.

The divalent saturated hydrocarbon group represented by $L^{b1}$ includes linear chain alkanediyl groups, branched chain alkanediyl groups, monocyclic or polycyclic divalent saturated hydrocarbon groups, and a group combining two or more of the above-mentioned groups.

Examples of $L^{b1}$ include linear chain alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group, an ethane-1,1-diyl group, a propane-1,1-diyl group, a propane-2,2-diyl group; branched chain groups such as an ethane-1,1-diyl group, a propane-1,1-diyl group, propane-1,2-diyl group, propane-2,2-diyl group, a pentane-2,4-diyl group, a 1-methylpropane-1,3-diyl group, a 2-methylpropane-1,2-diyl group, a pentane-1,4-diyl group, and a 2-methylbutane-1,4-diyl group;

divalent alicyclic hydrocarbon groups including a cyclobutane-1,3-diyl group, a cyclopentane-1,3-diyl group, a cyclohexane-1,4-diyl group and a cyclooctane-1,5-diyl group; and a polycyclic divalent alicyclic hydrocarbon groups such as a nobornane-1,4-diyl group, a nobornane-1,5-diyl group, an amadantane-1,5-diyl group, or an amadantane-2,6-diyl group.

Examples of the divalent saturated hydrocarbon group in which a methylene group has been replaced by an oxygen atom or a carbonyl group include groups represented by the formulae (b1-1), (b1-2) and (b1-3), as follow.

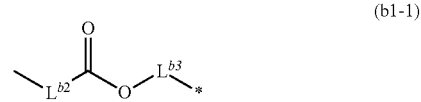

(b1-1)

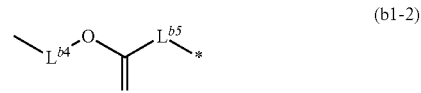

(b1-2)

(b1-3)

In formula (b1-1), $L^{b2}$ represents a single bond or a C1-C22 divalent saturated hydrocarbon group where a hydrogen atom may be replaced by a fluorine atom, and $L^{b3}$ represents a single bond or a C1-C22 divalent saturated hydrocarbon group where a hydrogen atom may be replaced by a hydroxyl group or a fluorine atom and where a methylene group may be replaced by an oxygen atom or carbonyl group, provided that total number of the carbon atoms of $L^{b2}$ and $L^{b3}$ is up to 22.

In formula (b1-2), $L^{b4}$ represents a C1-C22 divalent saturated hydrocarbon group where a hydrogen atom may be replaced by a fluorine atom, and $L^{b5}$ represents a single bond or a C1-C22 divalent saturated hydrocarbon group where a hydrogen atom may be replaced by a hydroxyl group or a fluorine atom and where a methylene group may be replaced by an oxygen atom or carbonyl group, provided that the total carbon atoms of $L^{b4}$ and $L^{b5}$ is up to 22.

In formula (b1-3), $L^{b6}$ represents a single bond or a C1-C23 divalent saturated hydrocarbon group where a hydrogen atom may be replaced by a fluorine atom, and $L^{b7}$ represents a single bond or a C1-C22 divalent saturated hydrocarbon group where a hydrogen atom may be replaced by a hydroxyl group or a fluorine atom and where a methylene group may be replaced by an oxygen atom or carbonyl group, with the proviso that total carbon number of $L^{b6}$ and $L^{b7}$ is up to 23 and with the proviso that formula (b1-3) excludes group having a structure represented by $-L^{b6}-O-CO-$.

In these formulae, * represents a binding position, * of the left side represents a binding position to $-C(Q^1)(Q^2)-$, and * of the right side represents a binding position to Y.

In formulae (b1-1), (b1-2) and (b1-3), the divalent saturated hydrocarbon group includes linear chain alkanediyl groups, branched chain alkanediyl groups, monocyclic or polycyclic divalent saturated hydrocarbon groups, and a group combining two or more of the above-mentioned groups.

Specific examples of the divalent saturated hydrocarbon group include those as referred to for $L^{b1}$.

$L^{b2}$ is preferably a single bond.

$L^{b3}$ is preferably a C1-C4 alkanediyl group.

$L^{b4}$ is preferably a C1-C8 divalent saturated hydrocarbon group where a hydrogen atom may be replaced by a fluorine atom.

$L^{b5}$ is preferably a single bond or a C1-C8 divalent saturated hydrocarbon group.

$L^{b6}$ is preferably a single bond or a C1-C4 divalent saturated hydrocarbon group where a hydrogen atom may be replaced by a fluorine atom.

$L^{b7}$ is preferably a single bond or a C1-C7 divalent saturated hydrocarbon group where a hydrogen atom may be replaced by a hydroxyl group or a fluorine atom and where a methylene group may be replaced by an oxygen atom or carbonyl group.

Among them, those of formulae (b1-1) and (b1-3) are preferred.

Examples of the group represented by formula (b1-1) include those represented by formulae (b1-4), (b1-5), (b1-6), (b1-7) and (b1-8).

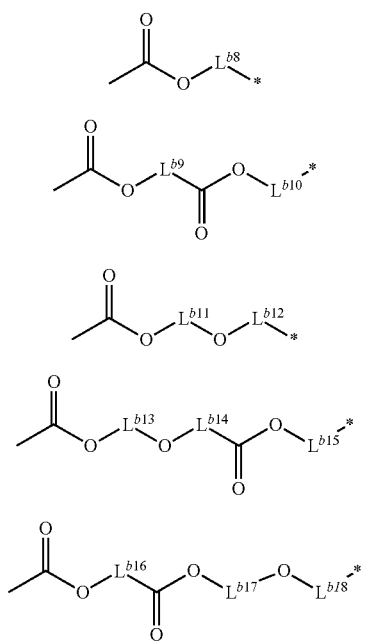

In formula (b1-4), $L^{b8}$ represents a single bond or a C1-C22 divalent saturated hydrocarbon group where a hydrogen atom may be replaced by a fluorine atom or a hydroxyl group.

In formula (b1-5), $L^{b9}$ represents a C1-C20 divalent saturated hydrocarbon group, and $L^{b10}$ represents a single bond or a C1-C19 divalent saturated hydrocarbon group where a hydrogen atom may be replaced by a hydroxyl group or a fluorine atom, provided that the total carbon atoms of $L^{b10}$ and $L^{b9}$ is up to 20.

In formula (b1-6), $L^{b11}$ represents a C1-C21 divalent saturated hydrocarbon group, and $L^{b12}$ represents a single bond or a C1-C20 divalent saturated hydrocarbon group where a hydrogen atom may be replaced by a hydroxyl group or a fluorine atom, with the proviso that total carbon number of $L^{b11}$ and $L^{b12}$ is up to 21.

In formula (b1-7), $L^{b13}$ represents a C1-C19 divalent saturated hydrocarbon group, $L^{b14}$ represents a single bond or a C1-C18 divalent saturated hydrocarbon group, and $L^{b15}$ represents a single bond or a C1-C18 divalent saturated hydrocarbon group where a hydrogen atom may be replaced by a hydroxyl group or a fluorine atom, with the proviso that total carbon number of $L^{b13}$, $L^{b14}$ and $L^{b15}$ is up to 19.

In formula (b1-8), $L^{b16}$ represents a C1-C18 divalent saturated hydrocarbon group, $L^{b17}$ represents a C1-C18 divalent saturated hydrocarbon group, and $L^{b18}$ represents a single bond or a C1-C17 divalent saturated hydrocarbon group where a hydrogen atom may be replaced by a hydroxyl group or a fluorine atom, with the proviso that total carbon number of $L^{b16}$, $L^{b17}$ and $L^{b18}$ is up to 19.

In these formulae, * represents a binding position, * of the left side represents a binding position to $-C(Q^1)(Q^2)-$, and * of the right side represents a binding position to Y.

In these formulae, the divalent saturated hydrocarbon group includes linear chain alkanediyl groups, branched chain alkanediyl groups, monocyclic or polycyclic divalent saturated hydrocarbon groups, and a group combining two or more of the above-mentioned groups. Specific examples of the divalent saturated hydrocarbon group include those as referred to for $L^{b1}$.

$L^{b8}$ is preferably a C1-C4 alkanediyl group.

$L^{b9}$ is preferably a C1-C8 divalent saturated hydrocarbon group.

$L^{b10}$ is preferably a single bond or a C1-C19 divalent saturated hydrocarbon group, and more preferably a single bond or a C1-C8 divalent saturated hydrocarbon group.

$L^{b11}$ is preferably a C1-C8 divalent saturated hydrocarbon group.

$L^{b12}$ is preferably a single bond or a C1-C8 divalent saturated hydrocarbon group.

$L^{b13}$ is preferably a C1-C12 divalent saturated hydrocarbon group.

$L^{b14}$ is preferably a single bond or a C1-C6 divalent saturated hydrocarbon group.

$L^{b15}$ is preferably a single bond or a C1-C18 divalent saturated hydrocarbon group, and more preferably a single bond or a C1-C8 divalent saturated hydrocarbon group.

$L^{b16}$ is preferably a C1-C12 divalent saturated hydrocarbon group.

$L^{b17}$ is preferably a C1-C6 divalent saturated hydrocarbon group.

$L^{b18}$ is preferably a single bond or a C1-C17 divalent saturated hydrocarbon group, and more preferably a single bond or a C1-C4 divalent saturated hydrocarbon group.

Examples of the group represented by formula (b1-3) include those represented by formulae (b1-9), (b1-10) and (b1-11).

-continued (b1-10)
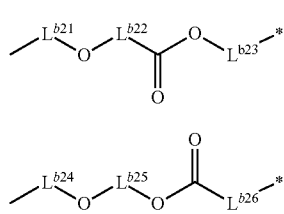

(b1-11)

Examples of the group represented by formula (b1-4) include the following ones.

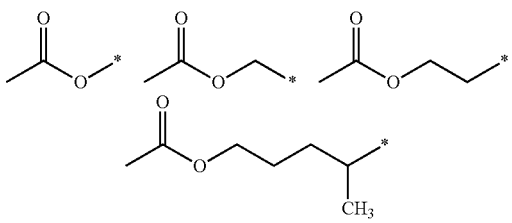

In formula (b1-9), $L^{b19}$ represents a single bond or a C1-C23 divalent saturated hydrocarbon group where a hydrogen atom may be replaced by a fluorine atom, and $L^{b20}$ represents a single bond or a C1-C23 divalent saturated hydrocarbon group where a hydrogen atom may be replaced by a hydroxyl group or a fluorine atom and where a methylene group may be replaced by an oxygen atom or carbonyl group, provided that the total carbon atoms of $L^{b19}$ and $L^{b20}$ is up to 23. In formula (b1-10), $L^{b21}$ represents a single bond or a C1-C21 divalent saturated hydrocarbon group where a hydrogen atom may be replaced by a fluorine atom, $L^{b22}$ represents a single bond or a C1-C21 divalent saturated hydrocarbon group and $L^{b23}$ represents a single bond or a C1-C21 divalent saturated hydrocarbon group where a hydrogen atom may be replaced by a hydroxyl group or a fluorine atom and where a methylene group may be replaced by an oxygen atom or a carbonyl group, provided that the total carbon atoms of $L^{b21}$, $L^{b22}$ and $L^{b23}$ is up to 21.

In formula (b1-11), $L^{b24}$ represents a single bond or a C1-C21 divalent saturated hydrocarbon group where a hydrogen atom may be replaced by a fluorine atom, $L^{b25}$ represents a single bond or a C1-C21 divalent saturated hydrocarbon group, and $L^{b26}$ represents a single bond or a C1-C20 divalent saturated hydrocarbon group where a hydrogen atom may be replaced by a hydroxyl group or a fluorine atom and where a methylene group may be replaced by an oxygen atom or a carbonyl group, provided that the total carbon atoms of $L^{b25}$, $L^{b26}$ and $L^{b27}$ is up to 21.

In these formulae, * represents a binding position, * of the left side represents a binding position to —C($Q^1$)($Q^2$)-, and * of the right side represents a binding position to Y.

In these formulae, the divalent saturated hydrocarbon group includes linear chain alkanediyl groups, branched chain alkanediyl groups, monocyclic or polycyclic divalent saturated hydrocarbon groups, and a group combining two or more of the above-mentioned groups. Specific examples of the divalent saturated hydrocarbon group include those as referred to for $L^{b1}$.

Examples of the divalent saturated hydrocarbon group where a methylene group has been replaced by an oxygen atom or a carbonyl group include those having an acyloxy group where a hydrogen atom may be replaced by a hydroxyl group and where a methylene group may be replaced by an oxygen atom or a carbonyl group.

Examples of acyloxy group include an acetyloxy group, a propyonyloxy group, a butyryloxy group, a cyclohexylcarbonyloxy group and an adamantylcarbonyloxy group.

Examples of acyloxy group where a hydrogen atom has been replaced by a hydroxyl group or where a methylene group has been replaced by an oxygen atom or a carbonyl group include an oxoadamantylcarbonyloxy group, a hydroxyadamantylcarbonyloxy group, an oxocyclohexylcarbonyloxy group, and a hydroxycyclohexylcarbonyloxy group.

In each formula, * represents a binding position to Y.

Examples of the group represented by formula (b1-5) include the following ones.

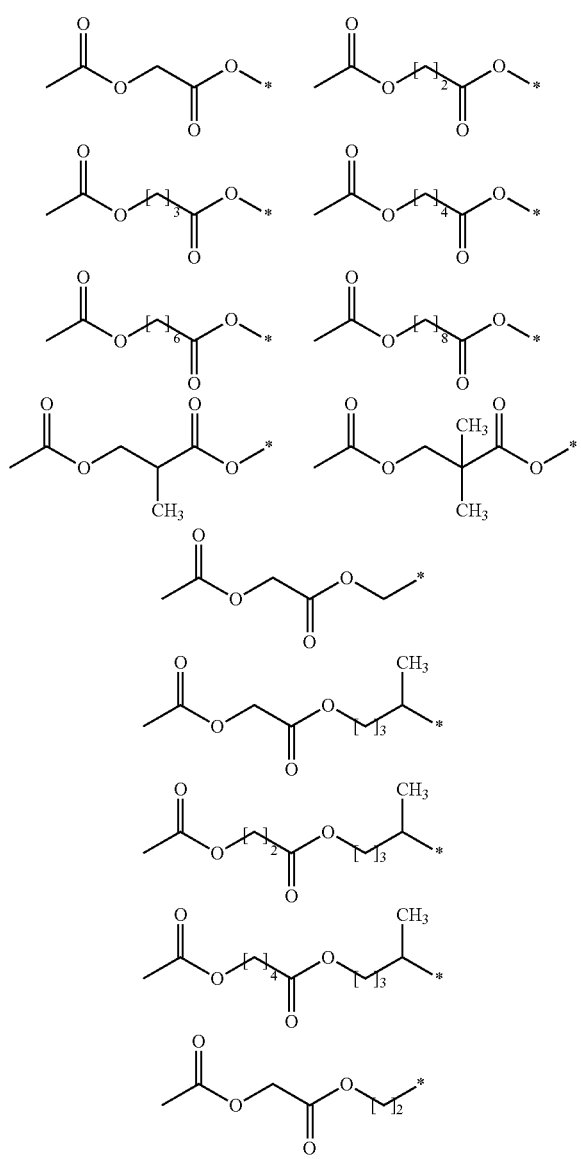

In each formula, * represents a binding position to Y.

Examples of the group represented by formula (b1-6) include the following ones.

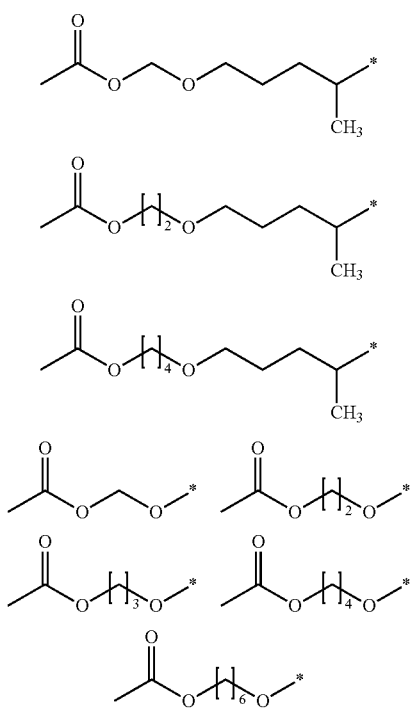

In each formula, * represents a binding position to Y.

Examples of the group represented by formula (b1-7) include the following ones.

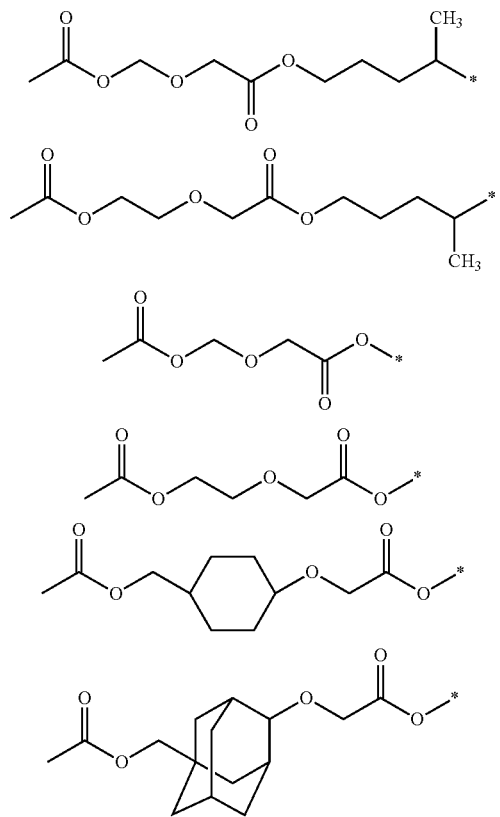

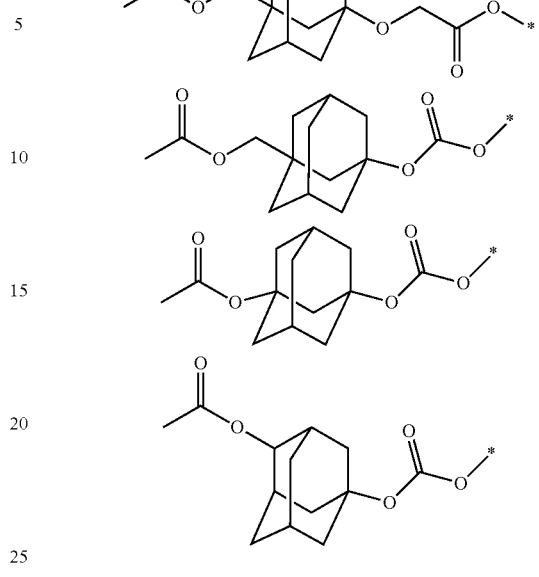

In each formula, * represents a binding position to Y.

Examples of the group represented by formula (b1-8) include the following ones.

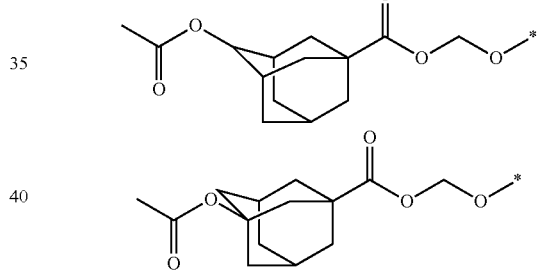

In each formula, * represents a binding position to Y.

Examples of the group represented by formula (b1-2) include the following ones.

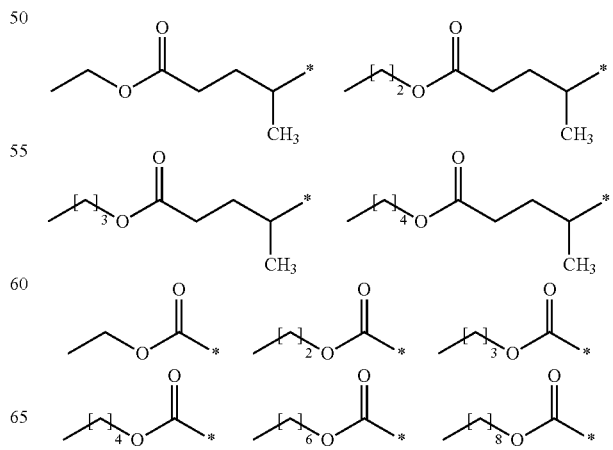

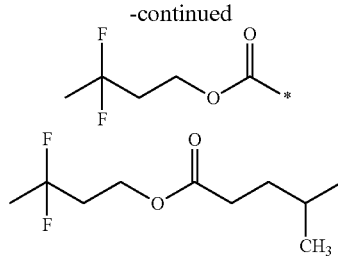
In each formula, * represents a binding position to Y.
Examples of the group represented by formula (b1-9) include the following ones.
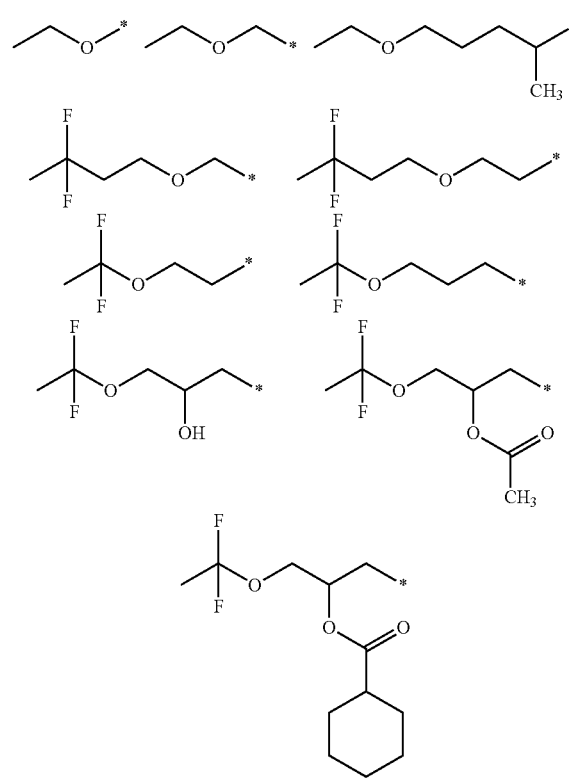
Examples of the group represented by formula (b1-10) include the following ones.
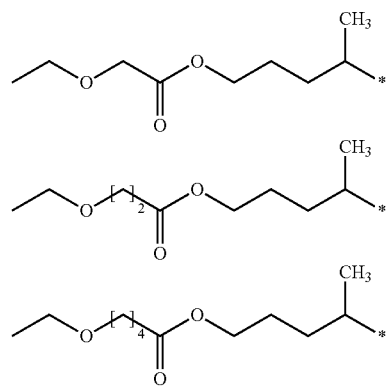
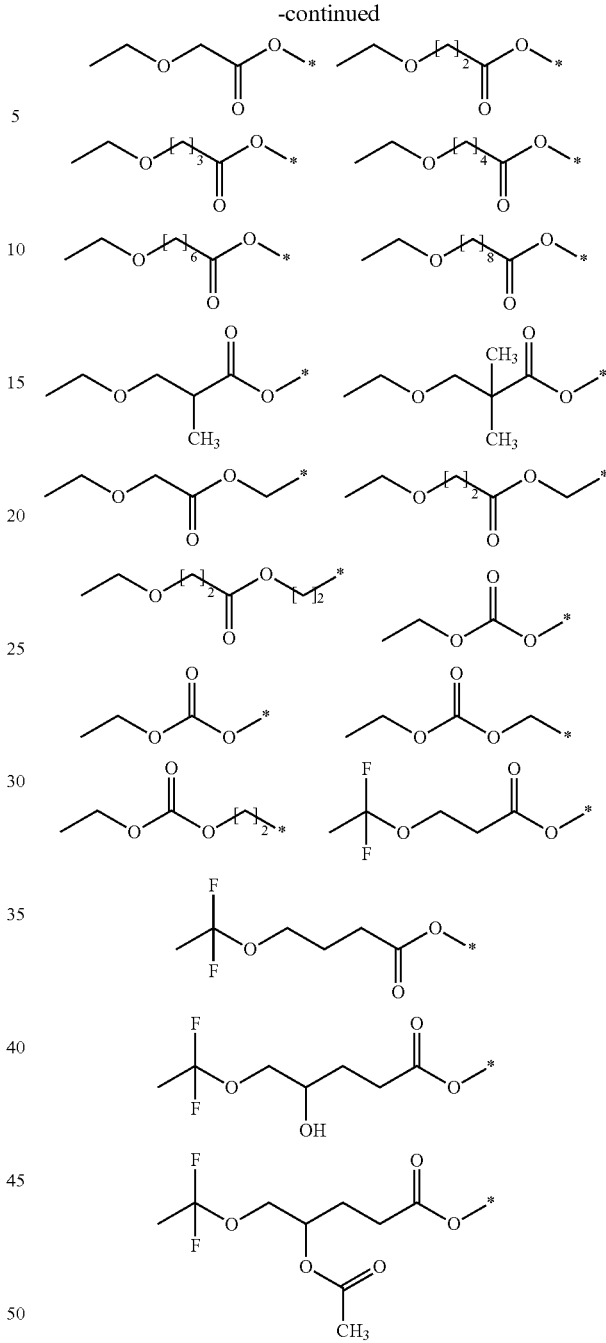
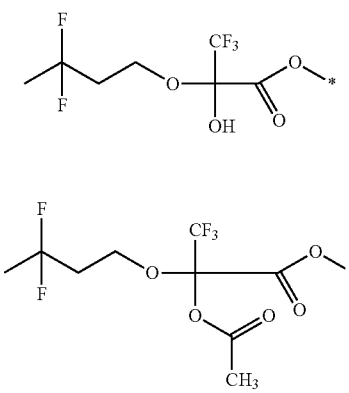

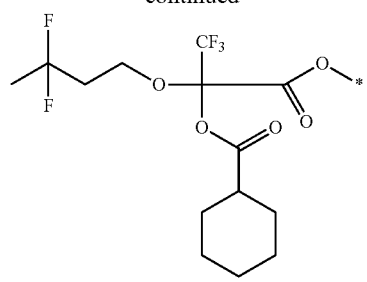
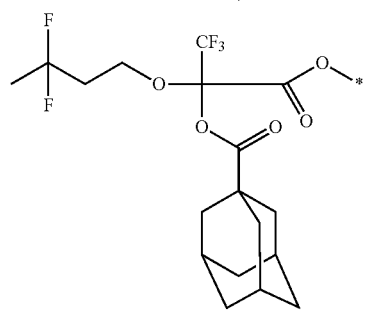
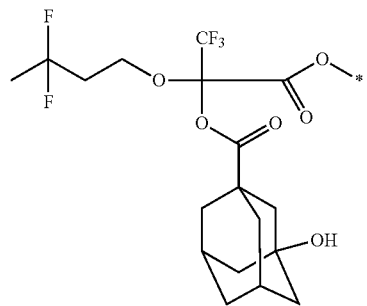
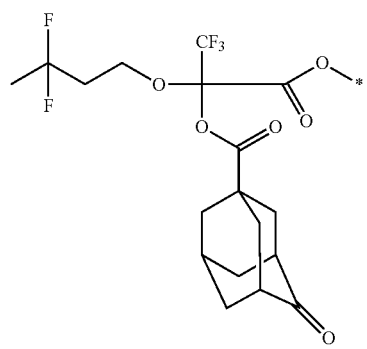
In each formula, * represents a binding position to Y.
Examples of the group represented by formula (b1-11) include the following ones.
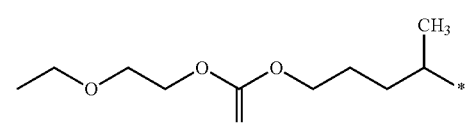
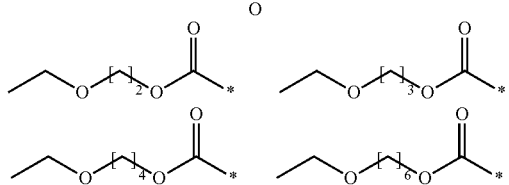
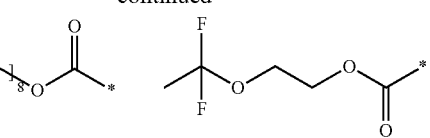
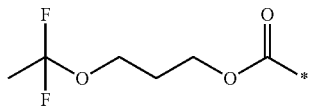
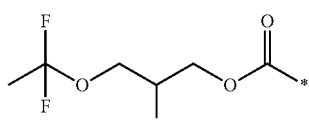
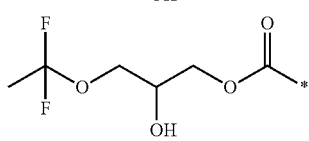
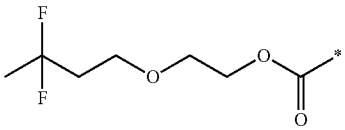
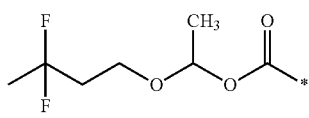
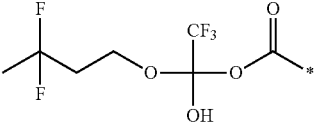
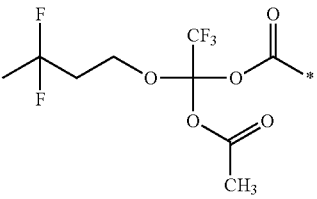
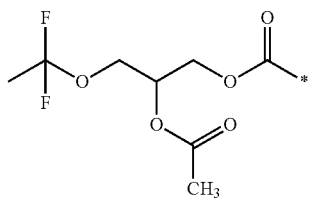
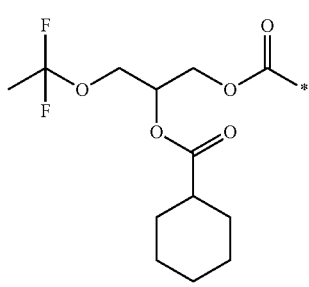

-continued

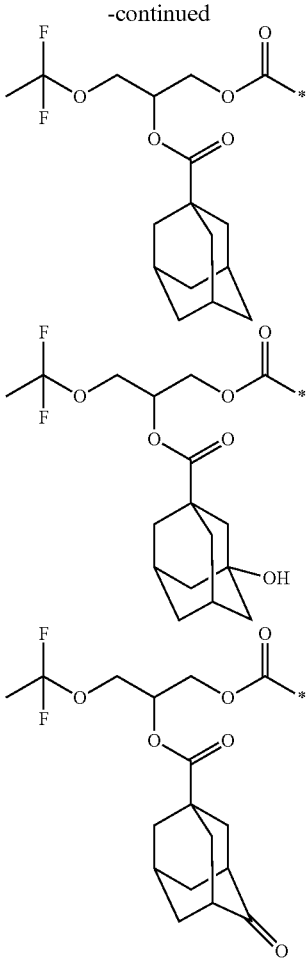

In each formula, * represents a binding position to Y.

Preferred examples of the alicyclic hydrocarbon group represented by Y include those represented by the formula (Y1), the formula (Y2), the formula (Y3), the formula (Y4), the formula (Y5), the formula (Y6), the formula (Y7), the formula (Y8), the formula (Y9), the formula (Y10) and the formula (Y11).

When a methylene group has been replaced by an oxygen atom, a sulfonyl group or a carbonyl group in the alkyl or alicyclic hydrocarbon group represented by Y, preferred examples of Y include those represented by the formula (Y12), the formula (Y13), the formula (Y14), the formula (Y15), the formula (Y16), the formula (Y17), the formula (Y18), the formula (Y19), the formula (Y20), the formula (Y21), the formula (Y22), the formula (Y23), the formula (Y24), the formula (Y25), the formula (Y26) and the formula (Y27).

 (Y1)

 (Y2)

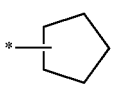 (Y3)

-continued

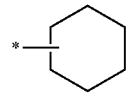 (Y4)

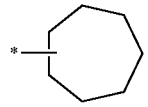 (Y5)

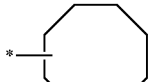 (Y6)

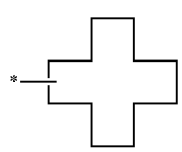 (Y7)

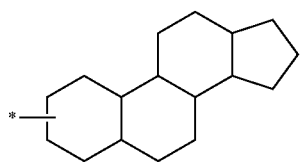 (Y8)

 (Y9)

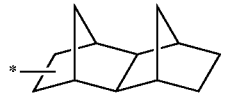 (Y10)

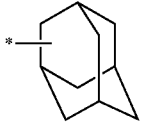 (Y11)

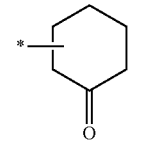 (Y12)

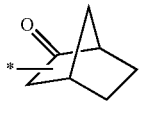 (Y13)

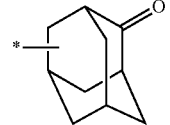 (Y14)

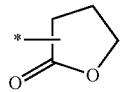 (Y15)

(Y16) 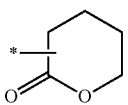

(Y17) 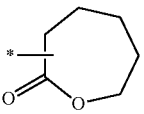

(Y18) 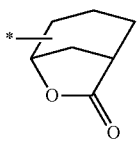

(Y19) 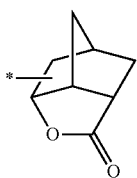

(Y20) 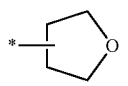

(Y21) 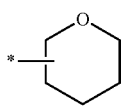

(Y22) 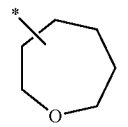

(Y23) 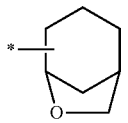

(Y24) 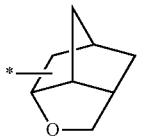

(Y25) 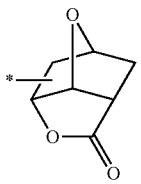

(Y26) 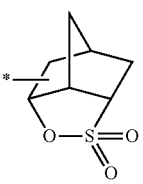

(Y27) 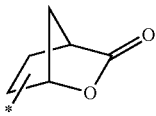

Among the groups represented by the formula (Y1) to the formula (Y26), preferred are those represented by formulae (Y1) to (Y19); more preferred are those represented by the formulae (Y11), (Y14), (Y15) and (Y19); and still more preferred are those represented by the formulae (Y11) and (Y14).

Substituents of the alkyl groups represented by Y include a halogen atom, a hydroxyl group, a C1-C12 alkoxy group, a C3-C16 alicyclic hydrocarbon group, a C6-C18 aromatic hydrocarbon group, a C7-C21 aralkyl group, a C2-C4 acyl group, a glycidyloxy group, and —(CH$_2$)$_{j2}$—O—CO— in which R$^{b1}$ represents an C1-C16 alkyl group, a C3-C16 alicyclic hydrocarbon group, or a C6-C18 aromatic hydrocarbon group, and j2 represents an integer of 0 to 4. Each of the alkyl group, the alicyclic hydrocarbon group, the aromatic hydrocarbon group and the aralkyl group, which are substituents for the alkyl hydrocarbon groups represented by Y, may have a substituent such as a halogen atom or a hydroxyl group.

Substituents of the alicyclic hydrocarbon groups represented by Y include a halogen atom, an C1-C12 alkyl group, a hydroxyl group, a C1-C12 alkoxy group, a C3-C16 alicyclic hydrocarbon group, a C6-C18 aromatic hydrocarbon group, a C7-C21 aralkyl group, a C2-C4 acyl group, a glycidyloxy group, and —(CH$_2$)$_{j2}$—O—CO—R$^{b1}$ in which R$^{b1}$ and j2 are defined as above. Each of the alkyl group, the alicyclic hydrocarbon group, the aromatic hydrocarbon group and the aralkyl group, which is the substituent for the alicyclic hydrocarbon groups represented by Y may have a substituent such as an alkyl group, a halogen atom or a hydroxyl group.

Examples of hydroxyl-containing alkyl group include a hydroxymethyl group and a hydroxyethyl group.

Examples of the C1-C12 alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group.

Examples of the aralkyl group include a benzyl group, phenylpropyl group, a phenethyl group, a naphthylmethyl group, or a naphthylethyl group.

Examples of the acyl group include an acetyl group, a propyonyl group and a butyryl group.

Examples of the halogen atom include a fluorine atom, a chlorine atom, a bromine atom and an iodine atom.

Examples of Y include the groups as follow.

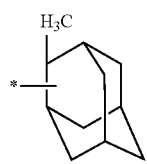 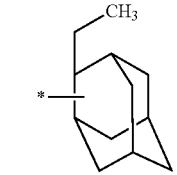 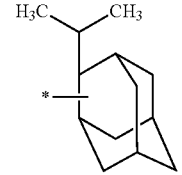

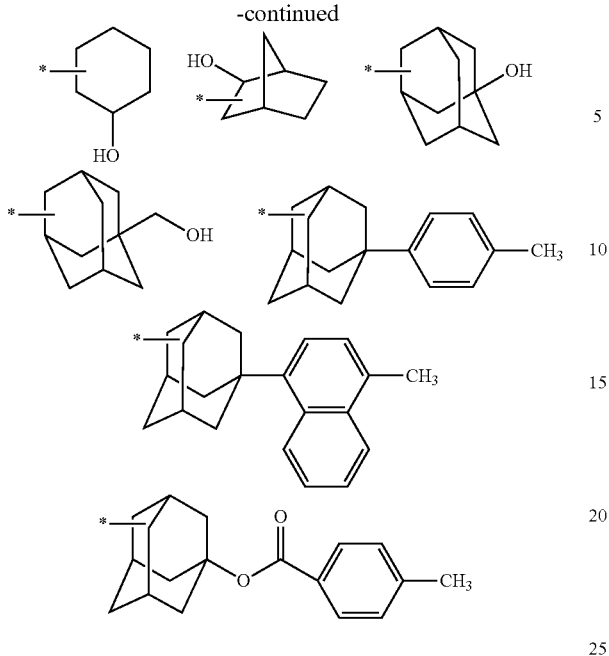

where * represents a binding position.

Y represents preferably a C3-C18 alicyclic hydrocarbon group which may have a substituent, more preferably an amadantyl group which may have a substituent, and still more preferably an amadantyl group, a hydroxyamadantyl group or an oxoamadantyl group.

Preferred examples of the sulfonic acid anion of the salt represented by formula (B1) include salts represented by the formulae (B1-A-1) to (B1-A-35), preferably salts represented by the formulae (B1-A-1) to (B1-A-33), more preferably the formulae (B1-A-1) to (B1-A-4), (B1-A-9), (B1-A-10) and (B1-A-24) to (B1-A-33).

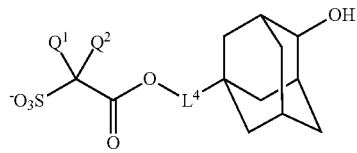 (B1-A-1)

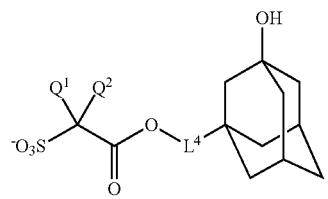 (B1-A-2)

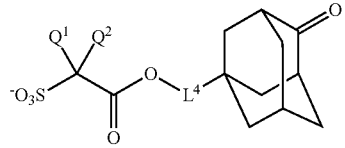 (B1-A-3)

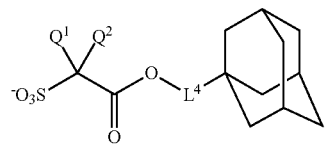 (B1-A-4)

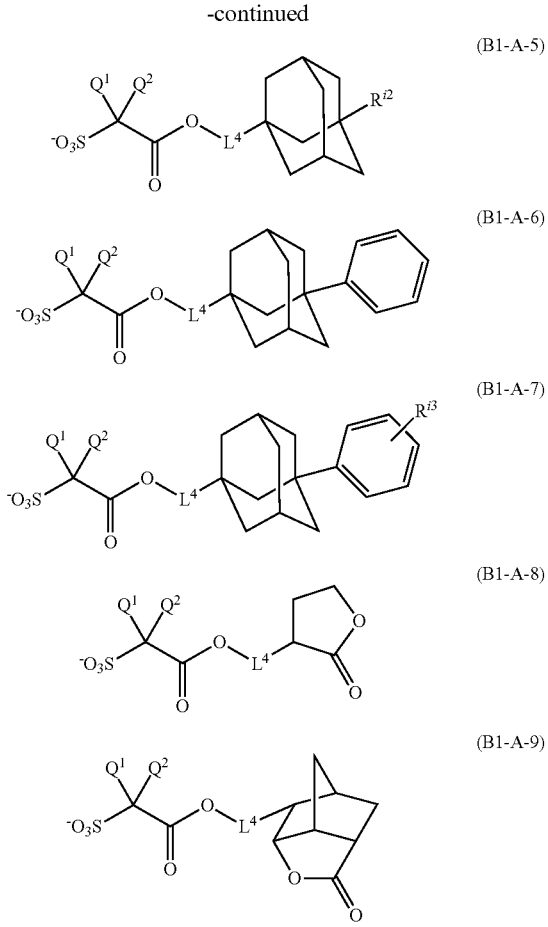

(B1-A-5)

(B1-A-6)

(B1-A-7)

(B1-A-8)

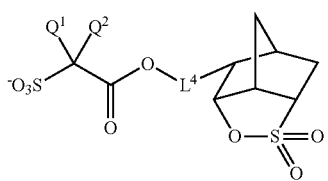 (B1-A-9)

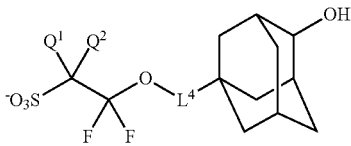 (B1-A-10)

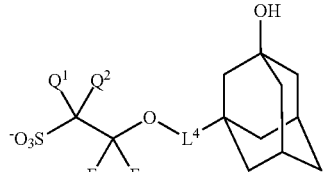 (B1-A-11)

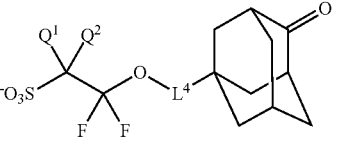 (B1-A-12)

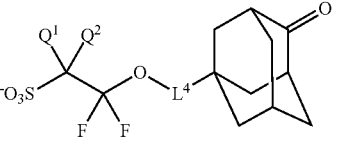 (B1-A-13)

(B1-A-14)
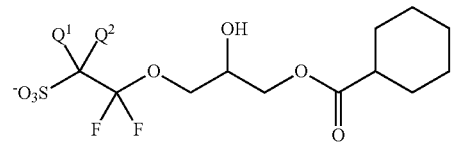
(B1-A-15)
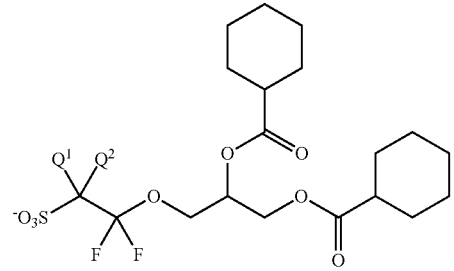
(B1-A-16)
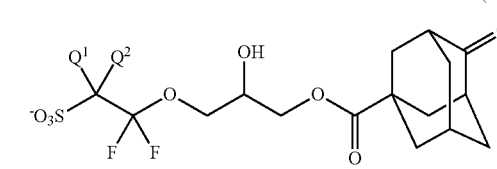
(B1-A-17)
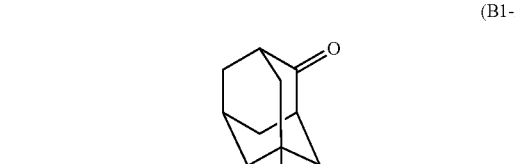
(B1-A-18)
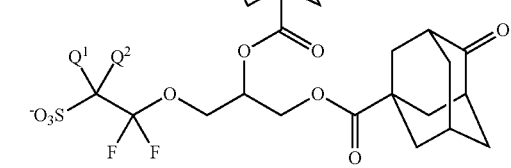
(B1-A-19)
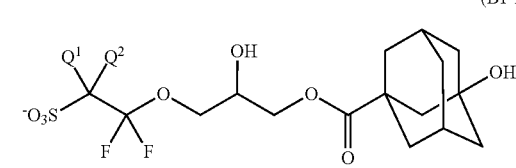
(B1-A-20)
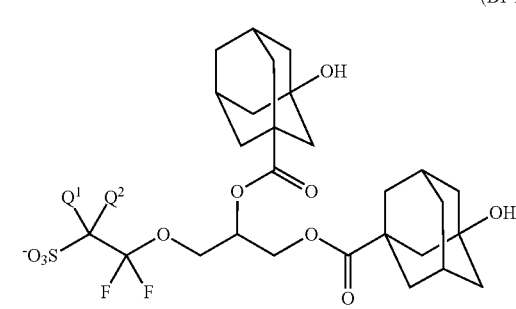
(B1-A-21)
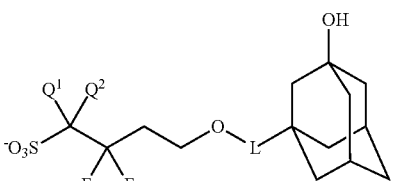
(B1-A-22)
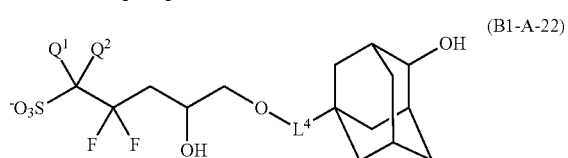
(B1-A-23)
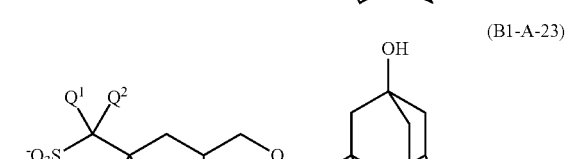
(B1-A-24)
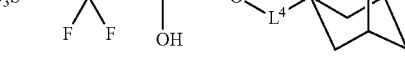
(B1-A-25)
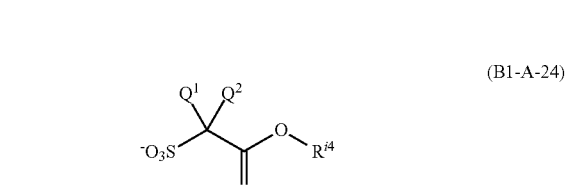
(B1-A-26)
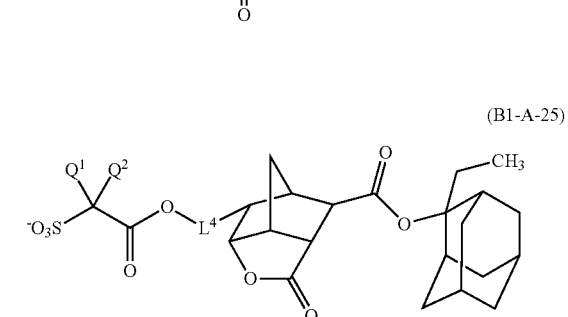
(B1-A-27)
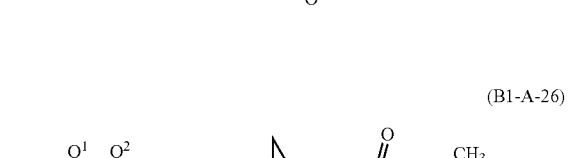

(B1-A-28)
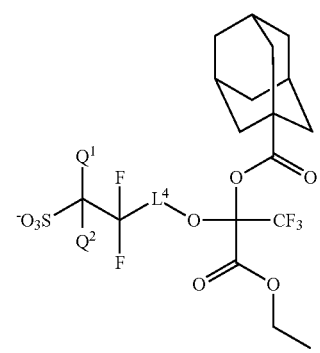

(B1-A-29)
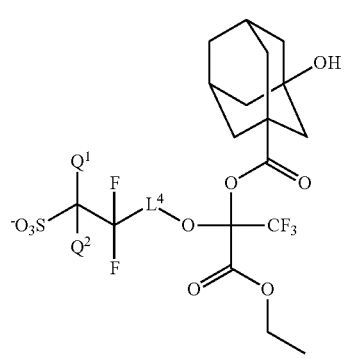

(B1-A-30)
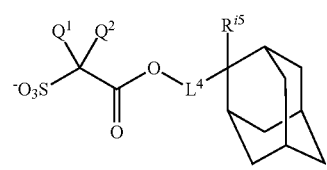

(B1-A-31)
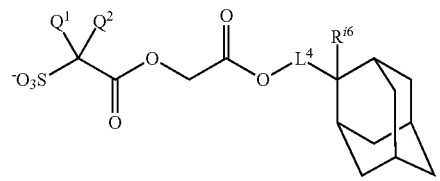

(B1-A-32)
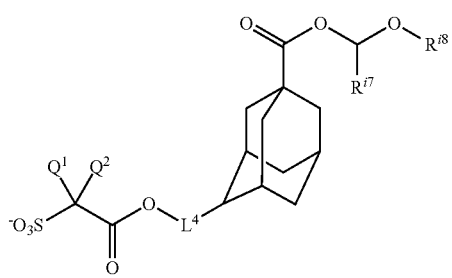

(B1-A-33)
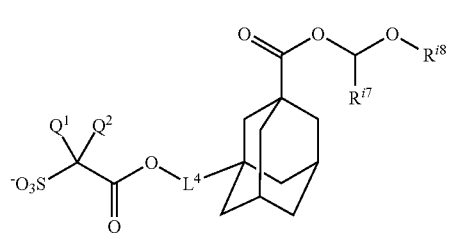

(B1-A-34)
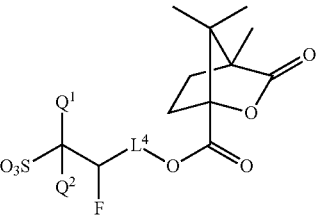

(B1-A-35)
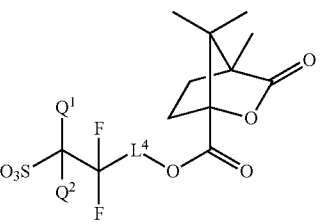

In these formulae, the symbols $Q^1$, $Q^2$, $L^4$, Y and $Z^+$ are defined as above, $R^{i2}$, $R^{i3}$, $R^{i4}$, $R^{i5}$, $R^{i6}$, $R^{i7}$ and $R^{i8}$ each independently represent a C1-C4 alkyl group, preferably a methyl group or an ethyl group, $R^{i8}$ represents a C1-C12 aliphatic hydrocarbon group, a C5-C12 monovalent alicyclic hydrocarbon group, or a combined group of them, preferably a methyl group, an ethyl group, a cyclohexyl group or an adamantyl group, and $L^4$ represents a single bond or a C1-C4 alkanediyl group.

Specific examples of the sulfonic acid anion of the salt represented by formula (B1) include anions mentioned in JP2010-204646A1. Among them, preferred examples of the sulfonic acid anion for the salt represented by formula (B1) include anions represented by formulae (B1a-1) to (B1a-15).

(B1a-1)
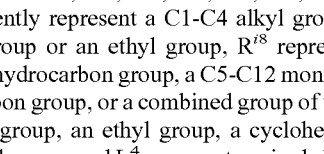

(B1a-2)
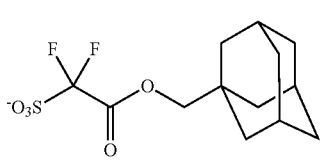

(B1a-3)
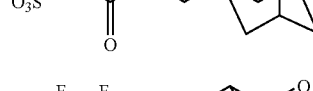

(B1a-4)
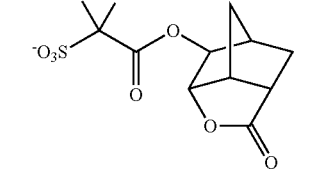

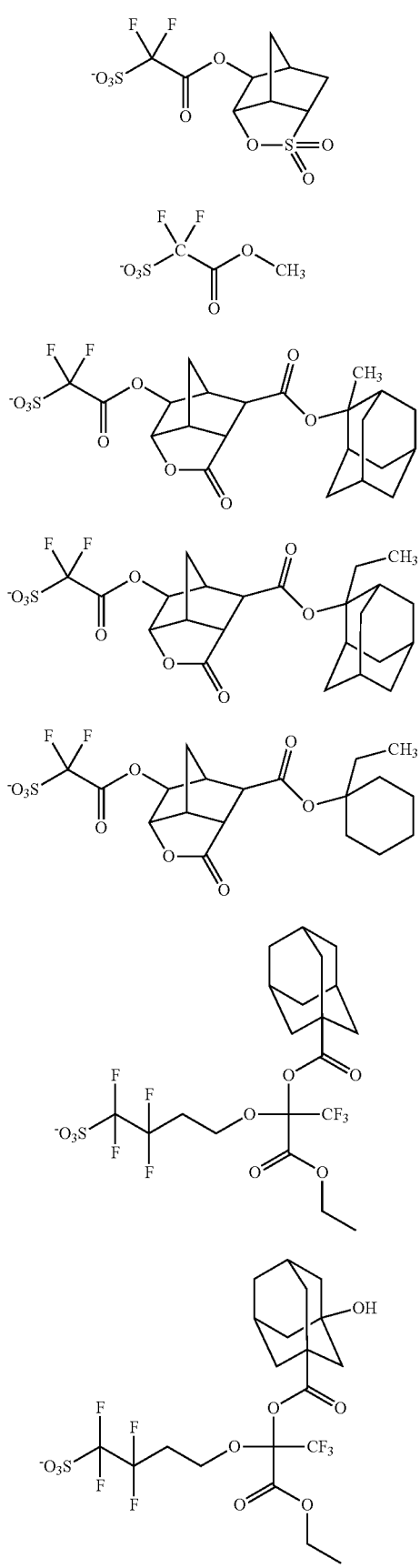

Among them, preferred are those represented by formulae (B1a-1) to (B1a-3) and (B1a-7) to (B1a-15).

Examples of the organic cation represented by $Z^+$ include an organic onium cation such as an organic sulfonium cation, an organic iodonium cation, an organic ammonium cation, a benzothiazolium cation and an organic phosphonium cation, and an organic sulfonium cation and an organic iodonium cation are preferred, and an arylsulfonium cation is more preferred. Herein, the arylsulfonium includes those having one, two or three aryl groups.

Preferred examples of the organic cations represented by $Z^+$ include those represented by the formulae (b2-1) to (b2-4):

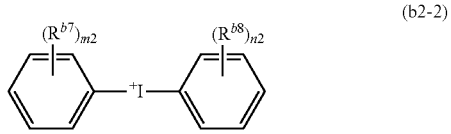

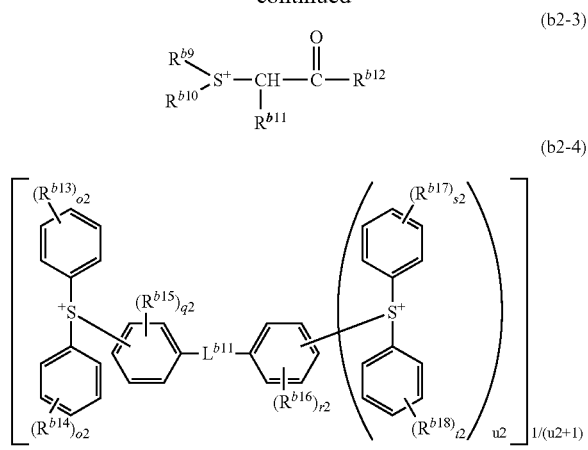

(b2-3)

(b2-4)

wherein $R^{b4}$, $R^{b5}$ and $R^{b6}$ independently represent a C1-C30 aliphatic hydrocarbon group which can have a substituent selected from the group consisting of a hydroxyl group, a C1-C12 alkoxy group, a C6-C18 aromatic hydrocarbon group, a C3-C18 alicyclic hydrocarbon group which can have a substituent selected from the group consisting of a halogen atom, a C2-C4 acyl group and a glycidyloxy group, and a C6-C18 aromatic hydrocarbon group which can have a substituent selected from the group consisting of a halogen atom, a hydroxyl group, C1-C18 alicyclic hydrocarbon group, or C1-C12 alkoxy group, and $R^{b4}$ and $R^{b5}$, $R^{b4}$ and $R^{b6}$, or $R^{b5}$ and $R^{b6}$ can be bonded each other to form a ring containing $S^+$, $R^{b7}$ and $R^{b8}$ are independently in each occurrence a hydroxyl group, a C1-C12 aliphatic hydrocarbon group or a C1-C12 alkoxy group, m2 and n2 independently represents an integer of 0 to 5, $R^{b9}$ and $R^{b10}$ independently represent a C1-C18 aliphatic hydrocarbon group or a C3-C18 alicyclic hydrocarbon group, or $R^{b9}$ and $R^{b10}$ are bonded each other to form a C1-C10 divalent acyclic hydrocarbon group which forms a 3- to 12-membered ring, preferably 3- to 7-membered ring together with the adjacent —$S^+$—, and one or more —$CH_2$— in the divalent acyclic hydrocarbon group may be replaced by an oxygen atom, sulfur atom or carbonyl group, and $R^{b11}$ represents a hydrogen atom, a C1-C18 aliphatic hydrocarbon group, or a C3-C18 alicyclic hydrocarbon group, and $R^{b12}$ represents a C1-C12 aliphatic hydrocarbon group, a C3-C18 alicyclic hydrocarbon group, a C6-C18 aromatic hydrocarbon group which can have a substituent selected from the group consisting of a C1-C12 alkyl group, a C1-C12 alkoxyl group, C1-C18 alicyclic hydrocarbon group and a C2-C12 alkylcarbonyloxy group, or $R^{b11}$ and $R^{b12}$ are bonded each other to form a C1-C10 divalent acyclic hydrocarbon group which forms a 2-oxocycloalkyl group together with the adjacent —CHCO—, and one or more —$CH_2$— in the divalent acyclic hydrocarbon group may be replaced by an oxygen atom, sulfur atom or carbonyl group, and $R^{b13}$, $R^{b14}$, $R^{b15}$, $R^{b16}$, $R^{b17}$ and $R^{b18}$ independently represent a hydroxyl group, a C1-C12 alkyl group or a C1-C12 alkoxy group, $L^{b11}$ represents —S— or —O—, o2, p2, s2 and t2 each independently represents an integer of 0 to 5, q2 and r2 each independently represents an integer of 0 to 4, and u2 represents 0 or 1.

Examples of the aliphatic hydrocarbon group represented by $R^{b4}$ to $R^{b6}$ include a methyl group, an ethyl group, a propyl group, an isopropyl group, a butyl group, a sec-butyl group, a tert-butyl group, a pentyl group, a hexyl group, an octyl group, a decyl group, a dodecyl group, a hexadecyl group, a pentadecyl group, a heptadecyl group and an octadecyl group, and preferred examples thereof include a methyl group, an ethyl group, a propyl group and a butyl group. The alicyclic hydrocarbon group represented by $R^{b4}$ to $R^{b6}$ may be monocyclic or polycyclic. The monocyclic hydrocarbon group includes cycloalkyl groups such as a cyclopropyl group, a cyclobutyl group, a cyclopentyl group, a cyclohexyl group, a cycloheptyl group, and a cyclodecyl group. The polycyclic alicyclic hydrocarbon group includes cycloalkyl groups such as decahydronaphthyl group, an adamantyl group, a norbornyl group, a methylnorbornyl group, and other polycyclic groups as mentioned below.

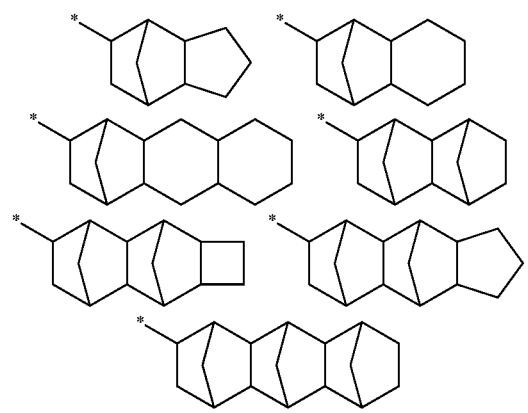

wherein * represents a binding site to an adamantane ring or a cyclohexane ring.

Preferred examples of the alicyclic hydrocarbon group include a cyclopentyl group and a cyclohexyl group.

Examples of the aromatic group represented by $R^{b4}$ to $R^{b6}$ include an aryl group such as a phenyl group, a naphthyl group, p-methyl phenyl group, p-ethyl phenyl group, p-tert butyl phenyl group, p-adamantyl phenyl group, tolyl group, xylyl group, cumenyl group, mesityl group, biphenyl group, phenantolyl group, 2,6-diethylphenyl group and 2-methyl-6-ethylphenyl group.

Examples of the C1-C12 alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of the halogen atom include a fluorine atom, a chlorine atom, a bromine atom and an iodine atom.

Examples of the C2-C4 acyl group include an acetyl group, a propyonyl group and a butyryl group.

The ring containing $S^+$ formed by bonding $R^{b4}$ and $R^{b5}$, $R^{b4}$ and $R^{b6}$, or $R^{b5}$ and $R^{b6}$ each other may be a monocyclic ring, a polycyclic ring, an aromatic ring, a non-aromatic ring, a saturated ring or a unsaturated ring. The ring can contain one or more sulfur atom or oxygen atom in addition to S. The ring preferably has 3 to 18 carbon atoms, and more preferably has 4 to 18 carbon atoms. The ring having a sulfur atom preferably has 3 to 18 carbon atoms, more preferably has 3 to 12 carbon atoms, and still more preferably has 3 to 7 carbon atoms, specific examples of which include the following ones.

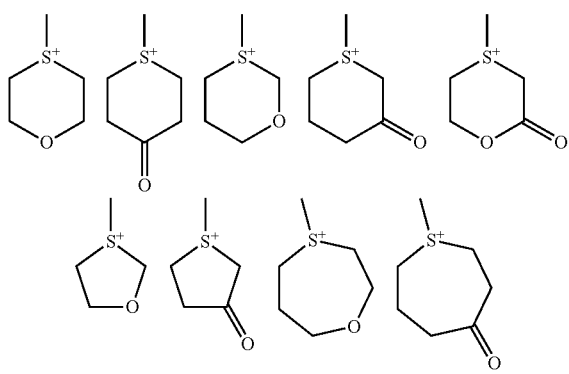

Examples of the aliphatic hydrocarbon group represented by $R^{b9}$ and $R^{b10}$ include a methyl group, an ethyl group, a propyl group, an isopropyl group, a butyl group, a sec-butyl group, a tert-butyl group, a pentyl group, a hexyl group, an octyl group and a 2-ethylhexyl group. Examples of the C1-C12 alkoxy group represented by $R^{b9}$ and $R^{b10}$ include a methoxy group, an ethoxy group, a propoxy group, a butoxy group, a pentyloxy group, a hexyloxy group, a heptyloxy group, an octyloxy group, a decyloxy group and a dodecyloxy group.

Examples of the aliphatic hydrocarbon group represented by $R^{b9}$ to $R^{b12}$ include a methyl group, an ethyl group, a propyl group, an isopropyl group, a butyl group, a sec-butyl group, a tert-butyl group, a pentyl group, a hexyl group, an octyl group and a 2-ethylhexyl group. Such alkyl group preferably has 1 to 12 carbon atoms. Examples of the alicyclic hydrocarbon group represented by $R^{b9}$ to $R^{b11}$ include a cyclopropyl group, a cyclobutyl group, a cyclopentyl group, a cyclohexyl group, a cycloheptyl group, a cyclodecyl group, a 2-alkyl-2-adamantyl group, a 1-(1-adamantyl)-1-alkyl group and an isobornyl group.

The alicyclic hydrocarbon group represented by $R^{b9}$ to $R^{b11}$ has preferably 3 to 18 carbon atoms, more preferably 4 to 12 carbon atoms.

Preferred examples of the aromatic group represented by $R^{b12}$ include a phenyl group, 4-methyl phenyl group, 4-ethyl phenyl group, 4-tert butyl phenyl group, 4-cyclohexyl phenyl group, 4-methoxy phenyl group, biphenyl group and a naphthyl group, and a phenyl group is more preferred.

Preferred examples of the aromatic group where a hydrogen atom has been replaced by an alkoxy group include p-methoxyphenyl group.

Preferred examples of the group in which the alkyl group has been combined with the aromatic hydrocarbon group represented by $R^{b12}$ include an aralkyl group such as benzyl group.

Preferred examples of the alkylcarbonyloxy group represented by $R^{b12}$ include a group consisting of an acyl group and an oxygen atom.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent $S^+$ and the divalent acyclic hydrocarbon group include a thiolan-1-ium ring (tetrahydrothiphenium ring), a thian-1-ium ring and a 1,4-oxathian-4-ium ring. A C3-C7 divalent acyclic hydrocarbon group is preferred.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group. Examples of the ring include oxocyclopentane ring, oxocyclohexane ring, oxonorbornene ring and oxoamadantane ring. A C1-C5 divalent acyclic hydrocarbon group is preferred.

Among the above-mentioned cations, preferred is the cation represented by the formula (b2-1) or the formula (b2-2), more preferred is the cation represented by the formula (b2-1), still more preferred is the cation represented by the formula (b2-1) in which any of $R^{b4}$, $R^{b5}$ and $R^{b6}$ is an aromatic hydrocarbon group, and particularly more preferred is the cation represented by the formula (b2-1-1).

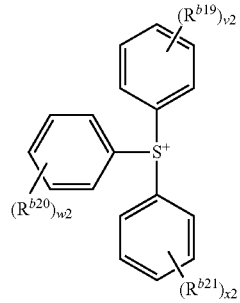

(b2-1-1)

wherein $R^{b19}$, $R^{b20}$ and $R^{b21}$ are independently in each occurrence a halogen atom (preferably a fluorine atom), a hydroxyl group, a C1-C18 aliphatic hydrocarbon group, a C3-C18 saturated cyclic hydrocarbon group or a C1-C12 alkoxy group, and $R^{b19}$ and $R^{b20}$, $R^{b19}$ and $R^{b21}$ or $R^{b20}$ and $R^{b21}$ can be bonded each other to forma ring together with $S^+$ and v2, w2 and x2 independently each represent an integer of 0 to 5.

The ring represented by two of $R^{b19}$, $R^{b20}$ and $R^{b21}$ may be a monocyclic polycyclic, aromatic or nonaromatic. It preferably has at least one sulfur atom, more preferably at least one sulfur atom and at least one oxygen atom.

The aliphatic hydrocarbon group has preferably 1 to 12 carbon atoms, and the saturated cyclic hydrocarbon group has preferably 4 to 18 carbon atoms. Each of $R^{b19}$, $R^{b20}$ and $R^{b21}$ is preferably a halogen atom (preferably a fluorine atom), a hydroxyl group, a C1-C12 alkyl group and a C1-C12 alkoxy group, or two of $R^{b19}$, $R^{b20}$ and $R^{b21}$ together with $S^+$ preferably represent a ring which contains an oxygen atom and a sulfur atom.

The v2, w2 and x2 independently each preferably represent 0 or 1.

Examples of the organic cations represented by formulae (b2-1-1) include organic cations mentioned in JP2010-204646A1.

It is more preferred that $R^{b19}$, $R^{b20}$ and $R^{b21}$ are independently in each occurrence a halogen atom, specifically a fluorine atom, a hydroxyl group, a C1-C12 alkyl group or a C1-C12 alkoxy group, and v2, w2 and x2 independently each represent 0 or 1.

As the cation represented by the formula (b2-1-1), a triphenylsulfonium cation and a trytolysulfonium cation are especially preferred.

Examples of the salt represented by formula (B1) include a salt wherein the anion is any one of the above-mentioned anions and the counter ion is any one of organic counter ions. Preferred salt represented by formula (B1) are those consisting of cation represented by formula (b2-1-1) and any one of anions represented by formulae (b1a-1) to (b1a-3) and (b1a-7) to (b1a-15) as well as those consisting of cation represented by formula (b2-3) and any one of anions represented by formulae (b1a-1) to (b1a-3) and (b1a-7) to (b1a-15).
The salt represented by formula (B1) are preferably salts represented by formulae (B1-1) to (B1-28), and more preferably salts which have triphenylsulfonium cation or tri-tolylsulfonium cation, i.e., salts represented by formulae (B1-1), (B1-2), (B1-3), (B1-5), (B1-6), (B1-7), (B1-11), (B1-12), (B1-13), (B1-14), (B1-20), (B1-21), (B1-23), (B1-24), (B1-25) and (B1-26).
(B1-1)
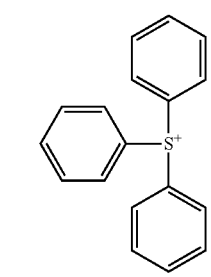
(B1-2)
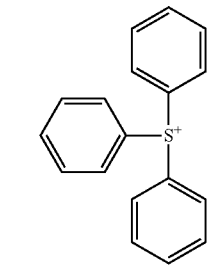
(B1-3)
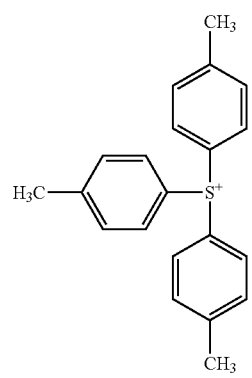
(B1-4)
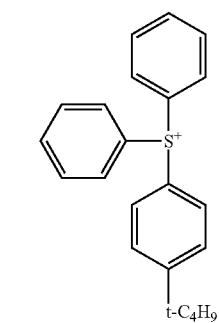
-continued
(B1-5)
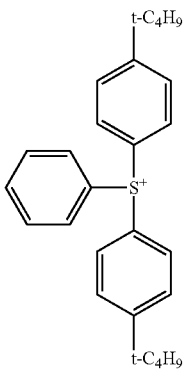
(B1-6)
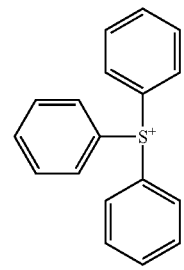
(B1-7)
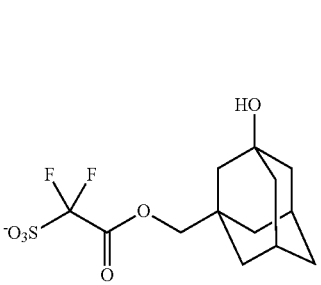
(B1-8)
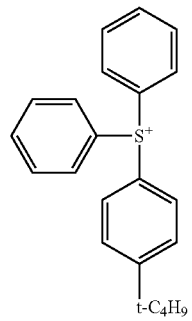

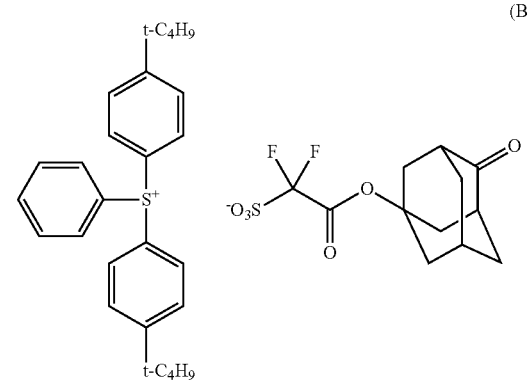
(B1-9)
(B1-10)
(B1-11)
(B1-12)
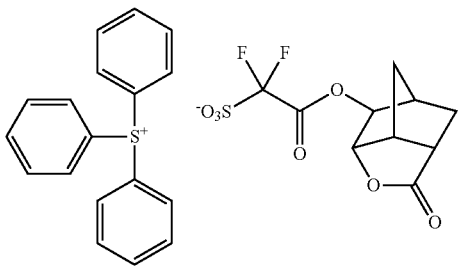
(B1-13)
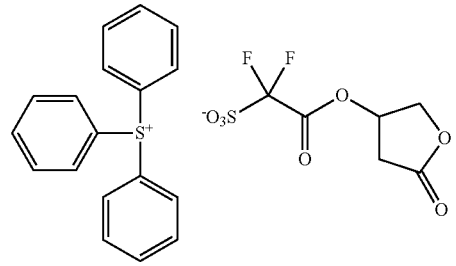
(B1-14)
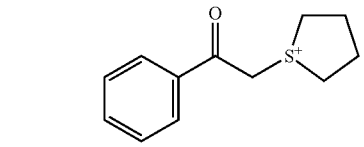
(B1-15)
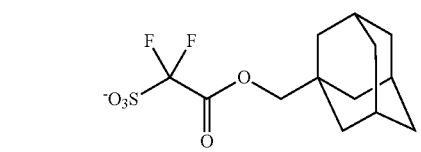
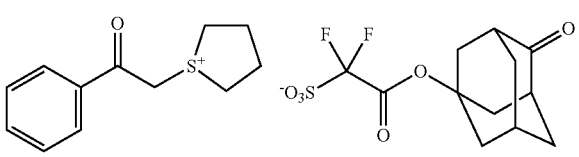
(B1-16)
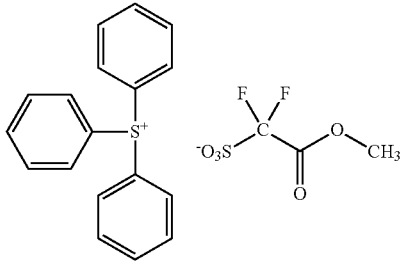
(B1-17)
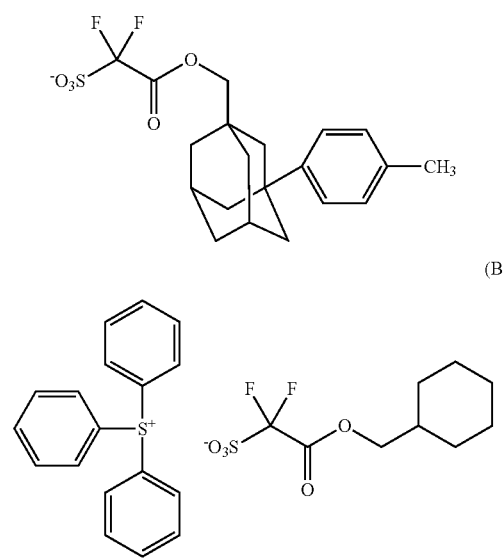
(B1-18)

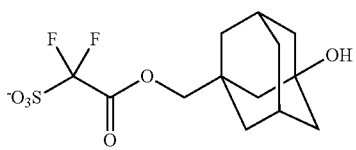
(B1-19)
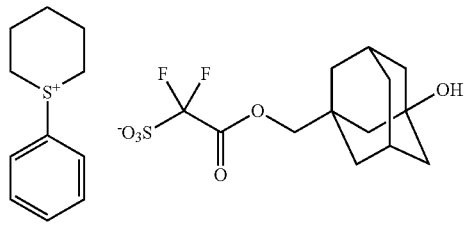
(B1-20)
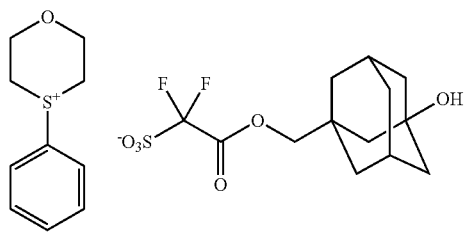
(B1-21)
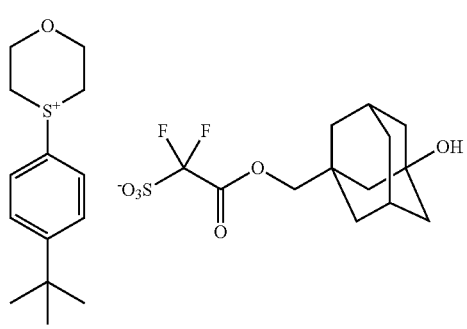
(B1-22)
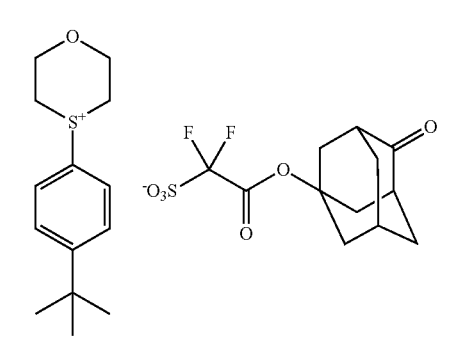
(B1-23)
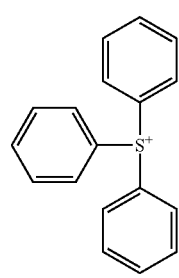
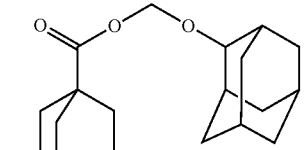
(B1-24)
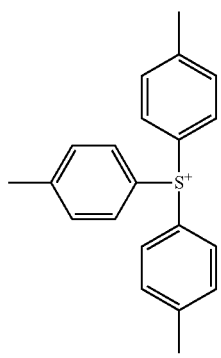
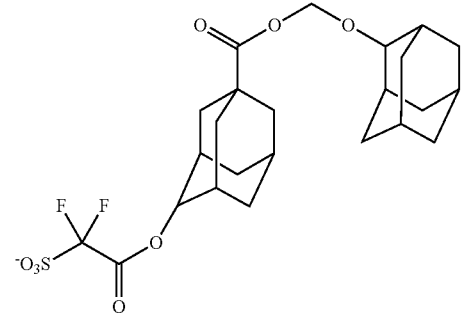
(B1-25)
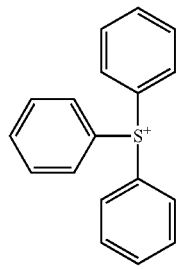
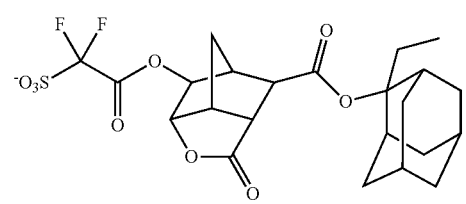

-continued (B1-26)
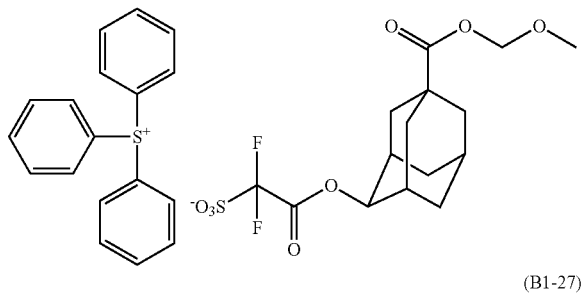

(B1-27)
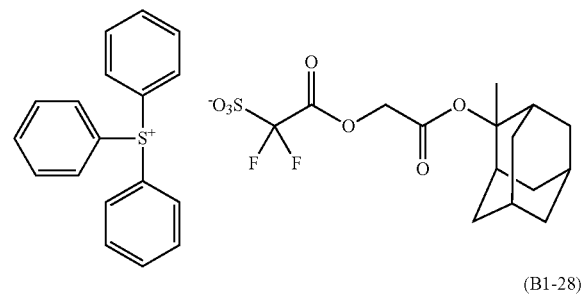

(B1-28)
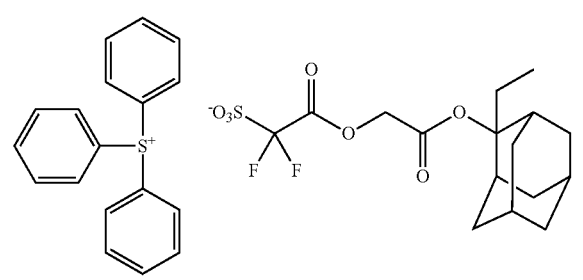

The content of the acid generator is preferably 1 parts by weight or more and more preferably 3 parts by weight or more per 100 parts by weight of the sum of resin, and the content of the acid generator is preferably 30 parts by weight or less and more preferably 25 parts by weight or less, per 100 parts by weight of the resin (A).

The content of the acid generator represented by formula (B1) is preferably 30 parts by weight or more, and more preferably 50 parts by weight or more, per 100 parts by weight of the total acid generator.

The photoresist composition according to the present invention usually comprises a solvent.

The amount of the solvent is usually 90% by weight or more, preferably 92% by weight or more preferably 94% by weight or more based on total amount of the photoresist composition of the present invention. The amount of the solvent is usually 99.9% by weight or less and preferably 99% by weight or less based on total amount of the photoresist composition of the present invention. The content can be measured with known methods such as liquid chromatography or gas chromatography.

Examples of the solvent include a glycoletherester such as ethyl cellosolve acetate, methyl cellosolve acetate and propylene glycol monomethyl ether acetate; a glycol ether such as propylene glycol monomethyl ether; an ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The photoresist composition according to the present invention may comprise a quencher. The quencher has the property that it can trap an acid, especially an acid generated from the acid generator by applying a radiation. Examples of the quencher include a basic nitrogen-containing organic compound and a weak acid salt.

Examples of the basic nitrogen-containing organic compound include an amine compound such as an aliphatic amine, an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine.

Examples of the basic nitrogen-containing organic compound include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethydiheptylamine, ethyldioctylamine, ethyldinonylamine, ethyldidecylamine, dicyclohexylmethylamine, tris[2-(2-methoxyethoxyl)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, imidazole, 4-methylimidazole, pyridine, 4-methylpyridine, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 1,2-di(4-pyridyl)ketone, 4,4'-dipyridyl sulfide, 4,4'-dipyridyldisulfide, 2,2'-dipyridylamine, 2,2'-dipicolylamine and bipyridine.

Among them, preferred is diisopropylaniline and more preferred is 2,6-diisopropylaniline.

Examples of the ammonium salt include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

The weak acid salt comprises an acid which is lower in acidity than an acid generated from an acid generator. The weak acid salt generates an acid which is lower in acidity than an acid generated from an acid generator.

Here, the "acidity" can be represented by acid dissociation constant [pKa] of an acid generated from a weak acid salt.

Examples of the weak acid salt include the following salts, the salt of formula (D), and salts as disclosed in JP2012-229206A1, JP2012-6908A1, JP2012-72109A1, JP2011-39502A1 and JP2011-191745 A1, preferably the salt of formula (D).

111
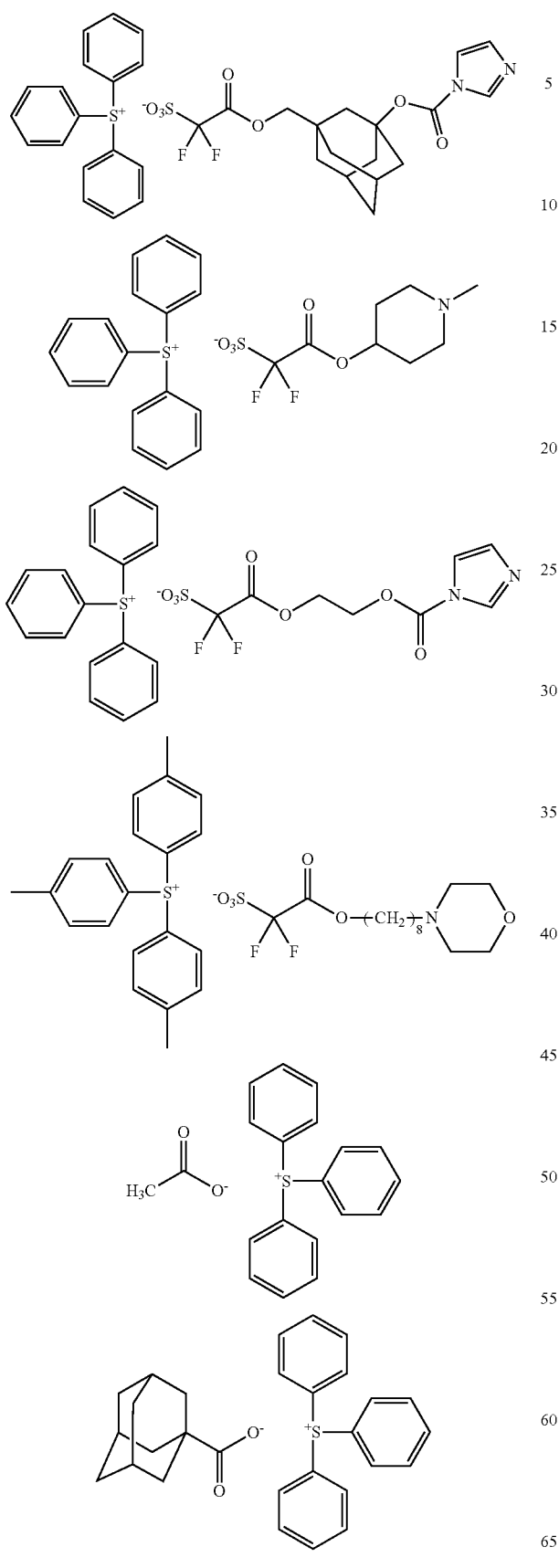
112
-continued
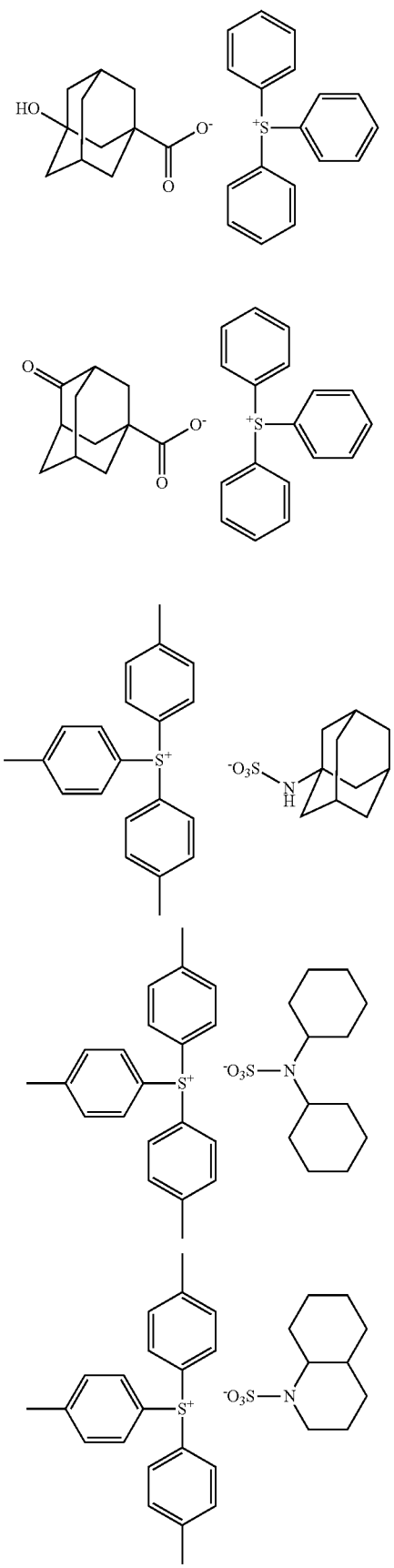

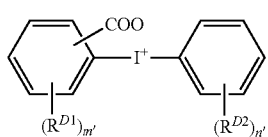

In the formula, $R^{D1}$ and $R^{D2}$ each independently represent a C1-C12 monovalent hydrocarbon group, a C1-C6 alkoxy group, a C2-C7 acyl group, a C2-C7 acyloxy group, a C2-C6 alkoxycarbonyl group, a nitro group or a halogen atom; and m' and n' each independently represent an integer of 0 to 4.

The monovalent hydrocarbon group includes any of monovalent aliphatic hydrocarbon groups, monovalent alicyclic hydrocarbon groups, monovalent aromatic hydrocarbon groups and a combination thereof.

Examples of the monovalent aliphatic hydrocarbon group include an alkyl group such as methyl, ethyl, propyl, isopropyl, butyl, sec-butyl, tert-butyl, pentyl, hexyl and nonyl groups.

The monovalent alicyclic hydrocarbon group may be any one of monocyclic or polycyclic hydrocarbon group, and saturated or unsaturated hydrocarbon group. Examples thereof include a cycloalkyl group such as a cyclopropyl group, a cyclobutyl group, a cyclopentyl group, a cyclohexyl group, a cyclononyl group and a cyclododecyl group; an adamantyl group and a norbornyl group.

Examples of the monovalent aromatic hydrocarbon group include an aryl group such as phenyl, 1-naphthyl, 2-naphthyl, 2-methylphenyl, 3-methylphenyl, 4-methylphenyl, 4-ethylphenyl, 4-propylphenyl, 4-isopropylphenyl, 4-butylphenyl, 4-tert-butylphenyl, 4-hexylphenyl, 4-cyclohexylphenyl, anthryl, p-adamantylphenyl, tolyl, xylyl, cumenyl, mesityl, biphenyl, phenanthryl, 2,6-diethylphenyl and 2-methyl-6-ethylphenyl groups.

Examples of the combination thereof include an alkyl-cycloalkyl, a cycloalkyl-alkyl, and aralkyl groups such as phenylmethyl, 1-phenylethyl, 2-phenylethyl, 1-phenyl-1-propyl, 1-phenyl-2-propyl, 2-phenyl-2-propyl, 3-phenyl-1-propyl, 4-phenyl-1-butyl, 5-phenyl-1-pentyl and 6-phenyl-1-hexyl groups.

Examples of the alkoxyl group include methoxy and ethoxy groups.

Examples of the acyl group include acetyl, propanonyl, benzoyl and cyclohexanecarbonyl groups.

Examples of the acyloxy group include a group in which oxy group [—O—] bonds to an acyl group.

Examples of the alkoxycarbonyl group include a group in which the carbonyl group [—CO—] bonds to the alkoxy group, such as methoxycarbonyl, ethoxycarbonyl, n-propoxycarbonyl, isopropoxycarbonyl, n-butoxycarbonyl, sec-butoxycarbonyl, and tert-butoxycarbonyl groups.

Examples of the halogen atom include a chlorine atom, a fluorine atom and bromine atom.

In the formula (D), $R^{D1}$ and $R^{D2}$ in each occurrence independently preferably represent a C1-C8 alkyl group, a C3-C10 cycloalkyl group, a C1-C6 alkoxyl group, a C2-C4 acyl group, a C2-C4 acyloxy group, a C2-C4 alkoxycarbonyl group, a nitro group or a halogen atom.

m and n independently preferably represent an integer of 0 to 2, more preferably 0.

Examples of the compound represented by formula (D) include the following ones.

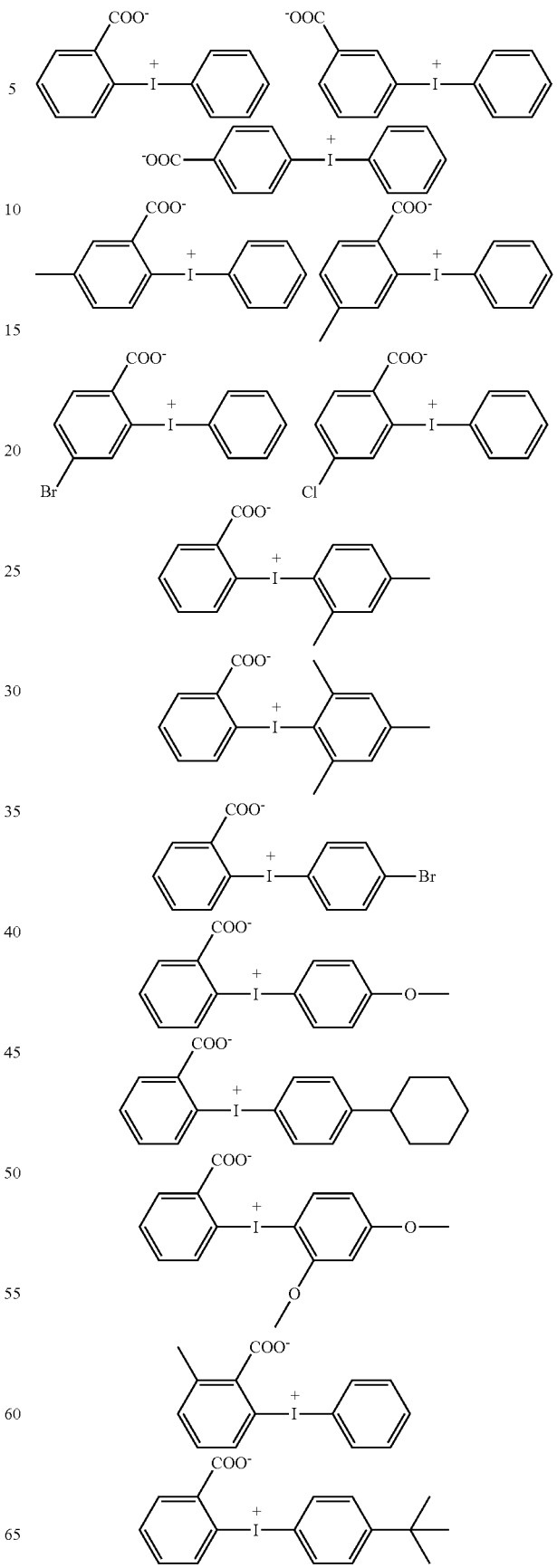

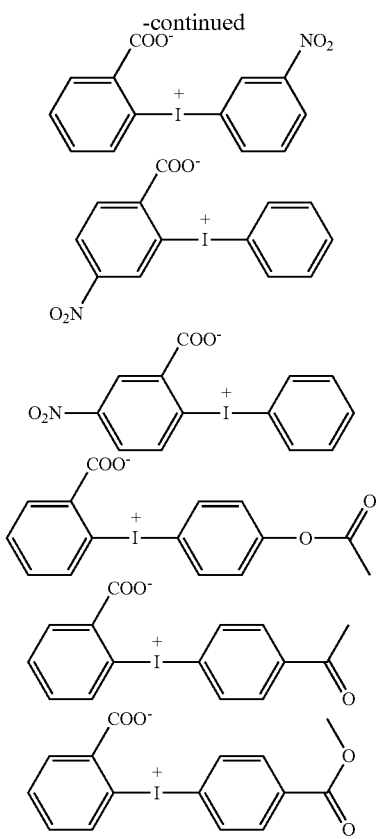

The compound represented by formula (D) can be produced with a method as mentioned in Tetrahedron Vol. 45, No. 19, p6281-6296, which is available in the market.

When the photoresist composition comprises a quencher, its total content is preferably 0.01 to 5% by weight, more preferably 0.01 to 4% by weight, still more preferably 0.01 to 3% by weight, further more preferably 0.01 to 1% by weight, based on sum of solid component.

The photoresist compositions of the present invention can comprise, if necessary, a small amount of various additives such as a sensitizer, a dissolution inhibitor, other polymers, a surfactant, a stabilizer and a dye as long as the effect of the present invention is not prevented.

The photoresist compositions of the present invention can usually be prepared by mixing a solvent, an acid generator, and a resin of the present invention, and if necessary a quencher, and/or additives at a suitable ratio for the composition, optionally followed by filtrating the mixture with a filter having 0.003 μm to 0.2 μm of a pore size.

The order of mixing these components is not limited to any specific order. The temperature at mixing the components is usually 10 to 40° C., which can be selected in view of the resin or the like.

The mixing time is usually 0.5 to 24 hours, which can be selected in view of the temperature. The means for mixing the components is not limited to specific one. The components can be mixed by being stirred.

The photoresist compositions of the present invention are useful for a chemically amplified photoresist composition.

The method of the present invention comprises the following steps (1) to (5):

(1) a step of applying the photoresist composition of the present invention on a substrate, (2) a step of forming a composition film by conducting drying, (3) a step of exposing the composition film to radiation, (4) a step of baking the exposed composition film, and (5) a step of developing the baked composition film to form a photoresist pattern.

The applying of the photoresist composition on a substrate is usually conducted using a conventional apparatus such as spin coater.

Examples of the substrate include a silicon wafer or a quartz wafer on which a sensor, a circuit, a transistor or the like is formed. The substrate may be coated with a reflect-preventing layer such as one containing hexamethyldisilazane. For forming the reflect-preventing layer, such composition for organic reflect-preventing layer as available on the market can be used.

The composition film is usually formed by heating the coat layer with a heating apparatus such as hot plate or a decompressor, to thereby dry off the solvent. The heating temperature is preferably 50 to 200° C., and the operation pressure is preferably 1 to $1.0*10^5$ Pa. These conditions can be selected in view of the solvent.

The composition film is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a F2 laser (wavelength: 157 nm), and a light source radiating harmonic laser light in a far UV region or a vacuum UV region by wavelength conversion of laser light from a solid laser light source (such as YAG or semiconductor laser). The exposure source may be electric beam or extremely ultraviolet (EUV).

The step of baking of the exposed composition film is so called post-exposure bake, which is conducted with heating means such as hot plates. The temperature of baking of the exposed composition film is preferably 50 to 200° C., and more preferably 70 to 150° C.

The step of developing the baked composition film is usually carried out with a developer using a development apparatus. Developing can be conducted in the manner of dipping method, paddle method, spray method and dynamic dispensing method. Temperature for developing is generally 5 to 60° C. The time for developing is generally 5 to 300 seconds.

The photoresist pattern obtained from the photoresist composition may be a positive one or a negative one.

The development for obtaining a positive photoresist pattern is usually carried out with an alkaline developer using a development apparatus. The alkaline developer to be used may be any one of various alkaline aqueous solution used in the art. Generally, an aqueous solution of tetramethylammonium hydroxide or (2-hydroxyethyl)trimethylammonium hydroxide (commonly known as "choline") is often used.

After development, the photoresist pattern formed is preferably washed with ultrapure water, and the residual water remained on the photoresist film or on the substrate is preferably removed therefrom.

The development for obtaining a negative photoresist pattern is usually carried out with a developer containing an organic solvent. The organic solvent to be used may be any one of various organic solvents used in the art, examples of which include ketone solvents such as 2-hexanone, 2-heptanone; glycol ether ester solvents such as propylene glycol monomethyl ether acetate; ester solvents such as the butyl acetate; glycol ether solvents such as the propylene glycol monomethyl ether; amide solvents such as N,N-dimethylacetamide; aromatic hydrocarbon solvents such as anisole.

In the developer containing an organic solvent, the amount of organic solvents is preferably 90% by mass to 100% by mass of the developer, more preferably 95% by mass to 100% by mass of the developer. The developer still more preferably consists essentially of organic solvents.

The developer containing an organic solvent preferably comprises butyl acetate and/or 2-heptanone.

In the developer containing an organic solvent, the total amount of butyl acetate and 2-heptanone is preferably 50% by mass to 100% by mass of the developer, more preferably 90% by mass to 100% by mass of the developer. The developer still more preferably consists essentially of butyl acetate and/or 2-heptanone.

Developers containing an organic solvent may comprise a surfactant. Developer containing an organic solvent may comprise a little water.

The developing with a developer containing an organic solvent can be finished by replacing the developer by another solvent.

After development, the photoresist pattern formed is preferably washed with a rinse agent. Such rinse agent is not unlimited provided that it does not detract a photoresist pattern. Examples of the agent include solvents which contain organic solvents other than the above-mentioned developers, such as alcohol agents or ester agents.

After washing, the residual rinse agent remained on the substrate or photoresist film is preferably removed therefrom.

The photoresist composition of the present invention is suitable for KrF excimer laser lithography, ArF excimer laser lithography, EUV exposure lithography and EB (electron beam) lithography, particularly EB (electron beam) lithography and EUV exposure lithography, which is useful for fine processing for semiconductor.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted.

The weight-average molecular weight of any material used in the following examples is a value found by gel permeation chromatography under the following conditions.
Apparatus: HLC-8120GPC, manufactured by TOSOH CORPORATION
Column: Three of TSKgel Multipore HXL-M with guard column, manufactured by TOSOH CORPORATION
Solvent: tetrahydrofuran
Flow rate: 1.0 mL/min.
Detector: RI Detector,
Column temperature: 40° C.
Injection volume: 100 μL
Standard reference material: standard polystyrene (TOSOH CORPORATION)

Structures of compounds were determined by mass spectrometry (Liquid Chromatography: 1100 Type, manufactured by AGILENT TECHNOLOGIES LTD., Mass Spectrometry: LC/MSD Type, manufactured by AGILENT TECHNOLOGIES LTD.). Hereinafter, the value of the peak in the mass spectrometry is referred to as "MASS".

Synthesis Example 1

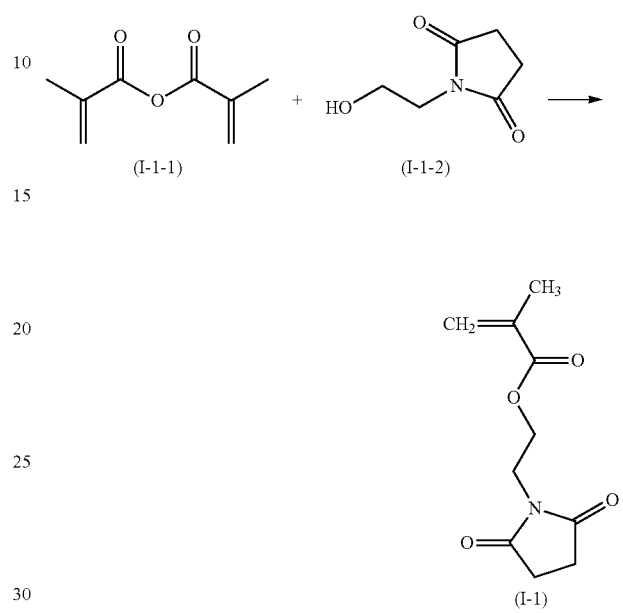

Into a reactor, 25.10 parts of the compound represented by formula (I-1-2), 125.50 parts of chloroform, 26.62 parts of triethylamine, and 1.07 parts of dimethylaminopyridine were fed and stirred at 23° C. for 30 minutes, and then 22.33 parts of the compound represented by formula (I-1-1) were added thereto, followed by stirring them at 23° C. for 3 hours to conduct reaction.

To the obtained reaction mixture, 125 parts of 3% aqueous sodium hydrogencarbonate solution were added and then stirred at 23° C. for 30 minutes, followed by being filtrated. The filtrates were collected and an organic phase was separated therefrom.

To the separated organic phase, 70 parts of ion-exchanged water were added and then stirred at 23° C. for 30 minutes, followed by setting still for separating an organic phase: Such washing step with water was conducted five times.

To the separated organic phase, 125 parts of 10% aqueous oxalic acid solution were added and then stirred at 23° C. for 30 minutes, followed by setting still for separating an organic phase: Such washing step with water was conducted twice.

To the washed organic phase, 70 parts of ion-exchanged water were added thereto and then stirred at 23° C. for 30 minutes, followed by setting still for separating into an organic layer: Such washing step with water was conducted five times.

The washed organic layer was concentrated and purified with column chromatography [silica gel 60-200 mesh, solvent: mixture of n-heptane and ethyl acetate (weight ratio 1/1)] to obtain 15.39 parts of the compound represented by formula (I-1).

MS(ESI(+) Spectrum): M$^+$ 211.1 [Molecular ion peak]

Synthesis Example 2

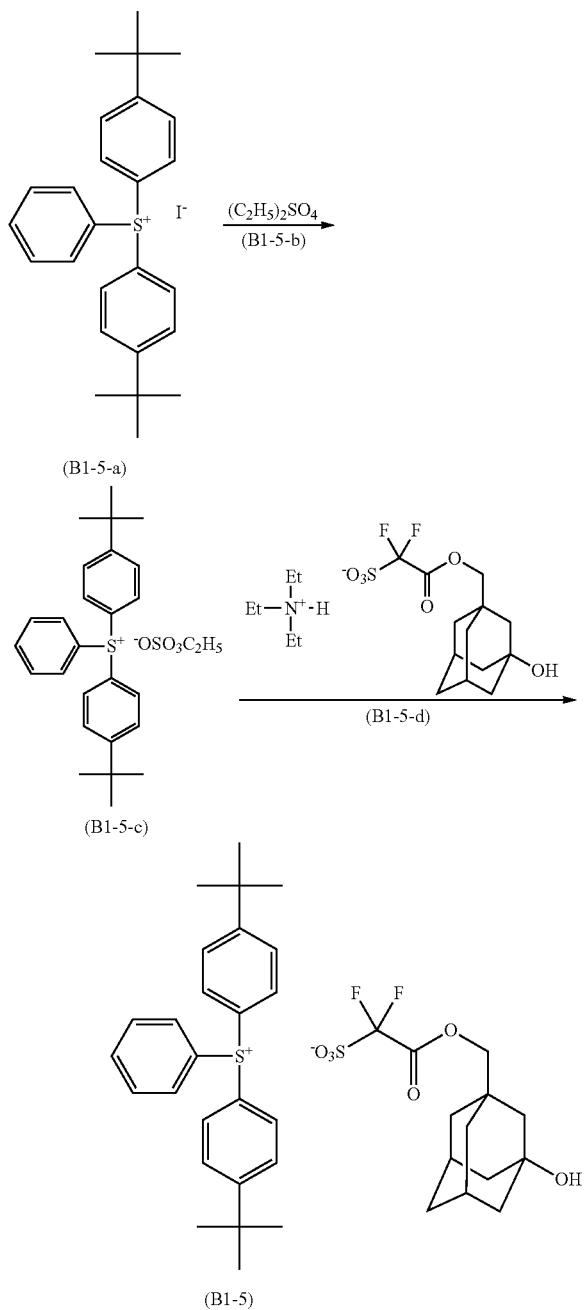

In to a reactor, 50.49 parts of compound represented by formula (B1-5-a) and 252.44 parts of chloroform were fed and stirred at 23° C. for 30 minutes. Then 16.27 parts of compound represented by formula (B1-5-b) were dropped thereinto and stirred at 23° C. for one hour to obtain a solution containing the compound represented by formula (B1-5-c).

To the obtained solution, 48.80 parts of compound represented by formula (B1-5-d) and 84.15 parts of ion-exchanged water were added and then stirred at 23° C. for 12 hours.

From the obtained solution which had two phases, the chloroform phase was collected and then 84.15 parts of ion-exchanged water were added for washing: The washing step was conducted five times. To the washed chloroform phase, 3.88 parts of active carbon were added and stirred, followed by being filtrated.

The collected filtrate was concentrated and then 125.87 parts of acetonitrile were added thereto and stirred, followed by being concentrated.

After concentration, 20.62 parts of acetonitrile and 309.30 parts of tert-butylmethylether were added to the obtained residues, followed by being stirred at 23° C. for about 30 minutes.

Then the supernatant was removed therefrom, and the residues were concentrated. To the concentrated residues, 200 parts of n-heptane were added and then stirred at 23° C. for about 30 minutes, followed by being filtrated to obtain 61.54 parts of salt represented by formula (B1-5).

MASS(ESI(+)Spectrum): M$^+$ 375.2
MASS(ESI(−)Spectrum): M$^-$ 339.1

Synthesis Example 3

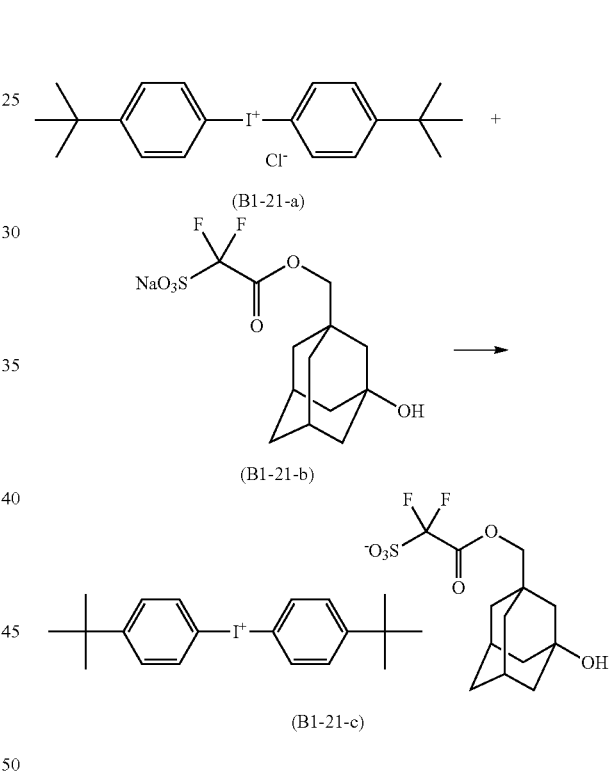

The compound represented by formula (B1-21-b) was produced according to a method recited in JP2008-209917A1.

Thirty [30.00] parts of compound represented by formula (B1-21-b) and 35.50 parts of salt represented by formula (B1-21-a), 100 parts of chloroform and 50 parts of ion exchanged water were fed and stirred at 23° C. for about 15 hours.

The obtained reaction mixture, which had two layers, was separated into a chloroform layer therefrom. To the chloroform layer, 30 parts of ion exchanged water was added and washed with it: These steps were conducted five times.

Then the washed layer was concentrated, and then to the obtained residues, 100 parts of tert-butylmethylether was added and then stirred at 23° C. for about 30 minutes. The resulting mixture was filtrated to obtain 48.57 parts of salt represented by formula (B1-21-c).

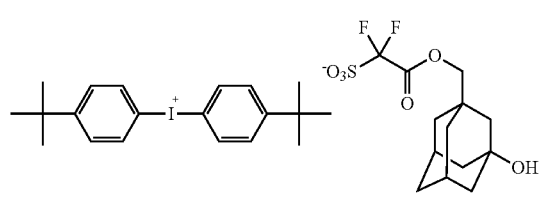

(B1-21-c)

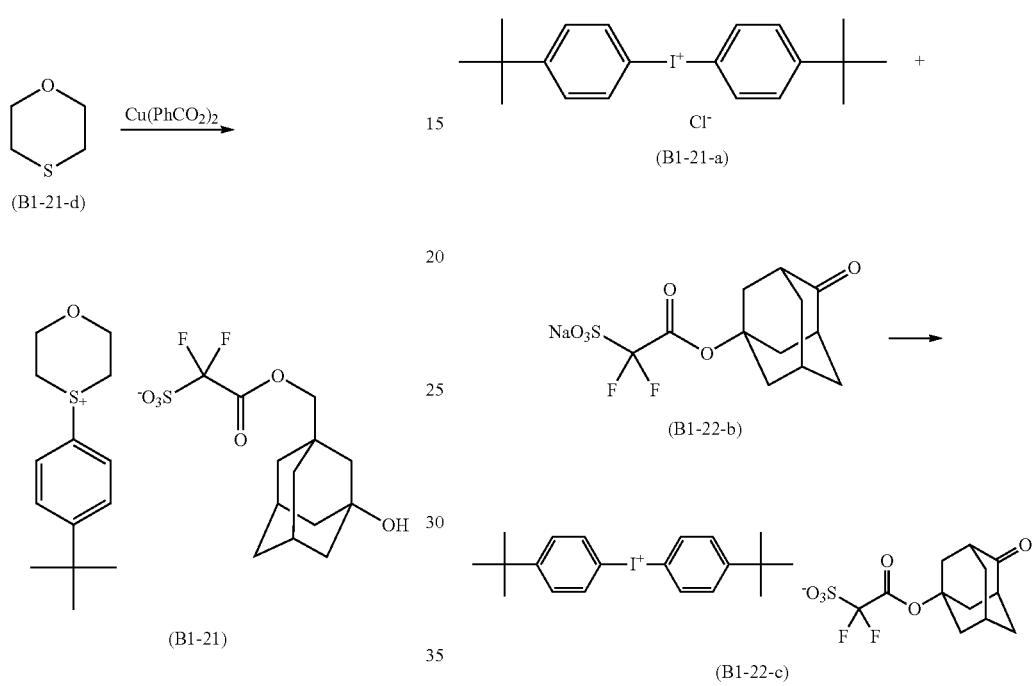

Stirred were 20.00 parts of salt represented by formula (B1-21-c), 2.84 parts of compound represented by formula (B1-21-d) and 250 parts of monochlorobenzene at 23° C. for 30 minutes. To the resulting mixture, 0.21 parts of dibenzoic acid copper (II) was added and stirred at 100° C. for 1 hour. The reaction mixture was concentrated, and then, to the obtained residues, 200 parts of chloroform and 50 parts of ion exchanged water were added and stirred at 23° C. for 30 minutes, followed by being separated into an organic layer therefrom. The following washing steps were conducted five times: 50 parts of ion exchanged water were added to the obtained organic layer and then stirred at 23° C. for 30 minutes, followed by being separated into an organic layer.

The obtained organic layer was concentrated, and then the obtained residues were dissolved in 53.51 parts of acetonitrile. Then the mixture was concentrated, and then 113.05 parts of tert-butylmethylether was added thereto and stirred, followed by filtrating it to obtain 10.47 parts of salt represented by formula (B1-21).

MASS(ESI(+)Spectrum): M$^+$ 237.1
MASS(ESI(−)Spectrum): M$^-$ 339.1

Synthesis Example 4

Ten [10.00] parts of compound represented by formula (B1-22-b), 11.26 parts of salt represented by formula (B1-21-a), 50 parts of chloroform and 25 parts of ion exchanged water were fed and stirred at 23° C. for about 15 hours. The obtained reaction mixture, which had two layers, was separated into a chloroform layer therefrom.

To the chloroform layer, 15 parts of ion exchanged water were added and washed with it: These steps were conducted five times.

Then the washed layer was concentrated, and then to the obtained residues, 50 parts of tert-butylmethylether was added and then stirred at 23° C. for about 30 minutes. The resulting mixture was filtrated to obtain 11.75 parts of salt represented by formula (B1-22-c).

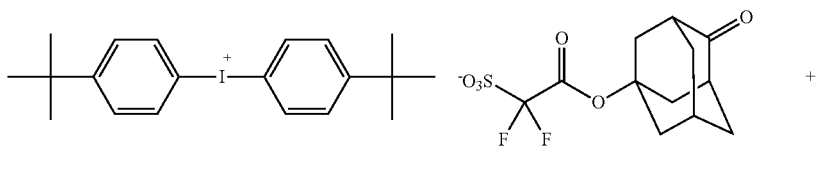

(B1-22-c)

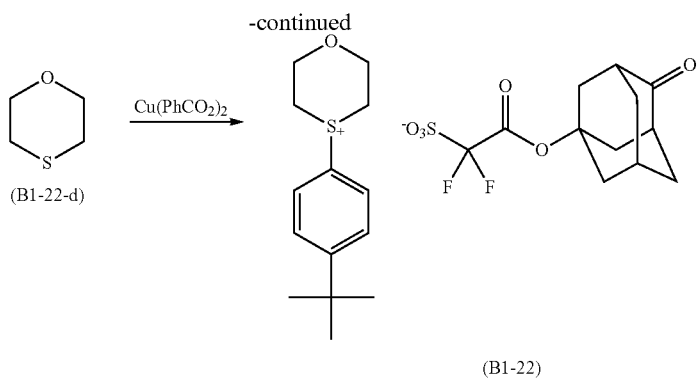

Stirred were 11.71 parts of salt represented by formula (B1-22-c), 1.7 parts of compound represented by formula (B1-22-d) and 46.84 parts of monochlorobenzene at 23° C. for 30 minutes. To the resulting mixture, 0.12 parts of dibenzoic acid copper (II) was added and stirred at 100° C. for 30 minutes. The reaction mixture was concentrated, and then, to the obtained residues, 50 parts of chloroform and 12.5 parts of ion exchanged water were added and stirred at 23° C. for 30 minutes, followed by being separated into an organic layer therefrom. The following washing steps were conducted eight times: 12.5 parts of ion exchanged water was added to the obtained organic layer and then stirred at 23° C. for 30 minutes, followed by being separated into an organic layer.

Then the mixture was concentrated, and then 50 parts of tert-butylmethylether were added thereto and stirred, followed by filtrating it to obtain 6.84 parts of salt represented by formula (B1-22).

MASS(ESI(+)Spectrum): M⁺ 237.1

MASS(ESI(−)Spectrum): M⁻ 323.0

Synthesis of Resin

The compounds, i.e. monomer, used for synthesis of the resin are shown below.

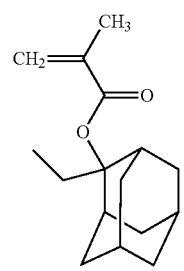

(a-1-2)

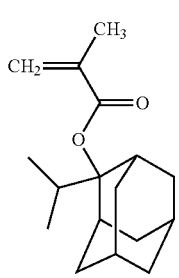

(a1-1-3)

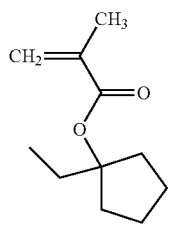

(a1-2-9)

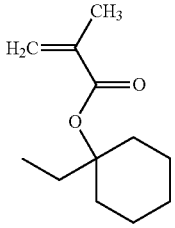

(a1-2-3)

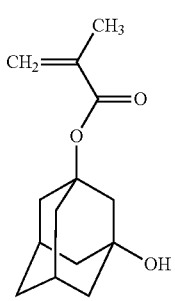

(a2-1-1)

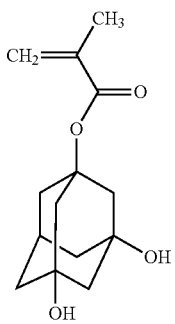

(a2-1-3)

-continued (a3-1-1)
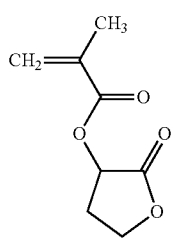

(a3-2-1)
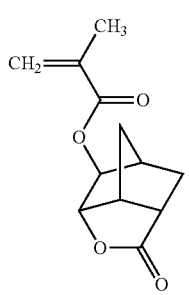

(a3-2-3)
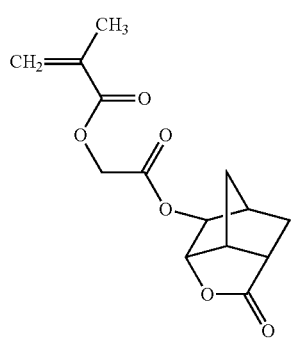

(a3-4-2)
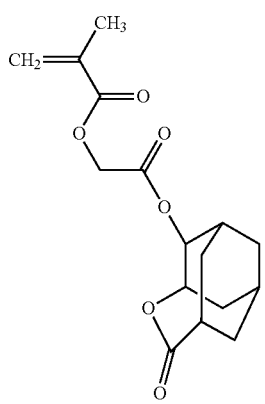

(a4-1-7)
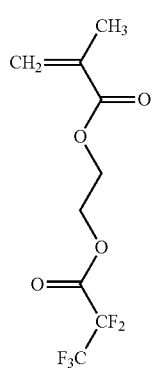

-continued (a4-0-12)
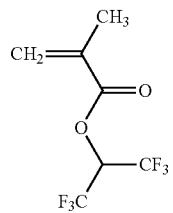

(a5-1-1)
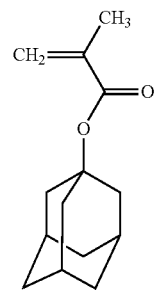

(I-1)
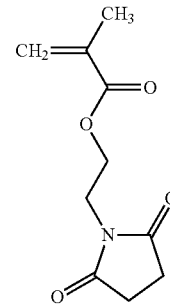

(IX-1)
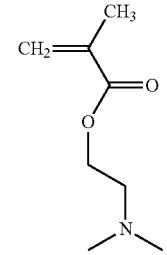

Hereinafter, the monomer of formula (x) where "(x)" represents the symbol for each formula is referred to as Monomer (x).

Example 1

The monomer (a1-1-3), the monomer (a1-2-9), the monomer (a2-1-1), the monomer (a3-4-2) and the monomer (I-1) were mixed in their molar ratio of [monomer (a1-1-3)]/[monomer (a1-2-9)]/[monomer (a2-1-1)]/[monomer (a3-4-2)]/[monomer (I-1)]/=45/14/4/31/6, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in large amount of methanol, followed by filtrating the resulting mixture.

As a result, a polymer having the following structural units and a weight-average molecular weight of about 7.7× $10^3$ was obtained at yield 72%. This resin is called as resin A1.

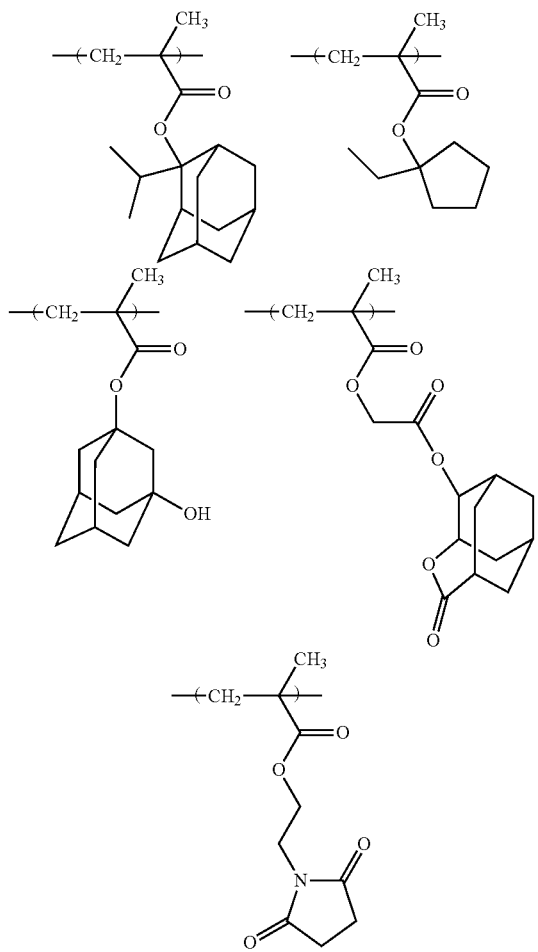

Example 2

The monomer (a1-1-2), the monomer (a2-1-3), the monomer (a3-2-1), and the monomer (I-1) were mixed in their molar ratio of [monomer (a1-1-2)]/[monomer (a2-1-3)]/[monomer (a3-2-1)]/[monomer (I-1)]=40/20/37/3, and further added thereto was propylene glycol monomethyl ether acetate in an amount of 1.5 weight parts relative to the total weight of the monomers.

To the resulting solution, 0.9 part by mole of azobisisobutyronitrile and 2.7 parts by mole of azo(2,4-dimethylvaleronitrile) were added, as initiators, per 100 parts by mole of the total monomer amount, and heated at 70° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 9.9× $10^3$ was obtained at yield 85%. This resin is called as resin A2.

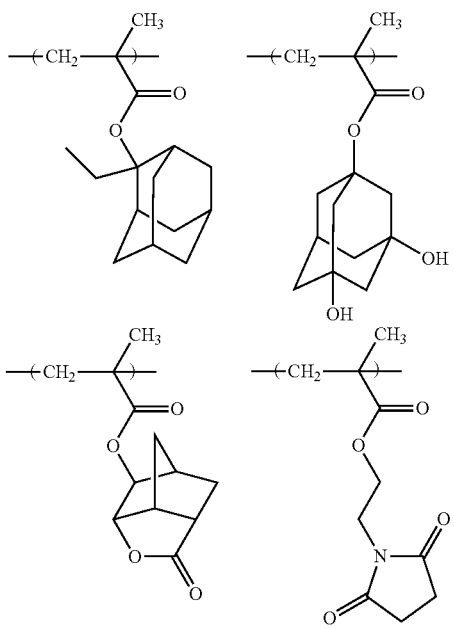

Example 3

The monomer (a1-1-2), the monomer (a1-2-3), the monomer (a2-1-1), the monomer (a3-1-1) and the monomer (I-1) were mixed in their molar ratio of [monomer (a1-1-2)]/[monomer (a1-2-3)]/[monomer (a2-1-1)]/[monomer (a3-1-1)]/[monomer (I-1)]=20/23/9/39/9, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 8.8× $10^3$ was obtained at yield 70%. This resin is called as resin A3.

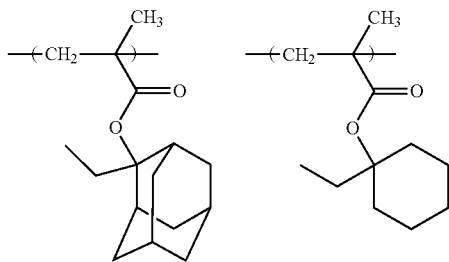

-continued

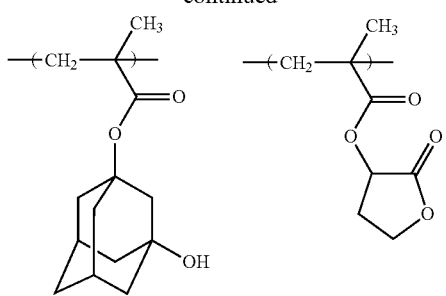

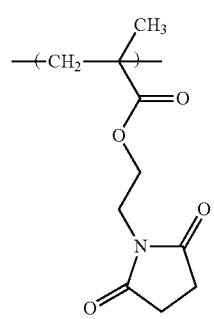

Example 4

The monomer (a1-1-2), the monomer (a1-2-3), the monomer (a3-1-1), and the monomer (I-1) were mixed in their molar ratio of [monomer (a1-1-2)]/[monomer (a1-2-3)]/[monomer (a3-1-1)]/[monomer (I-1)]=20/23/48/9, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 8.5× 10³ was obtained at yield 75%. This resin is called as resin A4.

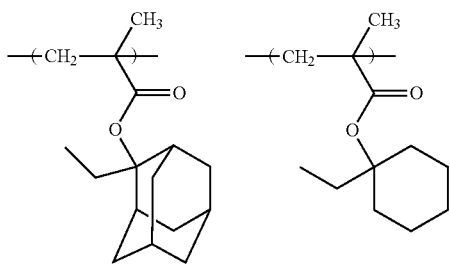

-continued

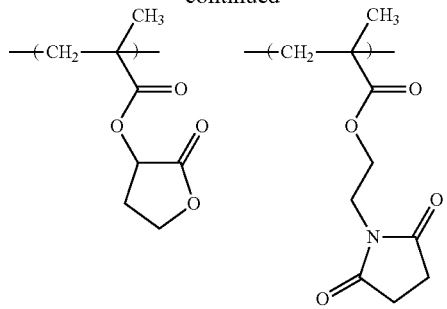

Example 5

The monomer (a1-1-2), the monomer (a1-2-3), the monomer (a3-4-2) and the monomer (I-1) were mixed in their molar ratio of [monomer (a1-1-2)]/[monomer (a1-2-3)]/[monomer (a3-4-2)]/[monomer (I-1)]=20/23/48/9, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 8.3× 10³ was obtained at yield 78%. This resin is called as resin A5.

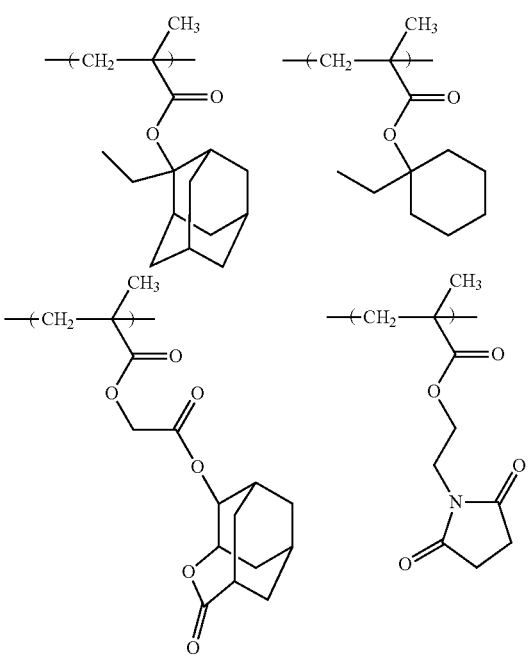

Example 6

The monomer (a1-1-2), the monomer (a1-2-9), the monomer (a3-4-2) and the monomer (I-1) were mixed in their molar ratio of [monomer (a1-1-2)]/[monomer (a1-2-9)]/[monomer (a3-4-2)]]/[monomer (I-1)]=20/23/48/9, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 8.0× 10³ was obtained at yield 85%. This resin is called as resin A6.

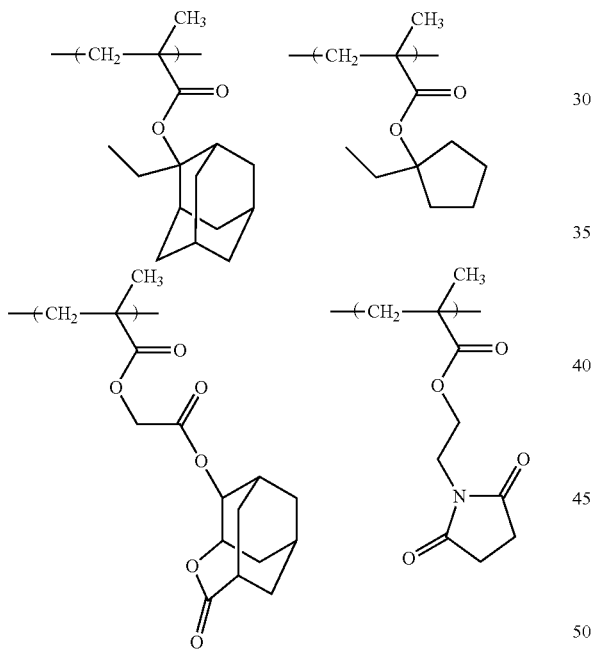

Synthesis Example 5

The monomer (a1-1-2), the monomer (a2-1-3), the monomer (a3-2-1) and the monomer (IX-1) were mixed in their molar ratio of [monomer (a1-1-2)]/[monomer (a2-1-3)]/[monomer (a3-2-1)]/[monomer (IX-1)]=40/20.7/39/0.3, and further added thereto was propylene glycol monomethyl ether acetate in an amount of 1.5 weight parts relative to the total weight of the monomers.

To the resulting solution, 0.9 part by mole of azobisisobutyronitrile and 2.7 parts by mole of azo(2,4-dimethylvaleronitrile) were added, as initiators, per 100 parts by mole of the total monomer amount, and heated at 70° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 1.0× 10⁴ was obtained at yield 68%. This resin is called as resin AX1.

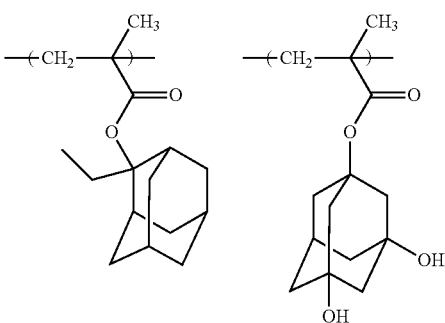

Synthesis Example 6

The monomer (a1-1-2), the monomer (a2-1-3) and the monomer (a3-2-1) were mixed in their molar ratio of [monomer (a1-1-2)]/[monomer (a2-1-3)]/[monomer (a3-2-1)]=40/20/40, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 70° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 8.7× 10³ was obtained at yield 83%. This resin is called as resin AX2.

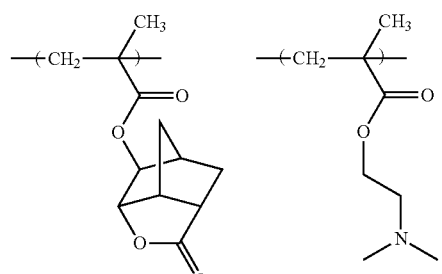

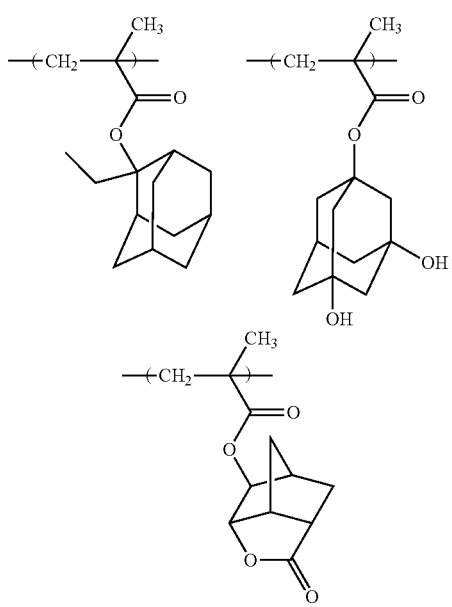

Synthesis Example 7

To the monomer (a4-1-7), dioxane was added in an amount of 1.5 weight parts relative to the total weight of the monomer. To the resulting solution, 0.7 part by mole of azobisisobutyronitrile and 2.1 parts by mole of azo (2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. Then the following procedure was conducted twice: The filtrate was dissolved in dioxane, and the resulting solution was poured into a mixture of water and methanol to cause precipitation, followed by filtrating the resulting mixture.

As a result, a polymer having the following structural unit and a weight-average molecular weight of about $1.8 \times 10^4$ was obtained at yield 77%. This resin is called as resin X1.

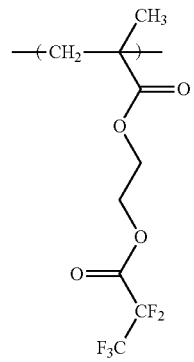

Synthesis Example 8

The monomer (a5-1-1) and the monomer (a4-0-12) were mixed in their molar ratio of [monomer (a5-1-1)]/[monomer (a4-0-12)]=50/50, and further, methylisobuthylketone was added in an amount of 1.2 weight parts relative to the total weight of the monomers.

To the resulting solution, 3 parts by mole of azobisisobutyronitrile were added, as an initiator, per 100 parts by mole of the total monomer amount, and heated at 70° C. for about 5 hours.

Into the resulting reaction mixture, a large amount of mixture of water and methanol was poured to cause precipitation, followed by filtrating the resulting mixture.

As a result, a polymer having the following structural unit and a weight-average molecular weight of about $1.0 \times 10^4$ was obtained at yield 91%. This resin is called as resin X2.

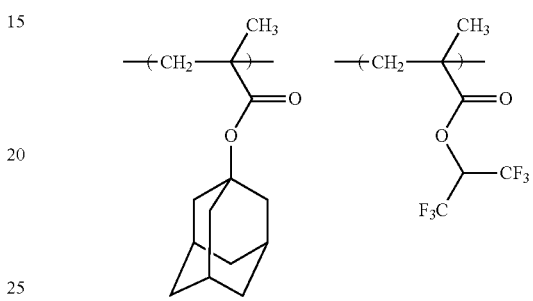

Examples 7 to 11 and Comparative Example 1

Preparation of Photoresist Composition

Resin, an acid generator and a quencher were dissolved in the solvent as shown in Table 1, and the resulting mixture was further filtrated through a fluorine resin filter having pore diameter of 0.2 μm, to prepare photoresist compositions shown in Table 1.

TABLE 1

| Composition | Resin (Amount) | Acid generator (Amount) | Quencher (Amount) | PB/PEB |
|---|---|---|---|---|
| Comp. 1 | A1/10 parts | B1-21/0.9 parts<br>B1-22/0.4 parts | D1/<br>0.28 parts | 90° C./<br>85° C. |
| Comp. 2 | X1/0.7 parts<br>A1/10 parts | B1-5/0.4 parts<br>B1-22/0.4 parts | D1/<br>0.28 parts | 90° C./<br>85° C. |
| Comp. 3 | X1/0.7 parts<br>A1/10 parts | B1-21/0.9 parts<br>B1-22/0.4 parts | D1/<br>0.28 parts | 90° C./<br>85° C. |
| Comp. 4 | X1/0.7 parts<br>A2/10 parts | B1-21/0.9 parts<br>B1-22/0.4 parts | D1/<br>0.28 parts | 90° C./<br>85° C. |
| Comp. 5 | A2/10 parts | BX/0.5 parts | D1/<br>0.28 parts | 105° C./<br>95° C. |
| Comp. 6 | X2/0.7 parts<br>A1/10 parts | B1-21/0.9 parts<br>B1-22/0.4 parts | D1/<br>0.28 parts | 90° C./<br>85° C. |
| Comp. 7 | X2/0.7 parts<br>A3/10 parts | B1-21/0.9 parts<br>B1-22/0.4 parts | D1/<br>0.28 parts | 90° C./<br>85° C. |
| Comp. 8 | X2/0.7 parts<br>A4/10 parts | B1-21/0.9 parts<br>B1-22/0.4 parts | D1/<br>0.28 parts | 90° C./<br>85° C. |
| Comp. 9 | X2/0.7 parts<br>A5/10 parts | B1-21/0.9 parts<br>B1-22/0.4 parts | D1/<br>0.28 parts | 90° C./<br>85° C. |
| Comp. 10 | X2/0.7 parts<br>A6/10 parts | B1-21/0.9 parts<br>B1-22/0.4 parts | D1/<br>0.28 parts | 90° C./<br>85° C. |
| Comparative Comp. 1 | AX1/5 parts<br>AX2/5 parts | BX/0.5 parts | D1/<br>0.28 parts | 105° C./<br>95° C. |

In Table 1, the symbols respectively represent the components as follow.

<Resin>
A1=Resin A1, A2=Resin A2, A3=Resin A3, A4=Resin A4, A5=Resin A5, A6=Resin A6, AX1=Resin AX1, AX2=Resin AX2, X1=Resin X1, X2=Resin X2

<Acid Generator>
B1-5: The salt represented by formula (B1-5)
B1-21: The salt represented by formula (B1-21)
B1-22: The salt represented by formula (B1-22)
BX: triphenylsulfonium nonaflate
<Quencher>
D1: The compound represented by the following formula, produced by Tokyo chemical industry, Co. Ltd.

| <Solvent> | |
|---|---|
| propylene glycol monomethyl ether acetate | 265 parts |
| propylene glycol monomethyl ether | 20 parts |
| 2-heptanone | 20 parts |
| γ-butyrolactone | 3.5 parts |

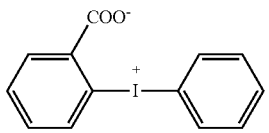

(Producing Photoresist Patterns)
Silicon wafers (12 inches) were each coated with "ARC-29", which is an organic anti-reflective coating composition available from Nissan Chemical Industries, Ltd., and then baked at 205° C. for 60 seconds, to form a 8 nm-thick organic anti-reflective coating.

Each of the photoresist compositions prepared as above was spin-coated over the anti-reflective coating so that the thickness of the resulting film became 85 nm after drying. The silicon wafers thus coated with the respective photoresist compositions were each prebaked on a direct hotplate at a temperature shown in the column "PB" in Table 1 for 60 seconds. Using an ArF excimer stepper for immersion exposure ("XT: 1900Gi" manufactured by ASML, NA=1.35, 3/4 Annular, X-Y polarization) and a mask for forming line and space pattern [pitch: 100 nm, line: 50 nm] each wafer thus formed with the respective resist film was subjected to with the exposure quantity being varied stepwise. Ultrapure water was used as an immersion medium.

After the exposure, each wafer was subjected to post-exposure baking on a hotplate at a temperature shown in the column "PEB" in Table 1 for 60 seconds. Then the baked film was subjected to paddle development using 2.38% aqueous tetramethylammonium hydroxide solution as a developer at 23° C. for 60 seconds to obtain a photoresist pattern.

Effective Sensitivity (ES): It was expressed as the exposure quantity such that the obtained pattern has the line width in 50 nm, and the ratio of the line width and the space between the lines was 1:1.

Evaluation of Profile:
The photoresist patterns obtained with exposure at ES were observed with a scanning electron microscope.

When the line pattern had an excellent profile and nearly rectangle shape at its top edge, as shown in FIG. 1 (a), it was marked as "○".

When the line pattern had a round shape at its top edge, as shown in FIG. 1 (b), it was marked as "X".

When the line pattern had skirt trailing shape, as shown in FIG. 1 (c), it was marked as "X". The results are listed in Table 2.

TABLE 2

| Ex. No. | Composition | Profile |
|---|---|---|
| Ex. 7 | Comp. 1 | ○ |
| Ex. 8 | Comp. 2 | ○ |
| Ex. 9 | Comp. 3 | ○ |
| Ex. 10 | Comp. 4 | ○ |
| Ex. 11 | Comp. 5 | ○ |
| Comparative Ex. 1 | Comparative Comp. 1 | X [Note] |

Note:
The pattern had a round shape at its top edge.

Examples 12 to 17 and Comparative Example 2

(Producing Photoresist Patterns)
Silicon wafers (12 inches) were each coated with "ARC-29", which is an organic anti-reflective coating composition available from Nissan Chemical Industries, Ltd., and then baked at 205° C. for 60 seconds, to form a 78 nm-thick organic anti-reflective coating.

Each of the photoresist compositions prepared as above was spin-coated over the anti-reflective coating so that the thickness of the resulting film became 100 nm after drying. The silicon wafers thus coated with the respective photoresist compositions were each prebaked on a direct hotplate at a temperature shown in the column "PB" in Table 1 for 60 seconds. Using an ArF excimer stepper for immersion exposure ("XT: 1900Gi" manufactured by ASML, NA=1.35, 3/4 Annular, X-Y pol. illumination) and a mask for forming line and space pattern [pitch: 90 nm, line: 45 nm], each wafer thus formed with the respective resist film was subjected to with the exposure quantity being varied stepwise. Ultrapure water was used as an immersion medium.

After the exposure, each wafer was subjected to post-exposure baking on a hotplate at a temperature shown in the column "PEB" in Table 1 for 60 seconds. Then the baked film was subjected to development using butyl acetate [Tokyo Chemical Industry, Co. Ltd.] as a developer at 23° C. for 20 seconds in the manner of dynamic dispensing method to obtain a negative photoresist pattern.

Effective Sensitivity (ES): In these examples, it was expressed as the exposure quantity such that the obtained pattern has the line width in 45 nm, and the ratio of the line width and the space between the lines was 1:1.

Evaluation of Profile:
The photoresist patterns obtained with exposure at ES were observed with a scanning electron microscope.

When the line pattern had an excellent profile and nearly rectangle shape at its top edge, as shown in FIG. 1 (a), it was marked as "○".

When the line pattern had a round shape at its top edge, as shown in FIG. 1 (b), it was marked as "X".

When the line pattern had a skirt trailing shape, as shown in FIG. 1 (c), it was marked as "X". The results are listed in Table 3.

TABLE 3

| Ex. No. | Composition | profile |
|---|---|---|
| Ex. 12 | Comp. 5 | ○ |
| Ex. 13 | Comp. 6 | ○ |
| Ex. 14 | Comp. 7 | ○ |
| Ex. 15 | Comp. 8 | ○ |
| Ex. 16 | Comp. 9 | ○ |

| Ex. No. | Composition | profile |
|---|---|---|
| Ex. 17 | Comp. 10 | ○ |
| Comparative Ex. 2 | Comparative Comp. 1 | X (Note) |

Note:
The pattern of comparative example 2 had a round shape at its top edge and a skirt trailing shape.

According to the results, the photoresist compositions of the present invention provided photoresist patterns with an excellent profile.

According to the present invention, there are provided resin which is useful for photoresist compositions and a photoresist composition which can provide photoresist patterns with an excellent profile.

What is claimed is:

1. A resin comprising:
a structural unit represented by formula (I) the amount of which structural unit is 3 to 40% by mole based on all the structural units of the resin;
a structural unit having an acid-labile group the amount of which structural unit is 40 to 87% by mole based on all the structural units of the resin:

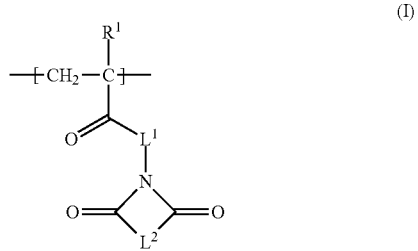

wherein $R^1$ represents a hydrogen atom, a halogen atom, or a C1-C6 alkyl group which may have a halogen atom;
$L^1$ represents a C1-C18 divalent saturated hydrocarbon group where a methylene group can be replaced by an oxygen atom or a carbonyl group; and
$L^2$ represents a C1-C18 alkanediyl group which can have a substituent, or a C4-C10 divalent alicyclic hydrocarbon group which may have a substituent; and
a structural unit having a lactone ring but no acid-labile group, the amount of which structural unit is 10 to 65% by mole based on all the structural units of the resin.

2. The resin according to claim 1
wherein $L^1$ is a group represented by *—O—$(CH_2)_n$— where n is an integer of 1 to 6 and * represents a binding position to a carbonyl group.

3. The resin according to claim 1,
wherein $L^2$ is a C2-C4 alkanediyl group.

4. A photoresist composition,
which comprises the resin according to claim 1 and an acid generator.

5. The photoresist composition according to claim 4,
wherein the acid generator is represented by formula (B1):

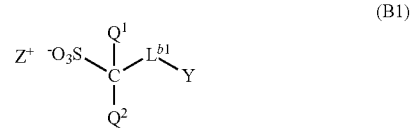

wherein $Q^1$ and $Q^2$ respectively represent a fluorine atom or a C1-C6 perfluoroalkyl group;
$L^{b1}$ represents a C1-C24 saturated hydrocarbon group in which a methylene group may be replaced by —O— or —CO— and in which a hydrogen atom may be replaced by a hydroxyl group or a fluorine atom;
Y represents a methyl group where a hydrogen atom may be replaced by a substituent, or a C3-C18 alicyclic hydrocarbon group where a hydrogen atom may be replaced by a substituent and where a methylene group may be replaced by —O—, —$SO_2$— or —CO—; and
$Z^+$ represents an organic cation.

6. The photoresist composition according to claim 4,
further comprising an salt which comprises an acid lower in acidity than an acid generated from the acid generator.

7. A process for producing a photoresist pattern comprising the following steps (1) to (5):
(1) a step of applying the photoresist composition according to claim 4 on a substrate,
(2) a step of forming a composition film by conducting drying,
(3) a step of exposing the composition film to radiation,
(4) a step of baking the exposed composition film, and
(5) a step of developing the baked composition film thereby to form a photoresist pattern.

* * * * *